United States Patent
Jannard et al.

(10) Patent No.: US 7,278,734 B2
(45) Date of Patent: Oct. 9, 2007

(54) WIRELESS INTERACTIVE HEADSET

(75) Inventors: James Jannard, Eastsound, WA (US); Carlos Reyes, Rancho Santa Margarita, CA (US); Colin Baden, Irvine, CA (US); Sumner Lane Bruns, Annapolis, MD (US)

(73) Assignee: Oakley, Inc., Foothill Ranch, CA (US)

( * ) Notice: Subject to any disclaimer, the term of this patent is extended or adjusted under 35 U.S.C. 154(b) by 181 days.

(21) Appl. No.: 10/993,217

(22) Filed: Nov. 19, 2004

(65) Prior Publication Data

US 2005/0201585 A1  Sep. 15, 2005

Related U.S. Application Data

(63) Continuation-in-part of application No. 10/628,831, filed on Jul. 28, 2003, which is a continuation-in-part of application No. 10/004,543, filed on Dec. 4, 2001, now Pat. No. 6,966,647, which is a continuation of application No. 09/585,593, filed on Jun. 2, 2000, now Pat. No. 6,325,507.

(60) Provisional application No. 60/460,154, filed on Apr. 3, 2003, provisional application No. 60/399,317, filed on Jul. 26, 2002.

(51) Int. Cl.
*G02C 1/00* (2006.01)
(52) U.S. Cl. .................. 351/158; 351/41; 381/327
(58) Field of Classification Search ............... 351/158, 351/41, 123; 381/327, 328, 329, 381; 455/350, 455/351, 343, 344, 347; 704/225
See application file for complete search history.

(56) References Cited

U.S. PATENT DOCUMENTS

| | | |
|---|---|---|
| 2,424,935 A | 7/1947 | Kimmel |
| 2,856,466 A | 10/1958 | Gustafson et al. |

(Continued)

FOREIGN PATENT DOCUMENTS

FR  2820936  8/2002

(Continued)

*Primary Examiner*—Hung Xuan Dang
(74) *Attorney, Agent, or Firm*—Knobbe, Martens, Olson & Bear, LLP

(57) ABSTRACT

A wearable wireless audio device includes a support, an electronics circuit, and a speaker. The support includes a first ear stem and an orbital, and is configured to support at least one lens in a wearer's field of view. The electronics circuit is supported by the support and is configured to receive at least one digital audio file and generate an audio signal indicative of the at least one digital audio file. The speaker is supported by the support, and is directed toward at least one of the wearer's ears. The speaker is configured to convert the audio signal into sound. The speaker has a speaker face, and the speaker is configured to rotate from a first position in which the speaker face is substantially parallel to a yz-plane to a second position in which the speaker is inclined at an angle with respect to the yz-plane. The speaker is coupled to the support with a speaker pivot, and is configured to rotate about the speaker pivot while maintaining the speaker face substantially parallel to a yz-plane. The speaker is configured to move along an axis substantially parallel to a z-axis with respect to the support.

37 Claims, 45 Drawing Sheets

U.S. PATENT DOCUMENTS

| | | | |
|---|---|---|---|
| 2,882,348 A | 4/1959 | Erickson | |
| 2,999,136 A | 9/1961 | Holt et al. | |
| 3,104,290 A | 9/1963 | Rosemond et al. | |
| 3,119,903 A | 1/1964 | Rosemond et al. | |
| D207,919 S | 6/1967 | Fai | |
| D212,863 S | 12/1968 | Roberts | |
| 3,495,898 A | 2/1970 | Del Vecchio | |
| 3,588,384 A | 6/1971 | Negley | |
| 3,665,122 A | 5/1972 | Weiss | |
| 3,769,663 A | 11/1973 | Perl | |
| 3,883,701 A | 5/1975 | Delorenzo | |
| 4,636,048 A | 1/1987 | Jones | |
| 4,683,587 A | 7/1987 | Silverman | |
| 4,856,086 A | 8/1989 | McCullough | |
| 4,882,769 A | 11/1989 | Gallimore | |
| 4,902,120 A * | 2/1990 | Weyer | 351/158 |
| 4,904,078 A | 2/1990 | Gorike | |
| 5,020,150 A | 5/1991 | Shannon | |
| 5,159,639 A | 10/1992 | Shannon et al. | |
| 5,327,178 A * | 7/1994 | McManigal | 351/158 |
| 5,335,285 A * | 8/1994 | Gluz | 381/381 |
| 5,367,345 A | 11/1994 | Da Silva | |
| RE35,051 E | 10/1995 | Moore | |
| 5,533,130 A | 7/1996 | Staton | |
| 5,579,400 A | 11/1996 | Ballein | |
| 5,606,743 A | 2/1997 | Vogt et al. | |
| 5,608,808 A | 3/1997 | Da Silva | |
| 5,634,201 A | 5/1997 | Mooring | |
| 5,694,475 A | 12/1997 | Boyden | |
| 5,715,323 A | 2/1998 | Walker | |
| 5,717,479 A | 2/1998 | Rickards | |
| 5,737,436 A | 4/1998 | Boyden | |
| 5,781,272 A | 7/1998 | Bright et al. | |
| 5,892,564 A | 4/1999 | Rahn | |
| 5,988,812 A | 11/1999 | Wingate | |
| D418,153 S | 12/1999 | Haney | |
| 6,010,216 A | 1/2000 | Jesiek | |
| 6,012,812 A | 1/2000 | Rickards | |
| D426,845 S | 6/2000 | Green et al. | |
| D435,058 S | 12/2000 | Green et al. | |
| 6,176,576 B1 | 1/2001 | Green et al. | |
| 6,218,958 B1 | 4/2001 | Eichstaedt et al. | |
| 6,233,344 B1 | 5/2001 | Clegg et al. | |
| 6,233,345 B1 | 5/2001 | Urwyler | |
| 6,252,970 B1 | 6/2001 | Poon et al. | |
| D445,416 S | 7/2001 | Glezerman | |
| 6,301,050 B1 | 10/2001 | DeLeon | |
| 6,301,367 B1 | 10/2001 | Boyden et al. | |
| 6,311,155 B1 * | 10/2001 | Vaudrey et al. | 704/225 |
| 6,325,507 B1 | 12/2001 | Jannard et al. | |
| 6,349,001 B1 | 2/2002 | Spitzer | |
| 6,356,392 B1 | 3/2002 | Spitzer | |
| 6,384,982 B1 | 5/2002 | Spitzer | |
| 6,392,798 B1 | 5/2002 | Newkirk | |
| 6,409,338 B1 | 6/2002 | Jewell | |
| 6,421,031 B1 | 7/2002 | Ronzani et al. | |
| D462,708 S | 9/2002 | Miller et al. | |
| 6,456,721 B1 | 9/2002 | Fukuda | |
| 6,490,362 B1 | 12/2002 | Clegg et al. | |
| 6,690,807 B1 | 2/2004 | Meyer | |
| 6,729,726 B2 | 5/2004 | Miller et al. | |
| 6,769,767 B2 | 8/2004 | Swab et al. | |
| 6,929,365 B2 | 8/2005 | Swab et al. | |
| 6,966,647 B2 | 11/2005 | Jannard et al. | |
| 7,004,582 B2 | 2/2006 | Jannard et al. | |
| 7,013,009 B2 | 3/2006 | Warren | |
| 2002/0098877 A1 | 7/2002 | Glezerman | |
| 2002/0118825 A1 | 8/2002 | Mitra | |
| 2002/0176330 A1 | 11/2002 | Ramonowski et al. | |
| 2003/0003969 A1 | 1/2003 | Tong et al. | |
| 2003/0022690 A1 | 1/2003 | Beyda et al. | |
| 2003/0067585 A1 | 4/2003 | Miller et al. | |
| 2003/0068057 A1 | 4/2003 | Miller et al. | |
| 2004/0000733 A1 | 1/2004 | Swab et al. | |
| 2004/0132509 A1 | 7/2004 | Glezerman | |
| 2004/0156012 A1 | 8/2004 | Jannard et al. | |
| 2004/0157649 A1 | 8/2004 | Jannard et al. | |
| 2004/0160572 A1 | 8/2004 | Jannard et al. | |
| 2004/0160573 A1 | 8/2004 | Jannard et al. | |
| 2004/0239874 A1 | 12/2004 | Swab et al. | |
| 2005/0046789 A1 | 3/2005 | Jannard et al. | |
| 2005/0046790 A1 | 3/2005 | Jannard et al. | |
| 2005/0128431 A1 | 6/2005 | Jannard et al. | |
| 2005/0185815 A1 | 8/2005 | Rickards | |
| 2006/0183427 A1 | 8/2006 | Warren | |

FOREIGN PATENT DOCUMENTS

| | | |
|---|---|---|
| IT | 00235504 | 4/2000 |

* cited by examiner

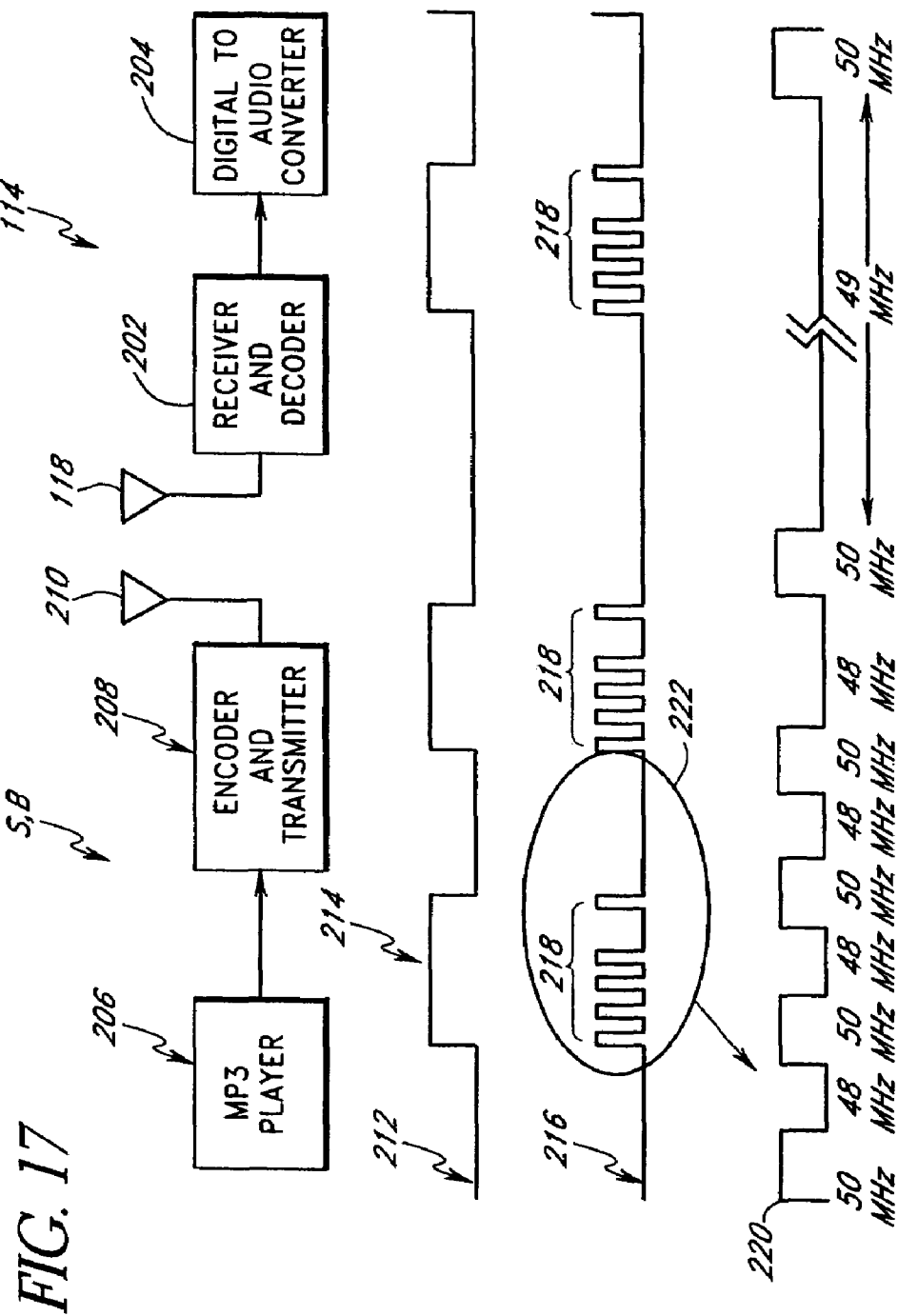

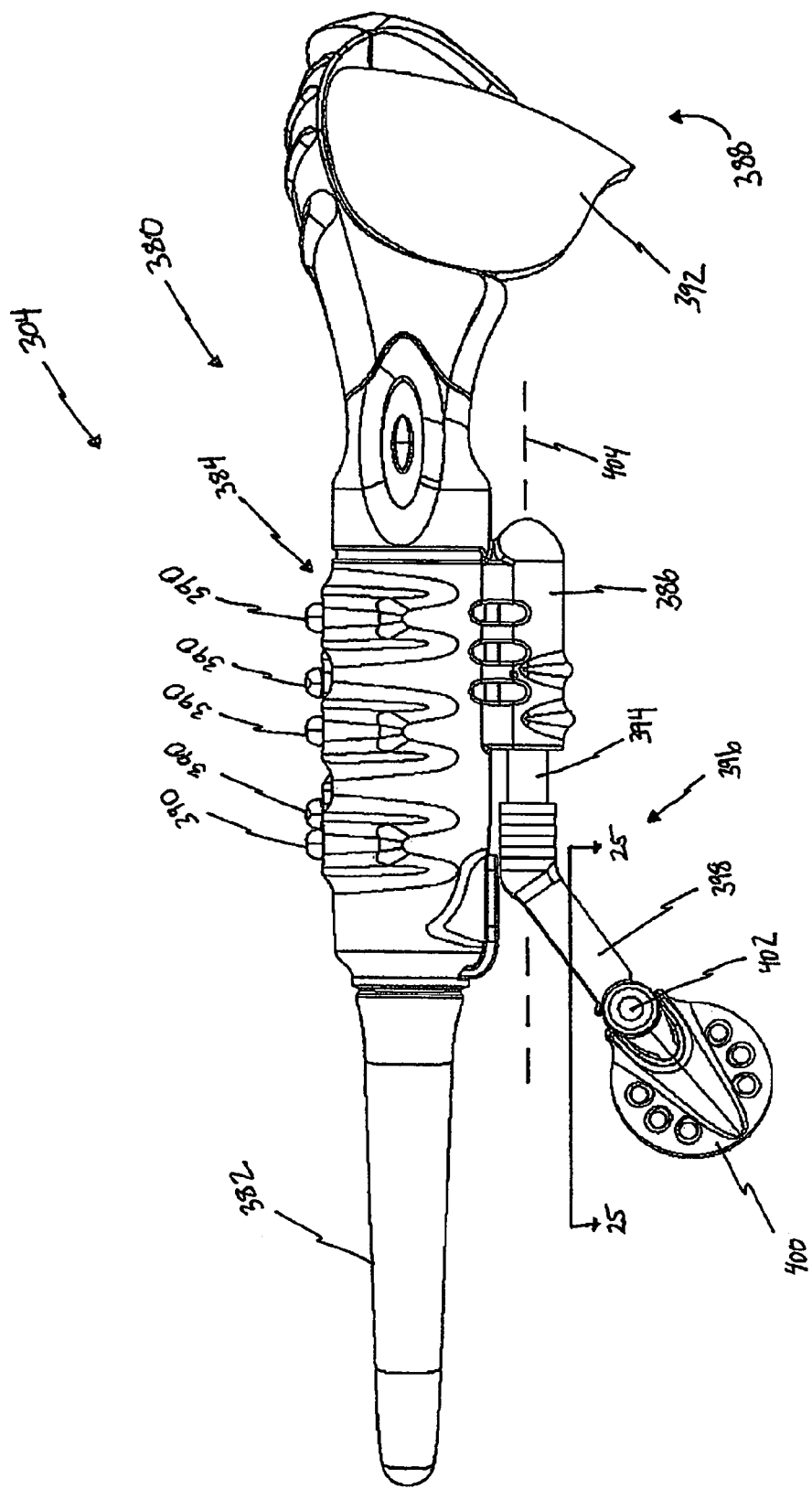

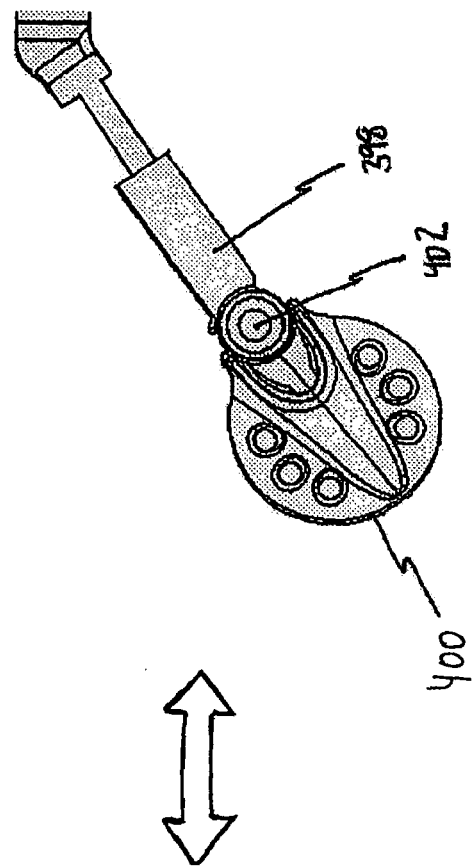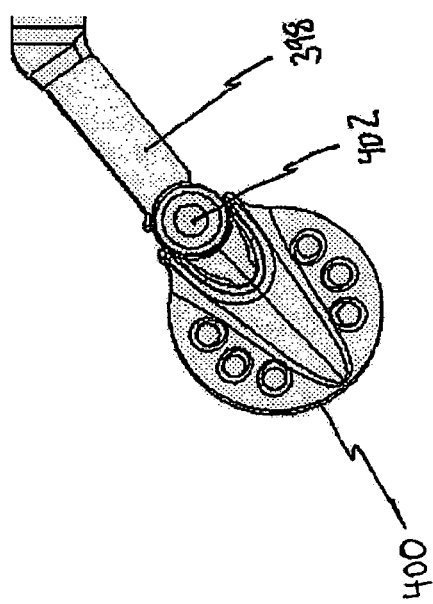
Figure 24B

WIRELESS INTERACTIVE HEADSET

REFERENCE TO RELATED APPLICATIONS

The present application is a continuation-in-part of U.S. patent application Ser. No. 10/628,831, filed Jul. 28, 2003, which claims priority benefit under 35 U.S.C. § 119(e) from U.S. Provisional Application Nos. 60/399,317, filed Jul. 26, 2002 and 60/460,154, filed Apr. 3, 2003, and which is a continuation-in-part of U.S. patent application Ser. No. 10/004,543, filed Dec. 4, 2001, now U.S. Pat. No. 6,966,647, which is a continuation of U.S. patent application Ser. No. 09/585,593, filed Jun. 2, 2000, now U.S. Pat. No. 6,325,507, and the present application claims priority benefit under 35 U.S.C. § 120 to the same. Moreover, the present application incorporates all of the foregoing disclosures herein by reference.

BACKGROUND OF THE INVENTION

1. Field of the Invention

The present invention is directed to wearable audio devices, and in particular, devices that humans can wear on their heads.

2. Description of the Related Art

In the portable audio playback industry, certain devices for remote audio listening have become more popular. Certain companies have begun to widely distribute portable audio playback devices, such as MP3 players, which allow a user to listen to audio files with the use of headphones. For example, a user can wear a headset having speakers connected by a flexible cable to an MP3 player, which can be worn on the belt. However, with such headsets, whenever a user wants to wear glasses or sunglasses, they must adjust or remove the headset from their ears. Further, it is often quite uncomfortable to wear both a headset and a pair of sunglasses at the same time. Such discomfort, when applied for a long period of time, can cause muscular pain and/or headaches. In addition, the flexible cable extending from the MP3 player to the headphones can limit mobility of the wearer; particularly those participating in sporting activities.

SUMMARY OF THE INVENTION

According to one embodiment of the present invention, a wearable wireless audio device, includes a support, a support arm, and an electronics circuit. The support includes a first ear stem and an orbital, and is configured to support at least one lens in a wearer's field of view. The support arm has a first end, a second end, a first moveable joint coupled to the first end and the first ear stem, and a second moveable joint coupled to the second end. The first moveable joint provides rotation about a first rotation axis and the second moveable joint provides rotation about a second rotation axis. The first rotation axis and the second rotation axis are substantially perpendicular to one another. The electronics circuit is supported by the support and is configured to receive at least one digital audio file and generate an audio signal indicative of the at least one digital audio file.

In another embodiment, the electronics circuit is configured to process the digital audio file prior to generating the audio signal. In another embodiment, the wearable wireless audio device also includes a first speaker supported by the support, is directed toward at least one of the wearer's ears, and is configured to convert the audio signal into sound. The speaker generally includes a speaker face, and is configured to rotate from a first position in which the speaker face is substantially parallel to a yz-plane to a second position in which the speaker is substantially parallel to an xz-plane. In another embodiment, the speaker is configured to rotate from a first position in which the speaker face is substantially parallel to a yz-plane to a second position in which the speaker inclined at an angle with respect to the yz-plane. In one embodiment, the angle is between about 30° and about 90°.

In another embodiment, the speaker is configured to rotate along an arcuate path about an axis substantially parallel to an x-axis from a first position in which the speaker face is substantially parallel to a yz-plane to a second position in which the speaker remains substantially parallel to the yz-plane, and wherein the speaker is configured to move an adjustment distance in a direction substantially parallel to a z-axis as a result of said rotation. In one embodiment, the adjustment distance is about 3 cm.

In yet another embodiment, the speaker includes a speaker face, and the speaker is coupled to the support with a speaker pivot, and the speaker is configured to rotate about the speaker pivot while maintaining the speaker face substantially parallel to a yz-plane. In another embodiment, the speaker is configured to move along an axis substantially parallel to a z-axis with respect to the support.

In one embodiment, the digital audio file is compressed, and may be an MP3 formatted file. In another embodiment, the support includes a channel and a conductor, wherein the channel extends along at least a portion of the ear stem, and the conductor is located at least partially within the channel.

In another embodiment, the wearable wireless audio device further includes a second ear stem, the electronics circuit comprises a memory circuit and a processor, and the memory circuit is carried by the first ear stem, and the memory circuit is carried by the second ear stem. In one embodiment, the wearable wireless audio device also includes a second ear stem, wherein the electronics circuit comprises a battery and a processor, and wherein the battery is carried by the first ear stem, and the memory circuit is carried by the second ear stem. In another embodiment, the electronics components are distributed between the first and second ear stems. In yet another embodiment, the wearable wireless audio device includes a nose bridge, wherein digital signals generated by the electronics circuit are transmitted across the nose bridge.

In another embodiment, the wearable wireless audio device includes a data port, wherein the data port is carried by the ear stem. The data port may be selected from the group comprising: a mini-USB connector, a FIREWIRE connector, an IEEE 1394 cable connector, an RS232 connector, a JTAB connector, an antenna, a wireless receiver, a radio, an RF receiver, and a BLUETOOTH receiver. In another embodiment, the wearable wireless audio device is removably connectable to a computing device. The wearable wireless audio device may be removably connectable to a computing device with a data port, wherein said data port is mounted to said wearable wireless audio device. In one embodiment, the data port is selected from the group consisting of: a mini-USB connector, a USB connector, a FIREWIRE connector, an IEEE 1394 cable connector, an RS232 connector, a JTAB connector, an antenna, a wireless receiver, a radio, an RF receiver, and a BLUETOOTH receiver. In yet another embodiment, the wearable wireless audio device also includes a protective door, wherein the protective door protects said data port from a contaminant when said wearable wireless audio device is disconnected from said computing device.

In one embodiment, the electronics circuit is further configured to decompress the audio file. The electronics circuit may be configured to receive at least one digital audio file at a data transfer rate. The data transfer rate may be selected from the group consisting of: about 1.5 Mbps, about 12 Mbps, about 100 Mbps, about 200 Mbps, about 400 Mbps, about 480 Mbps, greater than about 100 Mbps, greater than about 200 Mbps, greater than about 400 Mbps, greater than about 1000 Mbps, less than about 100 Mbps, and less than about 50 Mbps.

In another embodiment, the at least one digital audio file has been encoded at a data encoding rate. The data encoding rate may be selected from the group consisting of: 128 kbps, 160 kbps, 192 kbps, 256 kbps, less than about 128 kbps, less than about 160 kbps, less than about 192 kbps, less than about 256 kbps, and more than about 256 kbps.

In another embodiment, the at least one digital audio file is compressed according to a compression format. The compression format is selected from the group consisting of: PCM, DPCM, ADPCM, AAC, RAW, DM, RIFF, WAV, BWF, AIFF, AU, SND, CDA, MPEG, MPEG-1, MPEG-2, MPEG-2.5, MPEG-4, MPEG-J, MPEG 2-ACC, MP3, MP3Pro, ACE, MACE, MACE-3, MACE-6, AC-3, ATRAC, ATRAC3, EPAC, Twin VQ, VQF, WMA, WMA with DRM, DTS, DVD Audio, SACD, TAC, SHN, OGG, Ogg Vorbis, Ogg Tarkin, Ogg Theora, ASF, LQT, QDMC, A2b, .ra, mm, and Real Audio G2, RMX formats, Fairplay, Quicktime, SWF, and PCA.

In accordance with another embodiment of the present invention, a wearable wireless audio device includes a support, an electronics circuit and a first speaker. The support comprises a first ear stem and an orbital, and the support is configured to support at least one lens in a wearer's field of view. The electronics circuit is supported by the support and is configured to receive at least one digital audio file and generate an audio signal indicative of the at least one digital audio file. The first speaker is supported by the support, is directed toward at least one of the wearer's ears, and is configured to convert the audio signal into sound.

The speaker may comprise a speaker face, and the speaker is configured to rotate from a first position in which the speaker face is substantially parallel to a yz-plane to a second position in which the speaker is inclined at an angle with respect to the yz-plane. The speaker is coupled to the support with a speaker pivot, and the speaker is configured to rotate about the speaker pivot while maintaining the speaker face substantially parallel to a yz-plane. The speaker is configured to move along an axis substantially parallel to a z-axis with respect to the support.

In another embodiment, the electronics circuit is configured to process the digital audio file prior to generating the audio signal. The speaker generally includes a speaker face, and is configured to rotate from a first position in which the speaker face is substantially parallel to a yz-plane to a second position in which the speaker is substantially parallel to an xz-plane. In one embodiment, the angle is between about 30° and about 90°.

In another embodiment, the speaker is configured to rotate along an arcuate path about an axis substantially parallel to an x-axis from a first position in which the speaker face is substantially parallel to a yz-plane to a second position in which the speaker remains substantially parallel to the yz-plane, and wherein the speaker is configured to move an adjustment distance in a direction substantially parallel to a z-axis as a result of said rotation. In one embodiment, the adjustment distance is about 3 cm.

In one embodiment, the digital audio file is compressed, and may be an MP3 formatted file. In another embodiment, the support includes a channel and a conductor, wherein the channel extends along at least a portion of the ear stem, and the conductor is located at least partially within the channel.

In another embodiment, the wearable wireless audio device further includes a second ear stem, the electronics circuit comprises a memory circuit and a processor, and the memory circuit is carried by the first ear stem, and the memory circuit is carried by the second ear stem. In one embodiment, the wearable wireless audio device also includes a second ear stem, wherein the electronics circuit comprises a battery and a processor, and wherein the battery is carried by the first ear stem, and the memory circuit is carried by the second ear stem. In another embodiment, the electronics components are distributed between the first and second ear stems. In yet another embodiment, the wearable wireless audio device includes a nose bridge, wherein digital signals generated by the electronics circuit are transmitted across the nose bridge.

In another embodiment, the wearable wireless audio device includes a data port, wherein the data port is carried by the ear stem. The data port may be selected from the group comprising: a mini-USB connector, a FIREWIRE connector, an IEEE 1394 cable connector, an RS232 connector, a JTAB connector, an antenna, a wireless receiver, a radio, an RF receiver, and a BLUETOOTH receiver. In another embodiment, the wearable wireless audio device is removably connectable to a computing device. The wearable wireless audio device may be removably connectable to a computing device with a data port, wherein said data port is mounted to said wearable wireless audio device. In one embodiment, the data port is selected from the group consisting of: a mini-USB connector, a USB connector, a FIREWIRE connector, an IEEE 1394 cable connector, an RS232 connector, a JTAB connector, an antenna, a wireless receiver, a radio, an RF receiver, and a BLUETOOTH receiver. In yet another embodiment, the wearable wireless audio device also includes a protective door, wherein the protective door protects said data port from a contaminant when said wearable wireless audio device is disconnected from said computing device.

In one embodiment, the electronics circuit is further configured to decompress the audio file. The electronics circuit may be configured to receive at least one digital audio file at a data transfer rate. The data transfer rate may be selected from the group consisting of: about 1.5 Mbps, about 12 Mbps, about 100 Mbps, about 200 Mbps, about 400 Mbps, about 480 Mbps, greater than about 100 Mbps, greater than about 200 Mbps, greater than about 400 Mbps, greater than about 1000 Mbps, less than about 100 Mbps, and less than about 50 Mbps.

In another embodiment, the at least one digital audio file has been encoded at a data encoding rate. The data encoding rate may be selected from the group consisting of: 128 kbps, 160 kbps, 192 kbps, 256 kbps, less than about 128 kbps, less than about 160 kbps, less than about 192 kbps, less than about 256 kbps, and more than about 256 kbps.

In another embodiment, the at least one digital audio file is compressed according to a compression format. The compression format may be selected from the group consisting of: PCM, DPCM, ADPCM, AAC, RAW, DM, RIFF, WAV, BWF, AIFF, AU, SND, CDA, MPEG, MPEG-1, MPEG-2, MPEG-2.5, MPEG-4, MPEG-J, MPEG 2-ACC, MP3, MP3Pro, ACE, MACE, MACE-3, MACE-6, AC-3, ATRAC, ATRAC3, EPAC, Twin VQ, VQF, WMA, WMA with DRM, DTS, DVD Audio, SACD, TAC, SHN, OGG, Ogg Vorbis, Ogg Tarkin, Ogg Theora, ASF, LQT, QDMC, A2b, ra, .rm, and Real Audio G2, RMX formats, Fairplay, Quicktime, SWF, and PCA.

In accordance with yet another embodiment of the present invention, a method of processing audio with a wearable wireless audio device comprises: supporting at least one lens in a wearer's field of view with a first ear stem and an orbital; receiving at least one digital audio file within the first ear stem or the orbital; generating an audio signal indicative of the at least one digital audio file within the first ear stem or the orbital; supporting a first speaker with the first ear stem; and directing said first speaker toward at least one of the wearer's ears, wherein the speaker comprises a speaker face, and wherein the speaker is configured to rotate from a first position in which the speaker face is substantially parallel to a yz-plane to a second position in which the speaker is inclined at an angle with respect to the yz-plane, wherein the speaker is coupled to the support with a speaker pivot, and wherein the speaker is configured to rotate about the speaker pivot while maintaining the speaker face substantially parallel to a yz-plane, and wherein the speaker is configured to move along an axis substantially parallel to a z-axis with respect to the support.

In one embodiment, the method further comprises processing the digital audio file prior to generating the audio signal. In one embodiment, the speaker includes a speaker face, and is configured to rotate from a first position in which the speaker face is substantially parallel to a yz-plane to a second position in which the speaker is substantially parallel to an xz-plane. In one embodiment, the angle is between about 30° and about 90°.

In another embodiment, the speaker is configured to rotate along an arcuate path about an axis substantially parallel to an x-axis from a first position in which the speaker face is substantially parallel to a yz-plane to a second position in which the speaker remains substantially parallel to the yz-plane, and wherein the speaker is configured to move an adjustment distance in a direction substantially parallel to a z-axis as a result of said rotation. In one embodiment, the adjustment distance is about 3 cm.

In one embodiment, the digital audio file is compressed, and may be an MP3 formatted file. In another embodiment, the method further comprises providing a channel and a conductor, wherein the channel extends along at least a portion of the ear stem, and the conductor is located at least partially within the channel.

In another embodiment, the method further comprises providing a second ear stem, wherein the electronics circuit comprises a memory circuit and a processor, and the memory circuit is carried by the first ear stem, and the memory circuit is carried by the second ear stem. In one embodiment, the method further comprises providing a second ear stem, wherein the electronics circuit comprises a battery and a processor, and wherein the battery is carried by the first ear stem, and the memory circuit is carried by the second ear stem.

In another embodiment, the method further comprises providing a second ear stem, wherein the electronics components are distributed between the first and second ear stems. In yet another embodiment, the method further comprises providing a nose bridge, wherein digital signals generated by the electronics circuit are transmitted across the nose bridge.

In another embodiment, the method further comprises providing a data port, wherein the data port is carried by the ear stem. The data port may be selected from the group comprising: a mini-USB connector, a FIREWIRE connector, an IEEE 1394 cable connector, an RS232 connector, a JTAB connector, an antenna, a wireless receiver, a radio, an RF receiver, and a BLUETOOTH receiver. In another embodiment, the wearable wireless audio device is removably connectable to a computing device. The wearable wireless audio device may be removably connectable to a computing device with a data port, wherein said data port is mounted to said wearable wireless audio device. In one embodiment, the data port is selected from the group consisting of: a mini-USB connector, a USB connector, a FIREWIRE connector, an IEEE 1394 cable connector, an RS232 connector, a JTAB connector, an antenna, a wireless receiver, a radio, an RF receiver, and a BLUETOOTH receiver. In yet another embodiment, the method further comprises providing a protective door, wherein the protective door protects said data port from a contaminant when said wearable wireless audio device is disconnected from said computing device.

In one embodiment, the method further comprises decompressing the audio file. In another embodiment, the receiving is performed at a data transfer rate. The data transfer rate may be selected from the group consisting of: about 1.5 Mbps, about 12 Mbps, about 100 Mbps, about 200 Mbps, about 400 Mbps, about 480 Mbps, greater than about 100 Mbps, greater than about 200 Mbps, greater than about 400 Mbps, greater than about 1000 Mbps, less than about 100 Mbps, and less than about 50 Mbps.

In another embodiment, the at least one digital audio file has been encoded at a data encoding rate. The data encoding rate may be selected from the group consisting of: 128 kbps, 160 kbps, 192 kbps, 256 kbps, less than about 128 kbps, less than about 160 kbps, less than about 192 kbps, less than about 256 kbps, and more than about 256 kbps.

In another embodiment, the at least one digital audio file is compressed according to a compression format. The compression format may be selected from the group consisting of: PCM, DPCM, ADPCM, AAC, RAW, DM, RIFF, WAV, BWF, AIFF, AU, SND, CDA, MPEG, MPEG-1, MPEG-2, MPEG-2.5, MPEG-4, MPEG-J, MPEG 2-ACC, MP3, MP3Pro, ACE, MACE, MACE-3, MACE-6, AC-3, ATRAC, ATRAC3, EPAC, Twin VQ, VQF, WMA, WMA with DRM, DTS, DVD Audio, SACD, TAC, SHN, OGG, Ogg Vorbis, Ogg Tarkin, Ogg Theora, ASF, LQT, QDMC, A2b, .ra, .rm, and Real Audio G2, RMX formats, Fairplay, Quicktime, SWF, and PCA.

In accordance with yet another embodiment of the present invention, a method of processing audio with a wearable wireless audio device comprises: supporting at least one lens in a wearer's field of view with a first ear stem and an orbital; providing a support arm, the support arm comprising a first end, a second end, a first moveable joint coupled to the first end and the first ear stem, and a second moveable joint coupled to the second end, wherein the first moveable joint provides rotation about a first rotation axis and the second moveable joint provides rotation about a second rotation axis, wherein said first rotation axis and said second rotation axis are substantially perpendicular to one another; and receiving at least one digital audio file within the first ear stem or the orbital; and generating an audio signal indicative of the at least one digital audio file within the first ear stem or the orbital.

In one embodiment, the method further comprises processing the digital audio file prior to generating the audio signal. In another embodiment, the method further comprises supporting a first speaker with the support, wherein the first speaker is configured to be directed toward at least one of the wearer's ears, and wherein the first speaker is configured to convert the audio signal into sound.

In one embodiment, the speaker comprises a speaker face, and the speaker is configured to rotate from a first position in which the speaker face is substantially parallel to a yz-plane to a second position in which the speaker is substantially parallel to an xz-plane. In another embodiment, the speaker comprises a speaker face, and the speaker is configured to rotate from a first position in which the speaker face is substantially parallel to a yz-plane to a second position in which the speaker inclined at an angle with respect to the yz-plane. The angle may be between about 30° and about 90°.

In one embodiment, the speaker comprises a speaker face, and the speaker is configured to rotate along an arcuate path about an axis substantially parallel to an x-axis from a first position in which the speaker face is substantially parallel to a yz-plane to a second position in which the speaker remains substantially parallel to the yz-plane, and wherein the speaker is configured to move an adjustment distance in a direction substantially parallel to a z-axis as a result of said rotation. In one embodiment, the adjustment distance is about 3 cm.

In one embodiment, the speaker comprises a speaker face, and the speaker is coupled to the support with a speaker pivot, and the speaker is configured to rotate about the speaker pivot while maintaining the speaker face substantially parallel to a yz-plane. In another embodiment, the speaker is configured to move along an axis substantially parallel to a z-axis with respect to the support.

In one embodiment, the digital audio file is compressed, and may be an MP3 formatted file. In one embodiment, the method of processing audio with a wearable wireless audio device further comprises providing a channel and a conductor, wherein the channel extends along at least a portion of the ear stem, and wherein the conductor is located at least partially within the channel. In one embodiment, the method further comprises providing a second ear stem, wherein the electronics circuit comprises a memory circuit and a processor, and wherein the memory circuit is carried by the first ear stem, and the memory circuit is carried by the second ear stem. In one embodiment, the method further comprises providing a second ear stem, wherein the electronics circuit comprises a battery and a processor, and wherein the battery is carried by the first ear stem, and the memory circuit is carried by the second ear stem. In another embodiment, the method further comprises providing a second ear stem, wherein the electronics components are distributed between the first and second ear stems.

In one embodiment, the method further comprises providing a nose bridge, wherein digital signals generated by the electronics circuit are transmitted across the nose bridge. In one embodiment, the method further comprises providing a data port, wherein the data port is carried by the ear stem. The data port may be selected from the group comprising: a mini-USB connector, a FIREWIRE connector, an EEE 1394 cable connector, an RS232 connector, a JTAB connector, an antenna, a wireless receiver, a radio, an RF receiver, and a BLUETOOTH receiver.

In one embodiment, the wearable wireless audio device is removably connectable to a computing device. In one embodiment, the wearable wireless audio device is removably connectable to a computing device with a data port, wherein said data port is mounted to said wearable wireless audio device. The data port may be selected from the group consisting of: a mini-USB connector, a USB connector, a FIREWIRE connector, an IEEE 1394 cable connector, an RS232 connector, a JTAB connector, an antenna, a wireless receiver, a radio, an RF receiver, and a BLUETOOTH receiver.

In another embodiment, the method further comprises providing a protective door, wherein said protective door protects said data port from a contaminant when said wearable wireless audio device is disconnected from said computing device. In another embodiment, the method further comprises decompressing the audio file.

In another embodiment, the receiving is performed at a data transfer rate. The data transfer rate may be selected from the group consisting of: about 1.5 Mbps, about 12 Mbps, about 100 Mbps, about 200 Mbps, about 400 Mbps, about 480 Mbps, greater than about 100 Mbps, greater than about 200 Mbps, greater than about 400 Mbps, greater than about 1000 Mbps, less than about 100 Mbps, and less than about 50 Mbps.

In one embodiment, the at least one digital audio file has been encoded at a data encoding rate. The data encoding rate may be selected from the group consisting of: 128 kbps, 160 kbps, 192 kbps, 256 kbps, less than about 128 kbps, less than about 160 kbps, less than about 192 kbps, less than about 256 kbps, and more than about 256 kbps.

In one embodiment, the at least one digital audio file is compressed according to a compression format. The compression format may be selected from the group consisting of: PCM, DPCM, ADPCM, AAC, RAW, DM, RIFF, WAV, BWF, AIFF, AU, SND, CDA, MPEG, MPEG-1, MPEG-2, MPEG-2.5, MPEG-4, MPEG-J, MPEG 2-ACC, MP3, MP3Pro, ACE, MACE, MACE-3, MACE-6, AC-3, ATRAC, ATRAC3, EPAC, Twin VQ, VQF, WMA, WMA with DRM, DTS, DVD Audio, SACD, TAC, SHN, OGG, Ogg Vorbis, Ogg Tarkin, Ogg Theora, ASF, LQT, QDMC, A2b, .ra, .rm, and Real Audio G2, RMX formats, Fairplay, Quicktime, SWF, and PCA.

According to yet another embodiment of the present invention, a wearable wireless audio device, comprises: means for supporting at least one lens in a wearer's field of view with a first ear stem and an orbital; means for providing a support arm, the support arm comprising a first end, a second end, a first moveable joint coupled to the first end and the first ear stem, and a second moveable joint coupled to the second end, wherein the first moveable joint provides rotation about a first rotation axis and the second moveable joint provides rotation about a second rotation axis, wherein said first rotation axis and said second rotation axis are substantially perpendicular to one another; and receiving at least one digital audio file within the first ear stem or the orbital; means for receiving at least one digital audio file within the first ear stem or the orbital; and means for generating an audio signal indicative of the at least one digital audio file within the first ear stem or the orbital.

In one embodiment, the wearable wireless audio device is removably connectable to a computing device. In another embodiment, the wearable wireless audio device further comprises means for decompressing the audio file. In one embodiment, the means for receiving at least one digital audio file is configured to receive the at least one digital audio file at a data transfer rate, and in another embodiment, the at least one digital audio file has been encoded at a data encoding rate. In one embodiment, the at least one digital audio file is compressed according to a compression format.

According to yet another embodiment of the present inventon, a speaker support system, comprises: a support frame, adapted to be carried by a head of a wearer; at least one speaker carried by the support frame, the speaker having a sound propagation axis and a transverse axis, wherein the transverse axis is substantially perpendicular to the sound propagation axis and lies substantially within a speaker plane of the at least one speaker, wherein the support frame holds the at least one speaker substantially adjacent an ear of the wearer such that the transverse axis is inclined at an orientation angle with respect to a tragus-tragus line, and wherein the orientation angle is within the range of from about 15 degrees to about 85 degrees. In one embodiment, the orientation angle is about 25 degrees.

Further features and advantages of the present invention will become apparent to those of skill in the art in view of the detailed description of preferred embodiments which follows, when considered together with the attached drawings and claims.

BRIEF DESCRIPTION OF THE DRAWINGS

FIG. 3I is a top plan view of the wearable audio device illustrated in FIG. 3D.

FIG. 17 is a schematic illustration of communication hardware which can be incorporated into any of the wearable audio device as illustrated in FIGS. 1-16 and the communication hardware of another device.

FIG. 18 is a schematic representation showing three output signals, the uppermost signal being the output of a source device, and the lower signals being the representation of the output of an encoder/decoder device illustrated in FIG. 17.

FIG. 24 is a right side elevational view of an audio device.

FIG. 24B is a detail view of an axially extendable speaker support.

DETAILED DESCRIPTION OF THE PREFERRED EMBODIMENT

Figure 1:
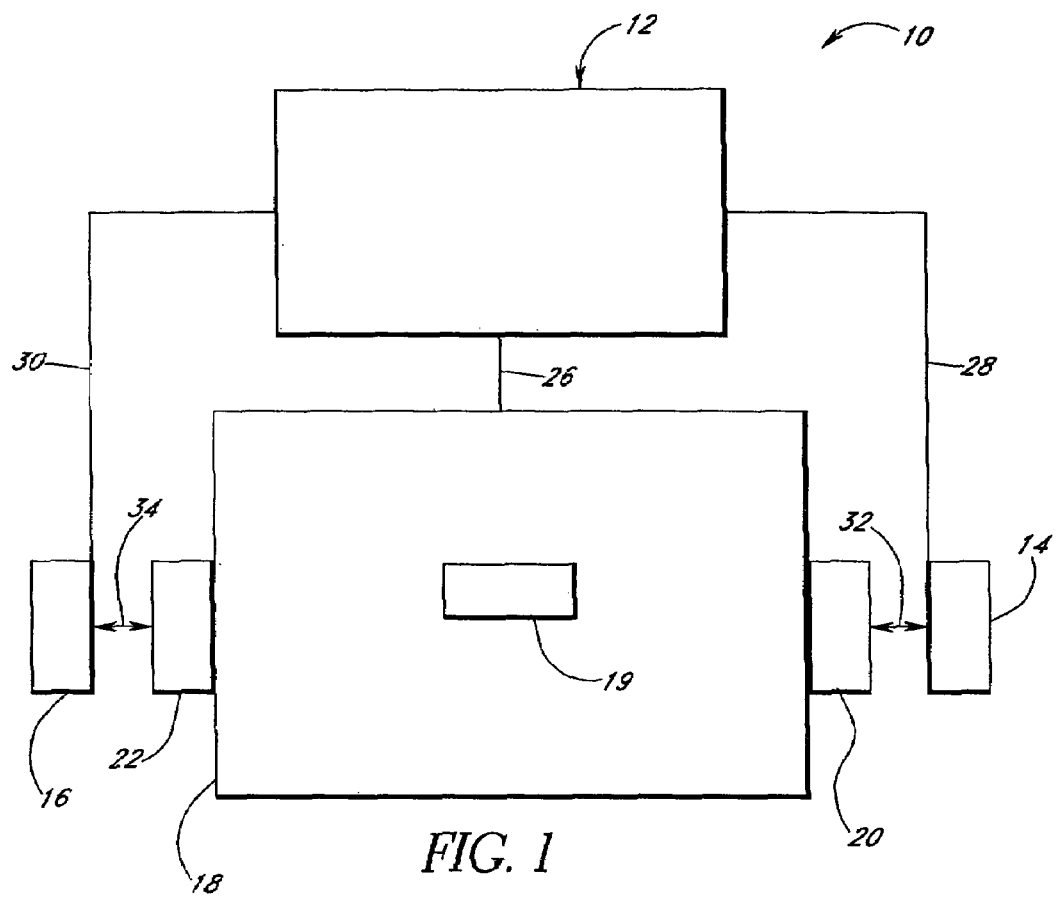
FIG. 1 is a schematic representation of a front elevational view of a wearable audio device supported by a human head.
Figure 2:
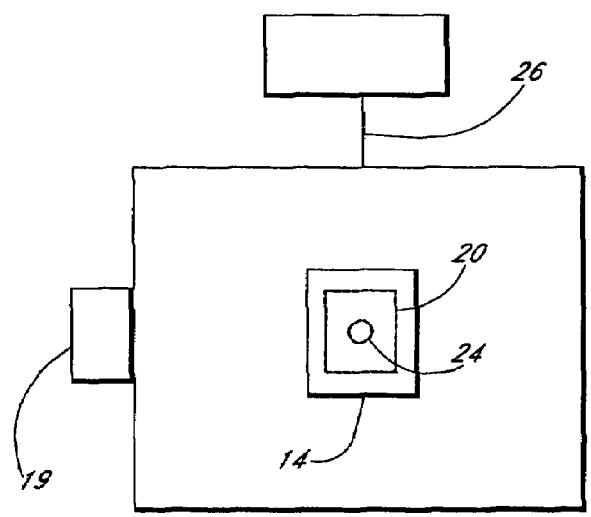
FIG. 2 is a left side elevational view of an implementation of the audio device illustrated in FIG. 1.

With reference to FIGS. 1 and 2, an audio device 10 includes a support 12 and left and right speakers 14, 16.

The audio device 10 is illustrated as being supported on the head 18 of a human. The head 18 includes a nose 19, and left and right ears 20, 22. The schematic representation of human ears 20 and 22 are intended to represent the tissue forming the pinna of a human ear. With reference to FIG. 2, the meatus of the external auditory canal 24 is illustrated schematically as a circle (in phantom) generally at the center of the left ear 20.

The support 12 is configured to be supported by the head 18. Thus, the support 12 can be in the form of any of a variety of wearable garments or devices, such as any known headwear. For example, but without limitation, the support-12 can be in the form of a hat, sweatband, tiara, helmet, headphones, visor, and any of a variety of eyewear such as goggles, masks, face shields and eyeglasses.

Advantageously, the support 12 is configured to support the speakers 14, 16 at a position juxtaposed to the ears 20, 22, respectively, without applying a force against the ears 20, 22 sufficient for anchoring the speakers 14, 16 in place. Thus, the support 12 contacts the head 18 at a position other than the outer surface of the ears 20, 22. As shown in FIG. 1, the support 12 is supported by the head 18 by a support portion 26 which contacts a portion of the head 18 other than the outer surface of the ears 20, 22. For example, but without limitation, the support 26 can contact the top of the head 18, the sides of the head 18, top of the nose 19, forehead, occipital lobe, etc.

The audio device 10 also includes support members 28, 30 which extend from the support 12 to the speakers 14, 16, respectively. The support members 28, 30 are provided with sufficient strength to maintain the position of the speakers 14, 16 such that the speakers 14, 16 are spaced from the outer surface of the ears 20, 22.

Optionally, the support members 28, 30 can be made from a flexible material configured to allow the speakers 14, 16 to be moved toward and away from the ears 20, 22, respectively. For example, any of a variety of flexible metallic structures such as wire can be provided with a flexible polymer coating, to permit adjustability of the speakers 14, 16. Metal or polymeric segmented support members 28, 30 can also be provided. In general, the support members in accordance with this aspect of the invention are sufficiently flexible that they may be moved by manual force between a first position in front of the ear of the wearer, and a second position, spaced apart from the first position. The support member 28, 30 are then able to retain the position into which they have been moved.

Alternatively, the support members 28, 30 can be mounted relative to the support 12 with a mechanical device configured to allow the speakers 14, 16 to be moved toward and away from the ears 20, 22 respectively. The same mechanical device or an additional mechanical device can also optionally be configured to allow the speakers 14, 16 and/or supports 28, 30 to be translated forward and rearwardly relative to the support 12. Further, such mechanical devices can be used in conjunction with the flexibility provided to the support members 28, 30 from a flexible material noted above. As such, the user can adjust the spacing between the speakers 14, 16 and the ears 20, 22 to provide the desired spacing.

As noted above, the speakers 14, 16 are spaced from the ears 20, 22 such that the speakers 14, 16 do not engage the outer surface of the ears 20, 22 with sufficient force to provide an anchoring effect for the speakers 14, 16. Thus, the speakers 14, 16 can make contact with the ears 20, 22, at a pressure less than that sufficient to cause discomfort to the user.

Comfort of the user is further enhanced if the support 12 is configured to maintain gaps 32, 34 between the speakers 14, 16 and the ears 20, 22, respectively. As such, the chance of irritation to the user's ears 20, 22 is eliminated. Preferably, the gaps 32, 34 are within the range from about 2 mm to about 3 cm. The gaps 32, 34 can be measured from the inner surface of the speakers 14, 16 and the outer surface of the tragus (small projection along the front edge of a human ear which partially overlies the meatus of the external auditory canal 24) (FIG. 2).

Such a spacing can allow the support 12 to be removed and replaced onto the head 18 of the user without rubbing against the ears 20, 22. This makes the audio device 10 more convenient to use.

Figure 3A:
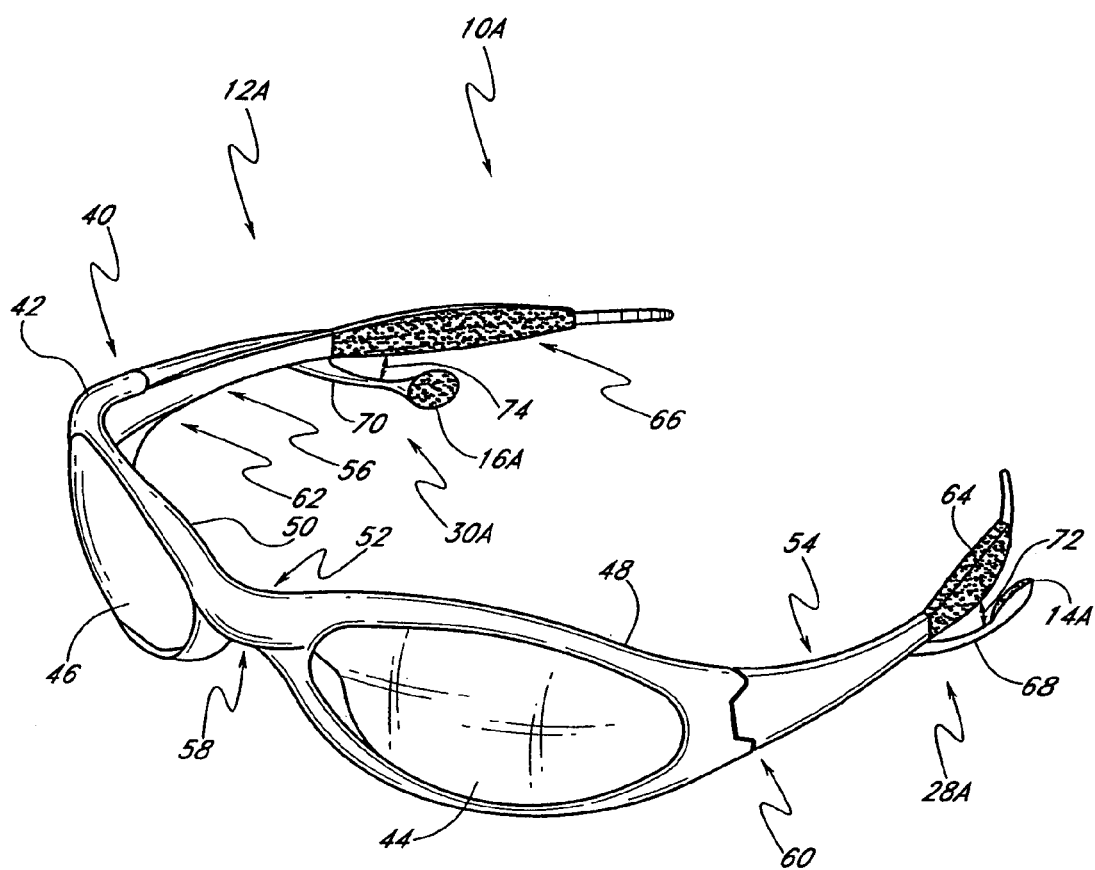
FIG. 3A is a front, left side, and top perspective view of a modification of the wearable audio device illustrated in FIGS. 1 and 2.
Figure 3B:
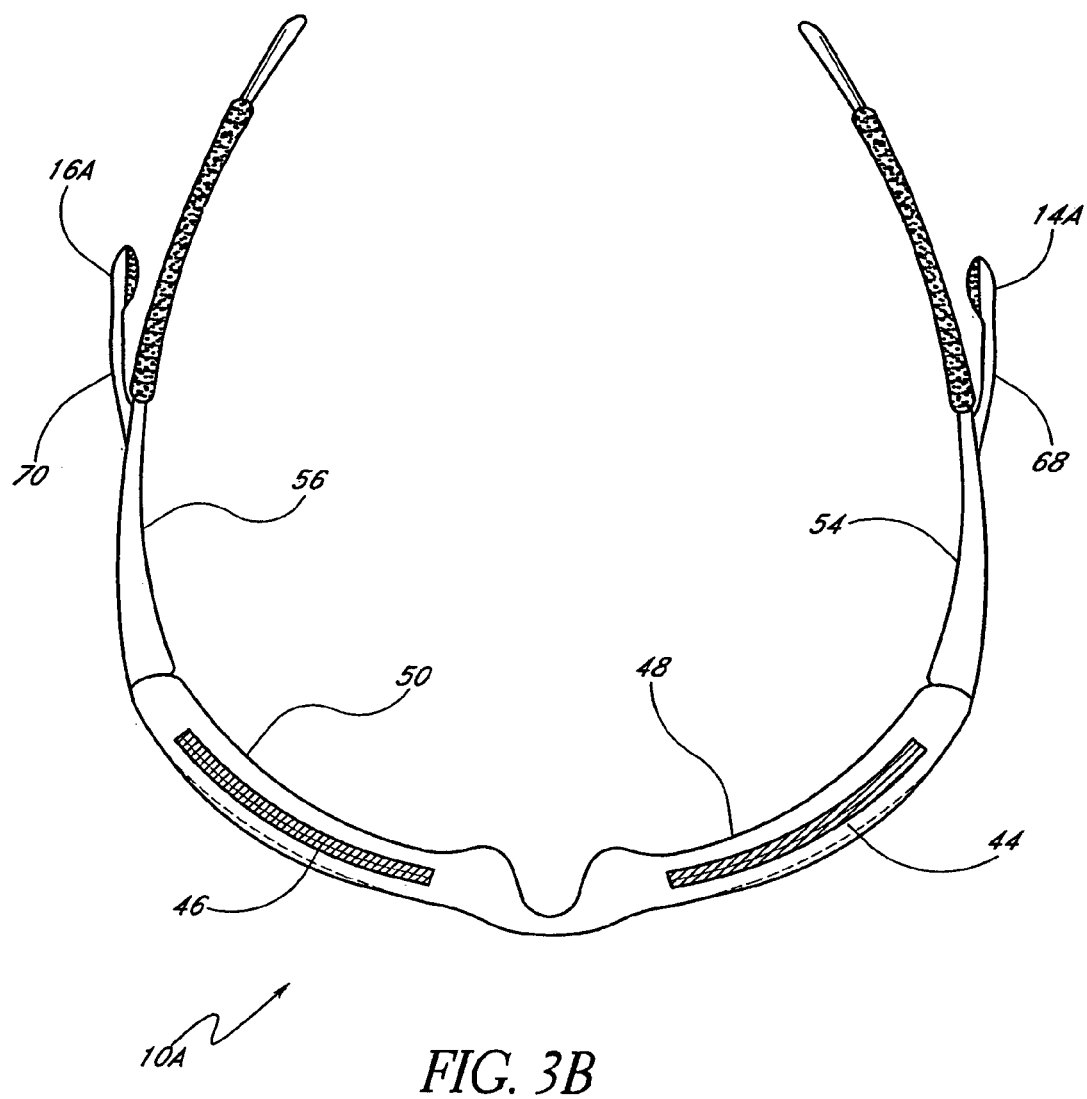
FIG. 3B is a top plan view of the audio device illustrated in FIG. 3A.
Figure 3C:
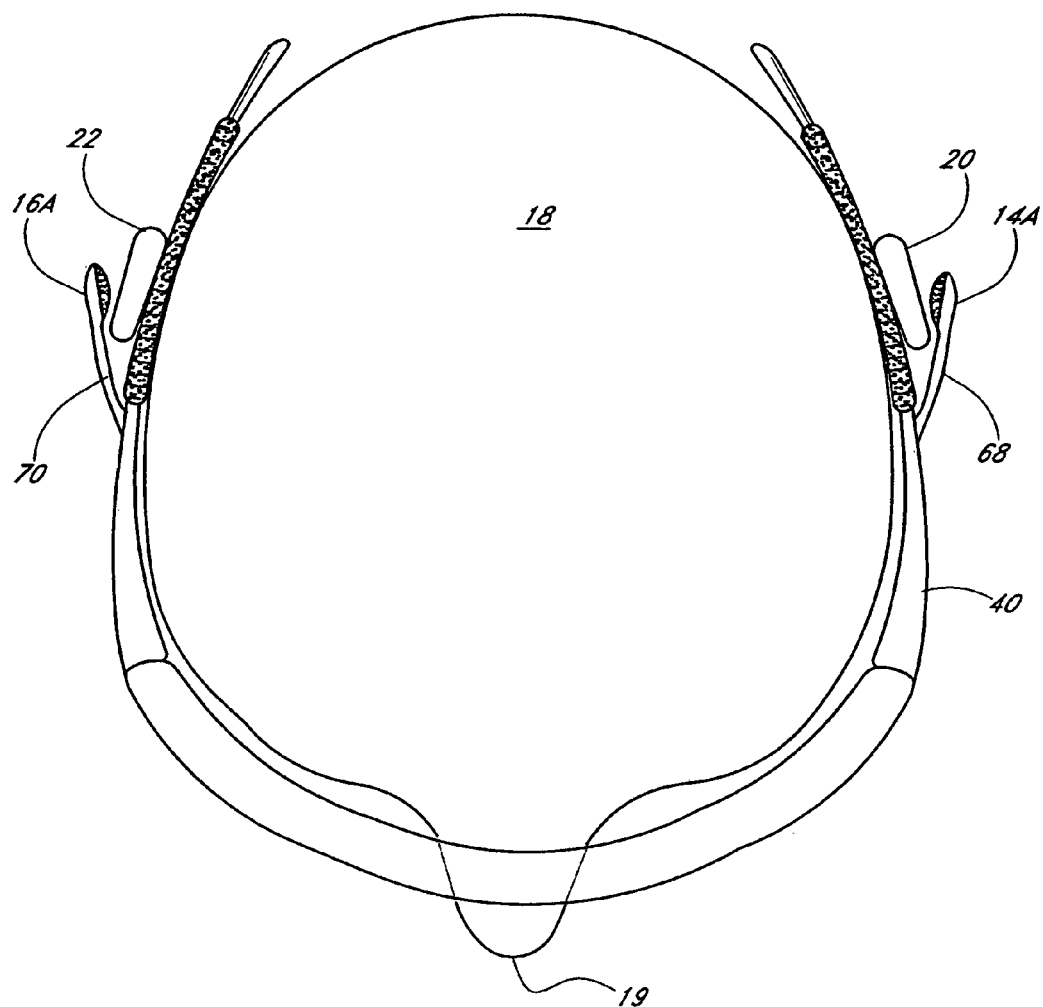
FIG. 3C is a schematic top plan view of the audio device of FIG. 3A worn on the head of a wearer.
Figure 3D:
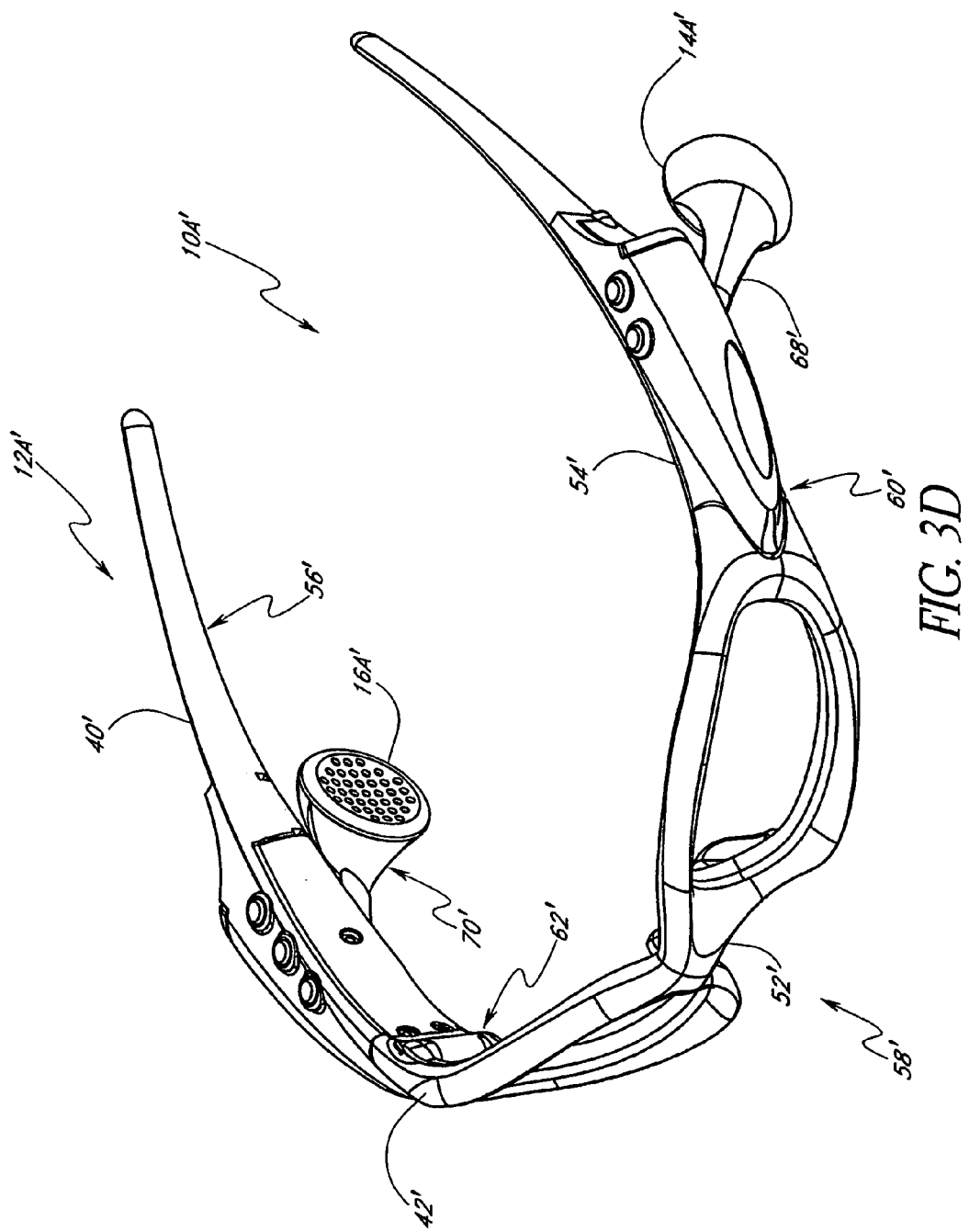
FIG. 3D is a front, top, and left side perspective view of another modification of the wearable audio devices illustrated in FIGS. 1, 2 and 3A-C.

A modification of the audio device 10 is illustrated in FIG. 3A, and referred to generally by the reference numeral 10A. Components of the audio device 10A that are the same as the audio device 10 have been given the same reference numeral, except that a letter "A" has been added thereto.

In the illustrated embodiment of the audio device 10A, the support 12A is in the form of an eyeglass 40. The eyeglass 40 comprises a frame 42 which supports left and right lenses 44, 46. Although the present audio device 10A will be described with reference to a dual lens eyeglass, it is to be understood that the methods and principles discussed herein are readily applicable to the production of frames for unitary lens eyeglass systems and protective goggle systems as well. Further, the lenses 44, 46 can be completely omitted. Optionally, at least one of the lenses 44, 46 can be in the form of a view finder or a video display unit configured to be viewable by a wearer of the support 12A.

Preferably, the lenses 44, 46 are configured to provide variable light attenuation. For example, each of the lenses 44, 46 can comprise a pair of stacked polarized lenses, with one of the pair being rotatable relative to the other. For example, each lens of the stacked pairs can comprise an iodine stained polarizing element. By rotating one lens relative to the other, the alignment of the polar directions of the lenses changes, thereby changing the amount of light that can pass through the pair. U.S. Pat. No. 2,237,567 discloses iodine stained polarizers and is hereby expressly incorporated herein by reference. Additionally, rotatable lens designs are disclosed in U.S. Pat. No. 4,149,780, which is hereby expressly incorporated herein by reference.

Alternatively, the lenses 44, 46, can comprise photochromic compositions that darken in bright light and fade in lower light environments. Such compositions can include, for example, but without limitation, silver, copper, and cadmium halides. Photochromic compounds for lenses are disclosed in U.S. Pat. Nos. 6,312,811, 5,658,502, 4,537,612, each of which are hereby expressly incorporated by reference.

More preferably, the lenses 44, 46 comprise a dichroic dye guest-host device configured to provide variable light attenuation. For example, the lenses 44, 46 can comprise spaced substrates coated with a conducting layer, an alignment layer, and preferably a passivation layer. Disposed between the substrates is a guest-host solution which comprises a host material and a light-absorbing dichroic dye guest. A power circuit (not shown) can be supported by the frame 42. The power circuit is provided with a power supply connected to the conducting layers. Adjustment of the power supply alters the orientation of the host material which in turn alters the orientation of the dichroic dye. Light is absorbed by the dichroic dye, depending upon its orientation, and thus provides variable light attenuation. Such a dichroic dye guest-host device is disclosed in U.S. Pat. No. 6,239,778, which is hereby expressly incorporated by reference.

Alternatively, the lenses may be pivotably or hingeably connected to the frame, so that they may be partially or completely rotated out of the field of sight. See the discussion of FIGS. 25 and 26, below.

The frame 42 also comprises left and right orbitals 48, 50 for supporting the left and right lenses 44, 46, respectively. Although the present invention will be described in the context of a pair of orbitals 48, 50 which surround the respective lenses 44, 46, the principles of the present inventions also apply to eyeglass systems in which the orbitals only partially surround the lens or lenses, or contacts only one edge or a portion of one edge of the lens or each lens as well. In the illustrated embodiment, the orbitals 48, 50 are connected by a bridge portion 52.

The eyeglass 40 is also provided with a pair of generally rearwardly extending ear stems 54, 56 configured to retain the eyeglass 40 on the head of a wearer. In addition, an open region 58 is configured to receive the nose of the wearer, as is understood in the art. The open region 58 may optionally be provided with a nose piece, either connected to the lens orbitals 48, 50, or the bridge 52, or directly to the lenses, depending on the particular embodiment. Alternatively, the nose piece may be formed by appropriately sculpting the medial edges of the orbitals 48, 50 and the lower edge of the bridge 52, as in the illustrated embodiment.

The frame 42 and the ear stems 54, 56 can be made from any appropriate material, including polymers and metals. Preferably, the frame 42 and the ear stems 54, 56 are manufactured from a polymer. The orbitals 48, 50 can be separately formed and assembled later with a separately manufactured bridge 52, or the orbitals 48, 50 and bridge 52 can be integrally molded or cast. When a metal material is used, casting the eyeglass components directly into the final configuration desirably eliminates the need to bend metal parts.

The ear stems 54, 56 are pivotally connected to the frame 42 with hinges 60, 62. Additionally, the ear stems 54, 56 preferably include padded portions 64, 66, respectively. The padded portions preferably comprise a foam, rubber, or other soft material for enhancing comfort for a wearer. The padded portions 64, 66 preferably are positioned such that when the audio device 10A is worn by a wearer, the padded portions 64, 66 contact the wearer between the side of the user's head and the superior crux and/or upper portion of the helix of the wearer's ears.

In the illustrated embodiment, the support members 28A, 30A are in the form of support arms 68, 70 extending downwardly from the ear stems 54, 56, respectively. As such, the speakers 14A, 16A can be precisely positioned relative to the ears 20, 22 (FIG. 1) of a wearer's head 18. Because the eyeglass 40 is generally supported at three points of contact with the wearer's head, the alignment of the speakers 14A, 16A with the ears 20, 22 can be reliably repeated. In particular, the eyeglass 40 is supported at the left ear stem in the vicinity of the left ear 20, at the bridge 52 by a portion of the user's head 18 in the vicinity of the nose 19, and at the right ear stem 56 by a portion of the user's head 18 in the vicinity of the ear 22.

Optionally, the support arms 68, 70 can be flexible. Thus, users can adjust the spacing 32, 34 (FIG. 1) between the speakers 14A, 16A and the ears 20, 22, respectively. Once a wearer adjusts the spacing of the speakers 14A, 16A from the ears 20, 22, respectively, the spacing will be preserved each time the wearer puts on or removes the eyeglass 40. The various degrees of adjustability for the speakers will be discussed in detail below.

Further, the support arms 68, 70 can be attached to the ear stems 54, 56, respectively, with mechanical devices (not shown) configured to allow the support arms 68, 70 to be adjustable. For example, such a mechanical device can allow the support arms 68, 70 to be pivoted, rotated, and/or translated so as to adjust a spacing between the speakers 14A, 16A and the ears 20, 22. The same mechanical devices or other mechanical devices can be configured to allow the support arm 68, 70 to be pivoted, rotated, and/or translated to adjust a forward to rearward alignment and/or an up-down alignment of the speakers 14A, 16A and the ears 20, 22, respectively. Such mechanical devices are described in greater detail below with reference to FIGS. 3D-J and FIGS. 23-30, below.

With the configuration shown in FIG. 3A, the audio device 10A maintains the speakers 14A, 16A in a juxtaposed position relative to the ears 20, 22, respectively, and spaced therefrom. Thus, the user is not likely to experience discomfort from wearing and using the audio device 10A.

Preferably, the support arms 68, 70 are raked rearwardly along the ear stems 54, 56, respectively. As such, the support arms 68, 70 better cooperate with the shape of the human ear. For example, the helix and the lobe of the human ear are generally raised and extend outwardly from the side of a human head. The helix extends generally from an upper forward portion of the ear, along the top edge of the ear, then downwardly along a rearward edge of the ear, terminating at the lobe. However, the tragus is nearly flush with the side of the human head. Thus, by arranging the support arm 68, 70 in a rearwardly raked orientation, the support arms 68, 70 are less likely to make contact with any portion of the ear. Particularly, the support arms 68, 70 can be positioned so as to be lower than and medial to the upper portion of the helix, above the lobe, and preferably overlie the tragus.

Alternatively, the support arms 68, 70 can be attached to the ear stems 54, 56, respectively, at a position rearward from the meatus of the ears 20, 22 when the eyeglass 40 is worn by a user. As such, the support arms 68, 70 preferably are raked forwardly so as to extend around the helix and position the speakers 14A, 16A approximately over the tragus. This construction provides a further advantage in that if a user rotates the eyeglass 40 such that the lenses 44, 46 are moved upwardly out of the field of view of the wearer (such that the eyeglasses are worn across the forehead or across the top of the head), the speakers 14A, 16A can be more easily maintained in alignment with the ears 20, 22 of the wearer.

Preferably, the support arms 68, 70 are raked rearwardly so as to form angles 72, 74 relative to an approximate longitudinal axis of the ear stems 54, 56. The angles 72, 74 can be between 0 and 90 degrees. Preferably, the angles 72, 74 are between 10 and 70 degrees. More preferably, the angles 72, 74 are between 20 and 50 degrees. The angles 72,

74 can be between about 35 and 45 degrees. In the illustrated embodiment, the angles 72, 74 are about 40 degrees.

Optionally, the support arm 68, 70 can be curved within an anterior-posterior plane. In this configuration, the angles 72, 74 can be measured between the longitudinal axis of the ear stems 54, 56 and a line extending from the point at which the support arm 68, 70 connect to the ear stems 54, 56 and the speakers 14A, 16A.

The audio device 10A can be used as an audio output device for any type of device which provides an audio output signal. The audio device 10A can include an audio input terminal or jack disposed anywhere on the eyeglass 40 for receiving a digital or analog audio signal. Preferably, wires connecting the input jack (not shown) with the speakers 14A, 16A extend through the interior of the ear stems 54, 56 so as to preserve the outer appearance of the eyeglass 40. Alternatively, the audio device 10A can include a wireless receiver or transceiver for receiving digital signals from another device.

With reference to FIGS. 3D-3J, a modification of the audio devices 10, 10A is illustrated therein and referred to generally by the reference numeral 10A'. The audio device 10A' can include the same components as the audio devices 10, 10A except as noted below. Components of the audio device 10A' that are similar to the corresponding components of the audio devices 10, 10A may be identified with the same reference numerals except, that a "'" has been added thereto.

The audio device 10A' is in the form of an eyeglass 12A' having a frame 40A'. The audio device 10A' also includes a device for the storage and playback of a sound recording.

As noted above, an aspect of at least one of the inventions disclosed herein includes a realization that the forward to rearward spacing of the bridge of a human nose to the auditory canal of the ear falls into a relatively narrow range of distances for large portions of the population. For example, the forward-to-rearward spacing from the bridge of the nose to the auditory canal is normally between about 4⅞ inches to about 5⅛ inches, and often between about 4¾ inches and about 5¼ inches. Corresponding anterior-posterior plane adjustability of the speakers is preferably provided.

Figure 3E:
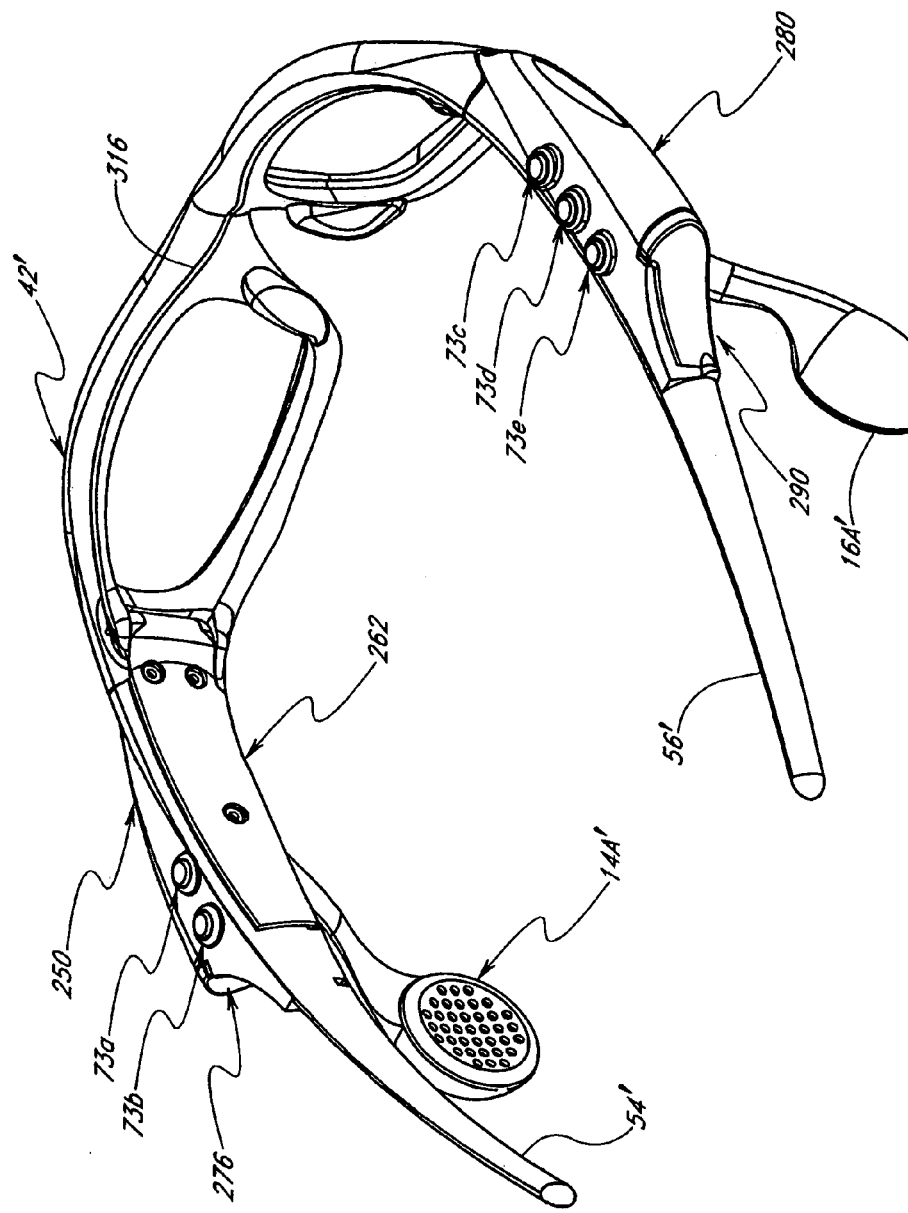
FIG. 3E is a rear, top, and right side perspective view of the wearable audio device illustrated in FIG. 3D.
Figure 3F:
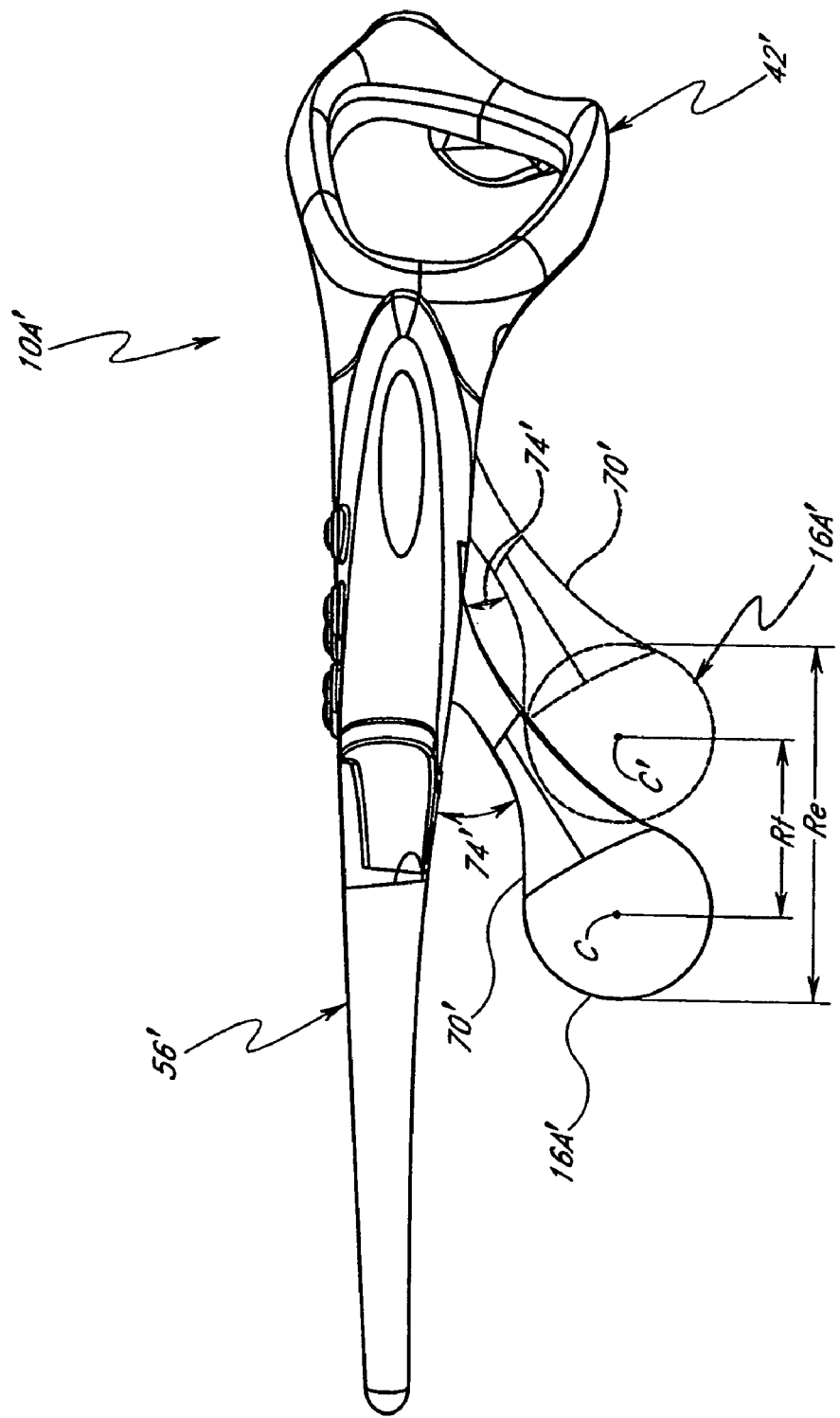
FIG. 3F is a right side elevational view of the wearable audio device illustrated in FIG. 3D.

Thus, with reference to FIG. 3F, the audio device 10A' is configured such that the supports 68', 70', can translate, along a forward to rearward direction, over a range identified generally by the reference numeral Rt. Preferably, the range Rt is at least about ⅛ of one inch. Further, the range Rt can be at least about ¼ of one inch. Further, the range Rt can be in the range of from about 0.25 inches to about 1.5 inches, and in one construction is about 0.75 of one inch. The midpoint of the anterior-posterior range of motion is generally positioned with respect to the bridge of the nose within the range of from about 4⅞ inches to about 5⅛ inches posteriorly of the eyeglass nose bridge. As such, a substantial percentage of the human population will be able to align a Center (C) of the speakers 14A', 16A' with their auditory canal.

Figure 3G:
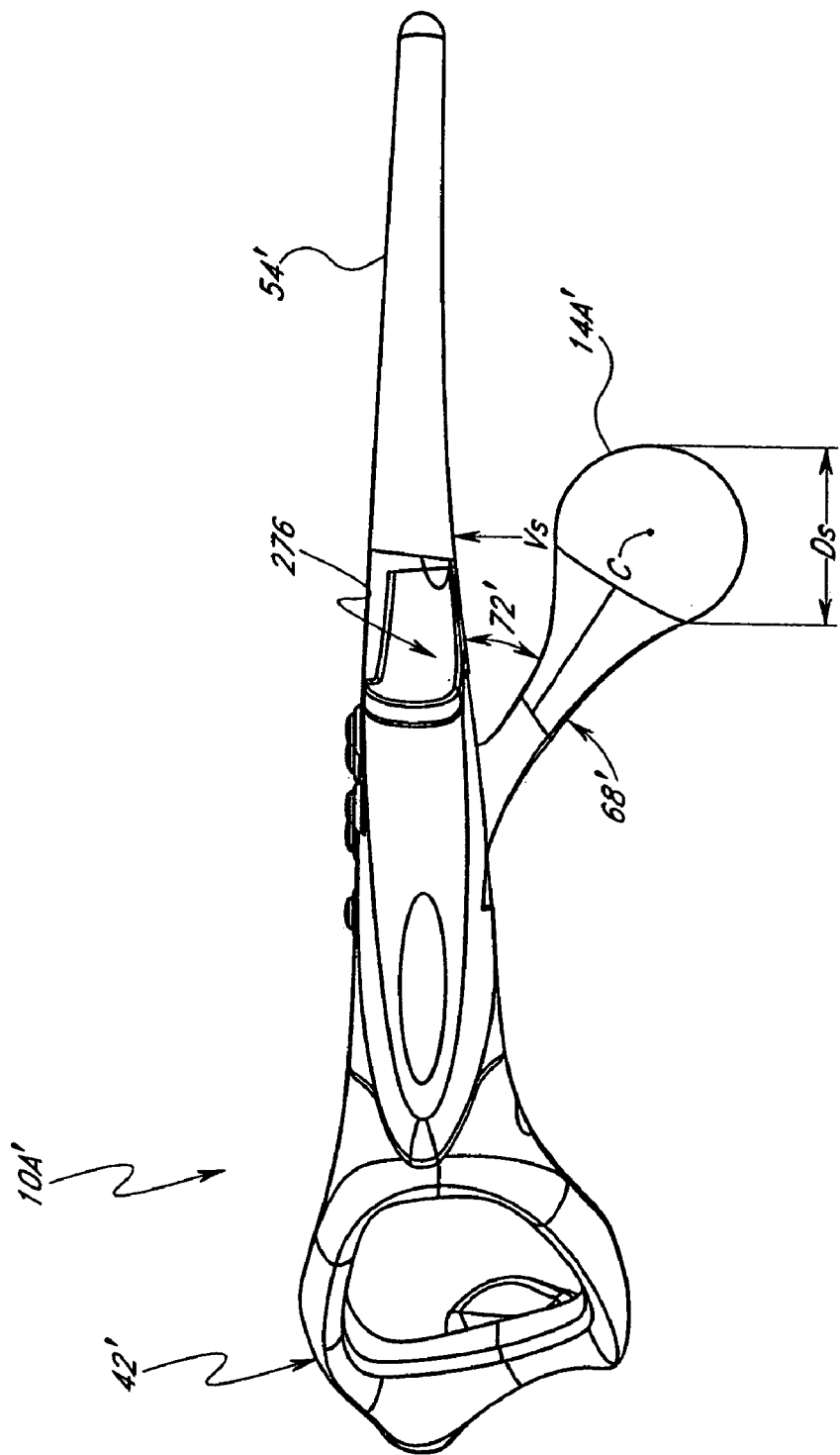
FIG. 3G is a left side elevational view of the wearable audio device illustrated in FIG. 3D.

With reference to FIG. 3G, a further advantage is provided where the diameter Ds of the speakers 14A', 16A' is greater than about 0.5 inches, such as about 1 inch or greater. As such, an effective range Re (FIG. 3F) over which the speakers 14A', 16A' can reach, is significantly enhanced with respect to the above-noted nose bridge to auditory canal spacings for humans.

Thus, the connection between the supports 68', 70' to the ear stems 54', 56', respectively, can be configured to allow a limited anterior-posterior translational range of movement of Rt yet provide a larger range of coverage Re.

Preferably, the connection between the support 68', 70' and the ear stems 54', 56', is configured such that the translational position of the speakers 14A', 16A' is maintained when a user removes the audio device 10A' from their head. For example, the connection between the supports 68', 70', and the ear stems 54', 56' can generate sufficient friction so as to resist movement due to the weight of the supports 68', 70' and the speakers 14A', 16A'. Alternatively, the connection or an adjustment device can include locks, clips, or other structures to prevent unwanted translational movement of the speakers 14A', 16A'. As such, a further advantage is provided in that a user can repeatedly remove and replace the audio device 10A' without having to readjust the translational position of the speakers 14A', 16A'.

Another advantage is provided where the supports 68', 70' are made from a material or design that is substantially rigid, at least at room temperature. For example, with reference to FIG. 3F, the angles 72', 74' defined between the supports 68', 70' and the ear stems 54', 56', respectively, can be maintained at a predetermined value while the speakers 14A', 16A' can be moved along an anterior-posterior axis over the range Rt. Thus, as noted above with reference to FIG. 3A and the description of the angles 72, 74, the angles 72', 74' can be maintained at a desired angle as a user moves the speakers 14A', 16A' over the range Rt.

Optionally, the supports 68', 70' can be made from a material that can be deformed at room temperature. However, more preferably the material is sufficiently rigid such that substantial pressure is required to change the angle 74'. Alternatively, the supports 68', 70' can be made from a thermally sensitive material that can be softened with the application of heat. Thus, a wearer of the audio device 10A' can heat the supports 68', 70' and adjust the angle 74' to optimize comfort for the particular wearer. Such thermal sensitive materials are widely used in the eyewear industry and thus a further description of such materials is not deemed necessary for one of ordinary skill in the art to make and use the inventions disclosed herein. Alternatively, the speakers can be pivotably mounted to the supports, and/or the supports can be pivotably mounted to the ear stems, to allow further adjustability in the anterior-posterior plane as well as in the lateral or medial direction.

Preferably, the angles 72', 74' and lengths of the corresponding supports are selected such that the spacing Vs between the center C of the speakers 14A', 16A' and a lower surface of the ear stems 54', 56' is within the range of about 0.25 inch to about 1.75 inch, and often within the range of from about 0.75 of an inch to about 1.25 inches. One aspect of at least one of the inventions disclosed herein includes the realization that there is little variation in the spacing for adult humans between the center of the auditory canal and the connecting tissue between the pinna of the ear and the skin on the side of the head. In particular, it has been found that in virtually all humans, the distance between the upper most connection of the ear and the head to the center of the auditory canal is between 0.75 of an inch and 1.25 inches. Thus, by sizing the angles 72', 74' such that the spacing Vs is between about 0.75 of an inch and 1.25 inches, the audio device 10A can be worn by virtually any adult human and has sufficient alignment between the wearer's auditory canal and the center C of the speakers 14A', 16A'. Further, where the diameter Ds of the speakers 14A', 16A' is about 1 inch, almost any human can wear the audio device 10A' without having to adjust the angles 72', 74'. In other words, the auditory canal of virtually any human would be aligned with a portion of the speakers 14A', 16A' although the wearer's auditory canal might not be precisely aligned with the center C of the speakers 14A', 16A'.

Figure 3H:
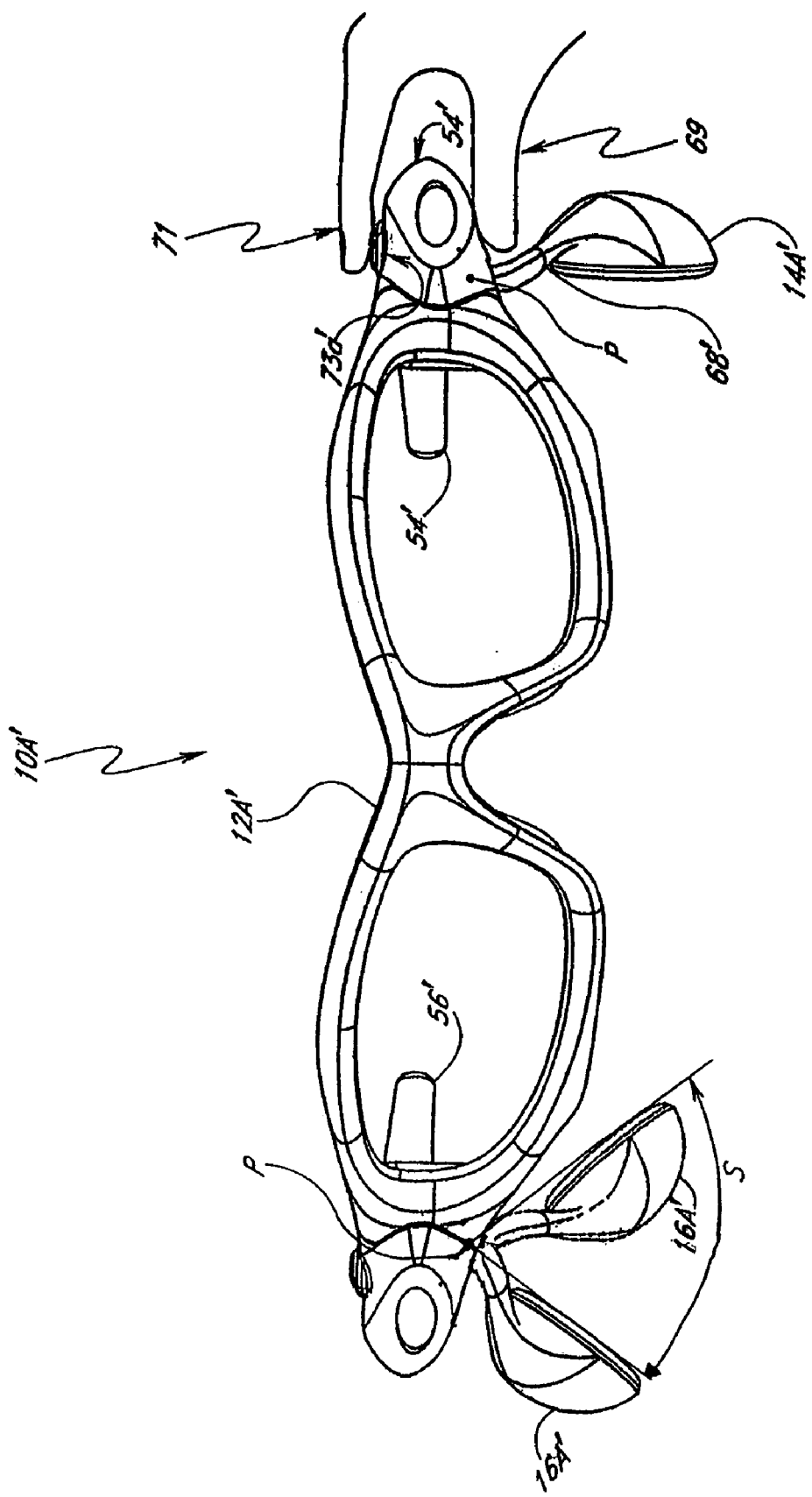
FIG. 3H is a front elevational view of the wearable audio device illustrated in FIG. 3D.

With reference to FIG. 3H, the supports 68', 70' are configured to allow the speakers 14A', 16A', respectively, to pivot toward and away from an ear of a user. For example, as shown in FIG. 3H, the supports 68', 70' are connected to the ear stems 54', 56', respectively, so as to be pivotable about a pivot axis P. As such, the speakers 14A', 16A' can be pivoted or swung about the pivot axis P.

The range of motion provided by the connection between the supports 68', 70' and the ear stems 54', 56' is identified by the angle S in FIG. 3H. In FIG. 3H, the speaker 14A' is illustrated in an intermediate position in the range of motion provided by the connection between the support 68' and the ear stem 54'.

The illustration of the speaker 16A' includes a solid line representation showing a maximum outward position of the speaker 16A' (not to actual scale). Additionally, FIG. 3H includes a phantom illustration of the speaker 16A' in a maximum inward position. The angle S illustrates a range of motion between a maximum outward position (solid line) and a maximum inward position (phantom line) of the speaker 16A'.

Preferably, the range of motion S is sufficiently large to allow any human wearer of the audio device 10A' to position the speakers 14A', 16A' such that sound emitted from the speakers 14A', 16A' is clearly audible yet comfortable for the wearer of the audio device 10A'. For example, human ears vary in the precise shape and size of the external anatomy. As such, one wearer of the audio device 10A' may have outer facing features of their ear that project further than another wearer of the audio device 10A'. Thus, one wearer may prefer the speakers 14A', 16A' to be positioned more inwardly than another wearer.

Further, some wearers of the audio device 10A' may prefer to press the speakers 14A', 16A' into contact with the outer surfaces of their ears. For example, some users may desire to experience to loudest possible volume or the best possible signal to ambient noise ratio from the speakers 14A', 16A'. Thus, by pressing the speakers 14A', 16A' against their ears, the perceived volume of the sound emitted from the speakers 14A', 16A' and the signal to external noise ratio will be the greatest.

Alternatively, other users may prefer to have the speakers spaced from the outer surfaces of their ear so as to prevent contact with the ear, yet maintain a close spacing to preserve the perceived volume of the sound emitted from the speakers 14A', 16A'. Additionally, a user may occasionally wish to move the speakers 14A', 16A' further away from their ears, to allow the wearer to better hear other ambient sounds when the speakers 14A', 16A' are not operating.

For example, a wearer of the audio device 10A' might wish to use a cellular phone while wearing the audio device 10A'. Thus, the wearer can pivot one of the speakers 14A', 16A' to a maximum outward position (e.g., the solid line illustration of speaker 16A' in FIG. 3H) to allow a speaker of the cell phone to be inserted in the space between the speaker 16A' and the ear of the wearer. As such, the wearer can continue to wear the audio device 10A' and use another audio device, such as a cell phone. This provides a further advantage in that, because the audio device 10A' is in the form of eyeglasses 12A', which may include prescription lenses or tinted lenses, the wearer of the audio device 10A' can continue to receive the benefits of such tinted or prescription lenses, as well as audio signal from the other speaker while using the other audio device.

Any of the audio devices disclosed herein may additionally be provided with a pause, mute, or on/off switch which is activated by the position of the speakers 14A, 16A. If the wearer laterally advances one of the speakers from a first position adjacent the ear to a second position, spaced apart from the ear such as to permit the use of a cell phone, the signal to both speakers can be automatically stopped such as to permit use of the cell phone without audio interference. Advancing the speaker from the second position back to the first position thereafter automatically resumes delivery of signal to the speakers 14A, 16A.

An additional advantage is provided where the pivotal movement of the supports 68', 70' is isolated from the translational movement thereof. For example, the connection between the supports 68', 70' and the ear stems 54', 56' can be configured so as to allow a user to pivot the supports 68', 70' without substantially translating the supports 68', 70' forwardly or rearwardly. In one embodiment, the connections can be configured to provide more perceived frictional resistance against translational movement than the frictional resistance against pivotal movement about the pivot axis P (FIG. 3H). Thus, a user can easily pivot the speakers 14A', 16A' toward and away from their ears without translating the speakers 14A', 16A'. Thus, the procedure for moving the speakers 14A', 16A' toward and away from a wearer's ears can be performed more easily and, advantageously, with one hand.

The range of motion S is generally no greater than about 180°, and often less than about 90°. In one preferred embodiment, the range of motion S is no more than about 30° or 40°. The connection between the support 68', 70' and the ear stems 54', 56', respectively, is generally configured to provide a sufficient holding force for maintaining a rotational orientation of the speakers 14A', 16A' about the pivot axis P. For example, the connection between the supports 68', 70' and the ear stems 54', 56', respectively, can be configured to generate sufficient friction to resist the forces generated by normal movements of a wearer's head.

A further advantage is achieved where sufficient friction is generated to prevent the pivotal movement of the speakers 14A', 16A' when the audio device 10A' is removed from the wearer and placed on a surface such that the speakers 14A', 16A' support at least some of the weight of the audio device 10A'. For example, when a wearer of the audio device 10A' removes the audio device 10A' and places it on a table with the speakers 14A', 16A' facing downwardly, the speakers 14A', 16A' would support at least some of the weight of the audio device 10A'. Thus, by providing sufficient friction in the connection between the supports 68', 70' and the ear stems 54', 56', respectively, the position of the speakers 14A', 16A' can be maintained. Thus, when the wearer replaces the audio device 10A', the speakers 14A', 16A' will be in the same position, thereby avoiding the need for the wearer to reposition speakers 14A', 16A'.

As noted above, an aspect of one of the inventions disclosed herein includes the realization that where an electronic device that is worn in the same manner as a pair of eyeglasses includes a user operable switch for controlling a function of the electronics, the comfort of the wearer of the audio device can be enhanced where the switches are operable without transferring a substantial load to the head of the wearer. For example, where the electronic device includes buttons for controlling an aspect of the device, a further advantage is provided where a support surface is provided opposite the button such that a user can apply a balancing force to the actuation force applied to the button, thereby preventing a substantial force from being transferred to the head of the wearer.

Figure 31:
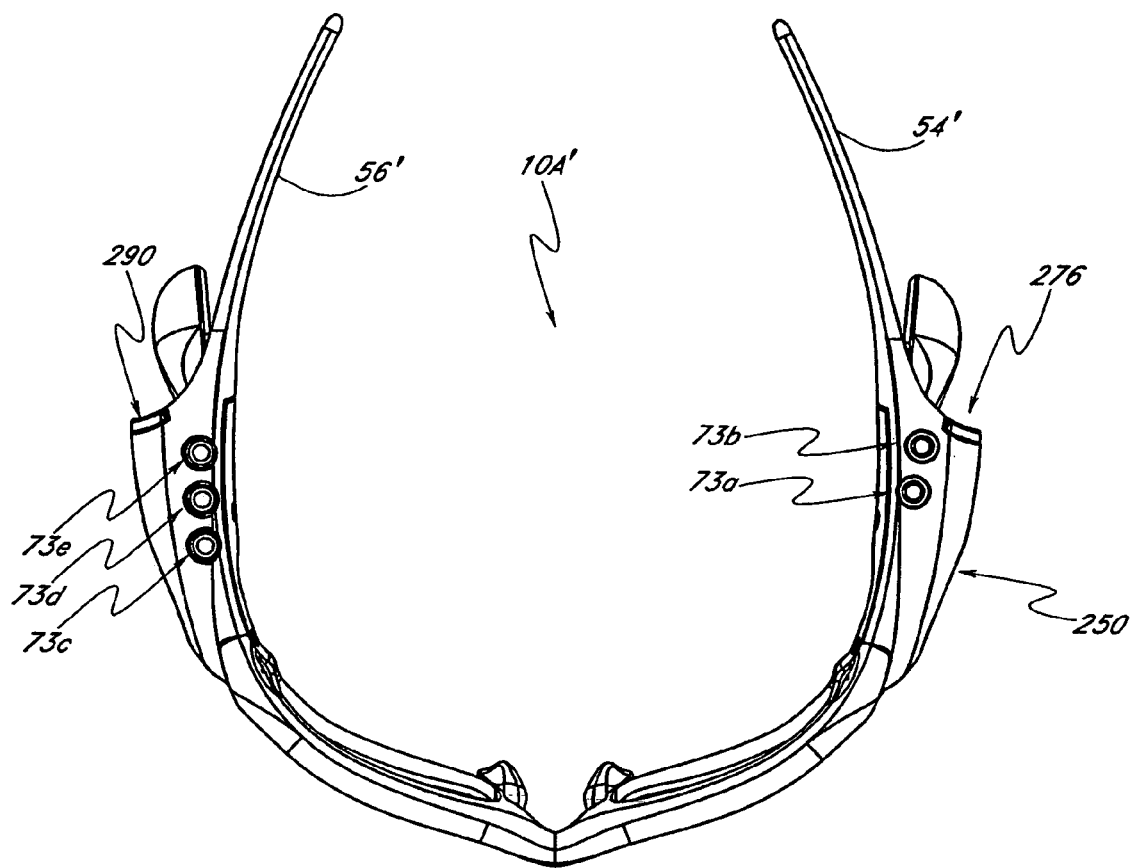
FIG. 31 is a schematic representation of a partial cross-sectional view of the left ear of the wearer's head of FIG. 29, illustrating a speaker positioned therein.

With reference to FIG. 31, the audio device 10A' can include at least one button 73a. In the illustrated embodiment, the audio device 10A' includes five buttons; a first button 73a and a second button 73b mounted to the left ear stem 54', and a third button 73c, a fourth button 73d, and a fifth button 73e mounted to the right ear stem 56'. Of course, this is one preferred embodiment of the arrangement of the buttons 73a, 73b, 73c, 73d, 73e. Other numbers of buttons and other arrangements of buttons are also applicable.

As shown in FIG. 3H, the button 73a is mounted on an upwardly facing surface of the ear stem 54'. Additionally, the ear stem 54' has a lower surface that faces in a generally opposite direction to the direction towards which the upper surface of the ear stem 54' faces. Thus, as shown in FIG. 3H, the user can use a finger 71 to actuate the button 73a and a thumb 69 to counteract the actuation force of the finger 71 by pressing on the lower surface of the ear stem 54'. As such, the wearer or user of the audio device 10A' can actuate the button 73a without imparting a substantial load to the wearer of the audio device 10A'.

This provides a further advantage in that a repeated application of a force against the audio device 10A' that is transferred to the head of the wearer of the audio device 10A' is avoided. For example, where the audio 10A' is in the form of eyeglasses 12A', a wearer of the eyeglasses 12A' can be subjected to irritations if the wearer repeatedly presses the eyeglasses 12A' to actuate a switch. Further, such repeated loads can cause headaches. Thus, by configuring the ear stems 54A' such that the button 73a can be depressed without transferring a substantial load to the wearer of the ear glasses 12A', such irritations and headaches can be avoided.

Further, by disposing the button 73a on an upper portion of the ear stems 54A', and by providing the ear stems 54A' with an opposite lower surface that faces an opposite direction relative to the upper surface, a wearer can grasp the ear stems 54A' from the side, as illustrated in FIG. 38, thereby allowing the user to counteract the actuation force required to actuate the button 73a without having to insert a finger between a side of the wearer's head and ear stems 54A'. In any of the embodiments herein, the surface which opposes the buttons may be provided with any of a variety of tactile feedback structures, such as ridges or bumps, that have a predetermined alignment with respect to the buttons. This can assist the user in positioning their thumb in the identical position each time, so that the user, after a learning period, can rapidly reach for the controls, position their hand and identify with which button their fingers are aligned. See, for example, the tactile indicium illustrated in FIG. 24.

Figure 3J:
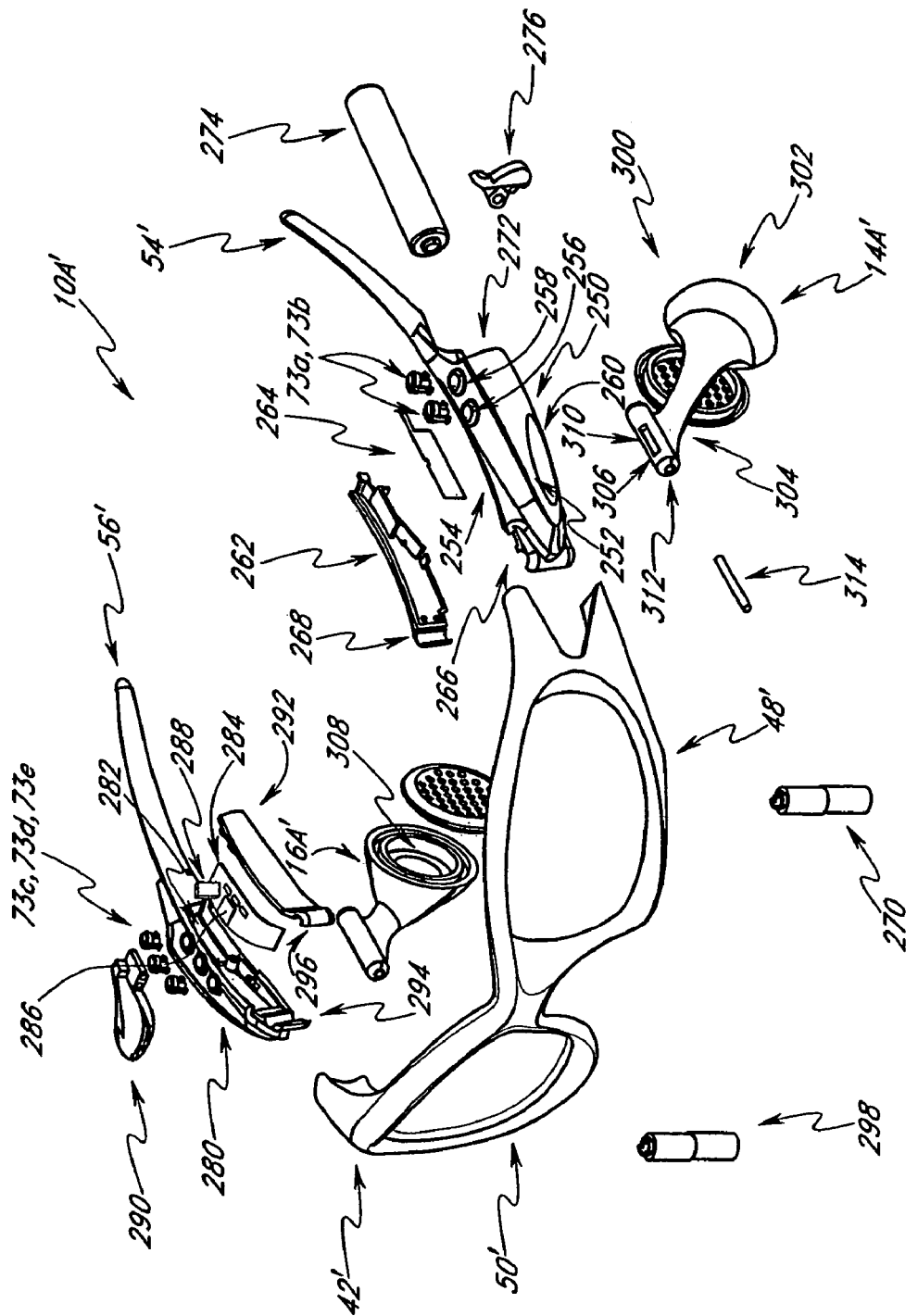
FIG. 3J is a front, top, and left side perspective and exploded view of the wearable audio device illustrated in FIG. 3D.

FIG. 3J illustrates an exploded view of an exemplary embodiment of the audio device 10A'. As shown in FIG. 3J, the left side ear stem 54A' defines an electronic housing portion 250 which defines an internal cavity 252 configured to receive electronic components. The electronics housing 250 includes an upper surface 254 and lower surface 260. The upper surface 254 extends generally outwardly from the ear stems 54A' and around the internal cavity 252. The upper surface also includes apertures 256, 258 through which buttons 73a, 73b, respectively, extend.

The housing 250 includes a lower surface 260. The lower surface 260 (which may contain ridges, apertures or slots) faces in an opposite direction from the upper surface 254 of the housing 250. Preferably, the lower surface 260 is at least about 0.25 inches, and may be 0.5 inches or 0.75 inches or more wide. As such, the lower surface 260 provides a surface which allows a wearer to easily grasp the ear stem 54A' so as to balance an actuation force supplied to the button 73a, 73b.

A cover member 262 cooperates with the housing 250 to define the closed internal cavity 252. In the illustrated embodiment, the internal cavity 252 includes at least one compartment configured to receive an electronic circuit board 264 which includes at least one switch for each of the buttons 73a, 73b. In an exemplary but non-limiting embodiment, the board 264 can include two switches, one for each of the buttons 73a, 73b, which are configured to control a volume output from the speakers 14A', 16A'. The cover 262 can be attached to the ear stem 54A' with any type of fastener, such as, for example, but without limitation, screws, rivets, bolts, adhesive, and the like.

In the illustrated embodiment, the housing 250 also defines a hinge recess 266. Additionally, the cover member 262 includes a complimentary hinge recess 268. The recesses 266, 268 are sized to receive a hinge pin 270. In the illustrated embodiment, the hinge pin 270 is hollow and includes an aperture therethrough. The ends of the hinge pin 270 are configured to be engaged with corresponding portions of the frame 42' so as to anchor the position of the hinge pin 270 relative to the frame 42'. When the cover 262 is attached to the housing 250, with the hinge pin 270 disposed in the recesses 266, 268, the ear stem 54A' is pivotally mounted to the frame 42'. The aperture extending through the hinge pin 270 provides a passage through which electrical conduits can pass, described in greater detail below.

The housing 250 also includes a power source recess (not shown). The power source recess includes an opening 272 sized to receive a power storage device 274. In the illustrated embodiment, the power storage device 274 is in the form of an AAAA-sized battery. Of course, the power storage device 274 can be in the form of any type or any size of battery and can have any shape. However, a further advantage is provided where a standard-sized battery such as an AAAA battery is used. For example, as described in greater detail below, this size battery can be conveniently balanced with other electronic components configured for playback of a sound recording.

A door 276 is configured to close the opening 272. In the illustrated embodiment, the door 276 is preferably hingedly connected to a housing 250 so as to allow the door to be rotated between an open position and a closed position. FIGS. 3D-31 illustrate the door 276 in a closed position.

The right ear stem 56' includes a housing 280 defining an internal cavity 282 configured to receive at least one electronic component. The housing 280 also includes upper and lower surfaces (unnumbered) that can be configured identically or similarly to the upper and lower surfaces 254, 260 of the housing 250. However, in the illustrated embodiment, the upper surface of the housing 280 includes 3 apertures configured to receive portions of the buttons 73c, 73d, 73e. Thus, a further description of the housing 280 is not necessary for one of ordinary skill in the art to make and use the inventions disclosed herein.

The internal cavity 282, in the illustrated embodiment, is configured to receive electronics such as a printed circuit board 284. In the illustrated embodiment, the printed circuit board 284 includes one switch for each of the buttons 73c, 73d, and 73e. Additionally, the printed circuit board 284 includes an audio file storage and playback device 286.

The device 286 can be configured to store and playback any desired type of electronic audio and/or video file. In the illustrated embodiment, the device 286 includes a memory, an amplifier, and a processor. The memory, amplifier, and the processor are configured to operate together to function as an audio storage and playback system. For example, the audio storage and playback system can be configured to store MP3 files in a memory and to play back the MP3 files through the speakers 14A', 16A'. Suitable electronics for enabling and amplifying MP3 storage and playback are well known in the art, and may be commercially available from Sigmatel, Inc. or Atmel, Inc. Thus, further description of the hardware and software for operating the device 286 as a storage and playback device is not necessary for one of ordinary skill in the art to make and use the inventions disclosed herein.

Advantageously, the printed circuit board 284 also includes or is in electrical communication with a data transfer port 288. In the illustrated embodiment, the housing 280 includes an aperture (not shown) disposed in a position similar to the position of the aperture 272 on the housing 250. In the housing 280, however, the aperture is aligned with the data transfer port 288. Thus, when the printed circuit board 284 is received in the internal cavity 282, the data transfer port 288 is aligned with the aperture.

A door 290 is configured to open and close the aperture through which the data port 288 is exposed. Preferably, the door 290 is hingedly engaged to the housing 280, in an identical or similar manner as the door 276. In the illustrated embodiment, the door 290 can be pivoted relative to housing 280, thereby exposing the data transfer port 288. In the illustrated embodiment, the data transfer port is configured to operate according to the universal serial bus (USB) transfer protocol. In one implementation of the invention, the earstem is provided with a mini USB port. The mini USB port enables both downloading of digital music from a source into the eyeglass, as well as charging a rechargeable battery carried by the eyeglass. Optical data ports may alternatively be used. As a further alternative, MP3 files may be uploaded from a source using wireless systems, such as BLUETOOTH® protocols, as is discussed below. Further, the device 286 is configured to receive audio files from another computer, through the data transfer port 288 and to store the files into the memory incorporated into the device 286.

A cover 292 is configured to close the internal cavity 282. The cover 292 can be configured in accordance with the description of the cover 262. Similarly to the housing 250 and cover 262, the housing 280 and cover 292 include recesses 294, 296 configured to receive a hinge pin 298. The hinge pin 298 can be constructed identically or similarly to the hinge pin 270. Thus, with the hinge pin 298 engaged with a frame 42', the cover member 292 can be attached to the housing 280 with the hinge pin 298 received within the recesses 294, 296. As such, the ear stem 56A' can be pivoted relative to the frame 42'.

With continued reference to FIG. 3J, the speakers 14A', 16A' can be constructed in a similar manner, as a mirror image of each other. Each of the speakers 14A', 16A', include a housing member 300. Each housing member 300 includes a transducer housing 302, a support stem 304, and a guide portion 306.

The transducer housing portion 302 includes an internal recess 308 (identified in the illustration of speaker 16A'). The transducer recess 308 can be sized to receive any type of acoustic transducer. For example, but without limitation, the transducer recess 308 can be configured to receive a standard acoustic speaker commonly used for headphones. In a non-limiting embodiment, the speaker transducer (not shown) has an outer diameter of at least about 0.6 inches. However, this is merely exemplary, and other sizes of transducers can be used.

With reference to the illustration of the speaker 14A', the support stem 304 connects the transducer housing 302 with the guide portion 306. The support stem 304 includes an aperture therethrough (not shown) which connects the transducer recess 308 with the guide portion 306.

The guide portion 306 includes an aperture 310 which communicates with the aperture extending through the support stem 304. Thus, an electric conduit, described in greater detail below, can extend through the aperture 310, through the stem 304, and then to the transducer recess 308.

The guide portion 306 also includes a guide aperture 312. The guide aperture 312 is configured to receive a guide pin 314.

The guide pin 314 can be made from any of a variety of materials. In the illustrated embodiment, the guide pin 314 is a rod having an outer diameter of about 0.0625 of an inch. When assembled, the guide pin 314 is disposed within an open recess (not shown) disposed on an under surface of the housing 250. The aperture 312 is sized so as to slidably receive the pin 314. Thus, the guide portion 306 can translate relative to the pin 314 as well as rotate relative to the pin 314. The size of the aperture 312 can be configured to provide a slip fit with sufficient friction to provide the stable positions noted above with reference to FIGS. 3D-3I.

In this embodiment, the guide pin 314 and the aperture 312 provide both translational and pivotal movement. Additionally, the guide pin 314 and the aperture 312 can be configured to resistance to both translational movement and pivotal movement, with the resistance to translational movement being greater. For example, the axial length and diameter of the aperture 312, controls the maximum contact area between the guide pin 314 and the guide portion 306 and thus affects the frictional force generated therebetween. Thus, the length and diameter of the aperture 312 can be adjusted to achieve the desired frictional forces.

Figure 3K:
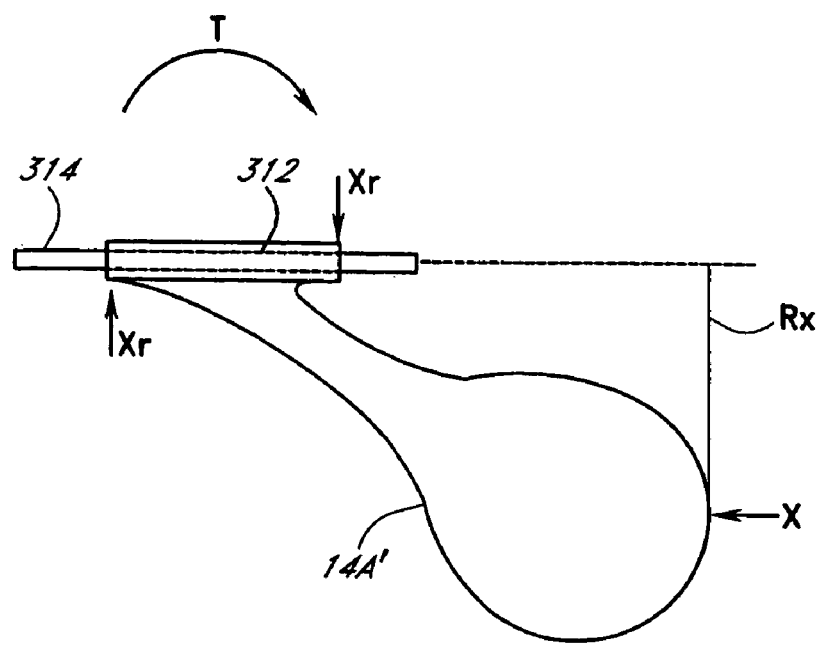
FIG. 3K is an enlarged left side elevational view of one of the speakers of the audio device illustrated in FIG. 3D.
Figure 3L:
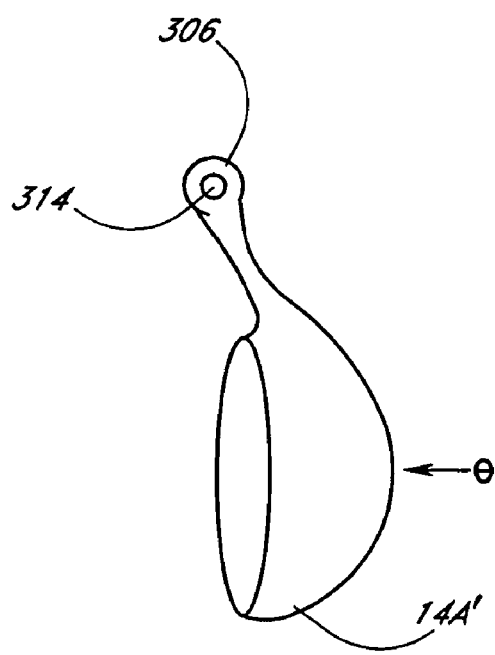
FIG. 3L is an enlarged front elevational view of the speaker illustrated in FIG. 3K.

Additionally, with reference to FIG. 3K, when a translational force X is applied to the speaker 14A', a torque T is created, which results in reaction forces Xr urging the guide portion 306 against the guide pin 314 at the forward and rearward ends thereof. These reaction forces Xr increase the frictional resistance against the translational movement of the speaker 14A'. However, as shown in FIG. 3L, when a pivot force Θ is applied to the speaker 14A', such reaction forces are not created, and the speaker 14A' can pivot about the guide pin 314 with seemingly less force applied as compared to the force X required to move the speaker 14A' in a direction parallel to the guide pin 314.

With reference again to FIG. 3J, the recess on the lower surface of the housings 250, 280, are sized so as to allow the guide portion 306 to slide in a forward to rearward direction in the range Rt, described above with reference to FIG. 3F. Additionally, the open recess on the lower surface of the housings 250, 280 is provided with a width to limit the range of motion S of the speakers 14A', 16A', described above with reference to FIG. 3H.

With reference to FIG. 3E, the frame 42' includes an interior electrical conduit channel 316 configured to receive an electrical conduit for connecting the speakers 14', 16', the printed circuit boards 264, 284, and the power storage device 274. For example, with reference to FIG. 3M, the buttons 73a, 73b, are connected to the device 286 through conduits 73ai, 73bi. The storage device 274 is connected to the device 286 through a power line 274*i*. Additionally, the speaker 14A' is connected to the device 286 with an audio output conduit 14A*i*'.

Figure 3M:
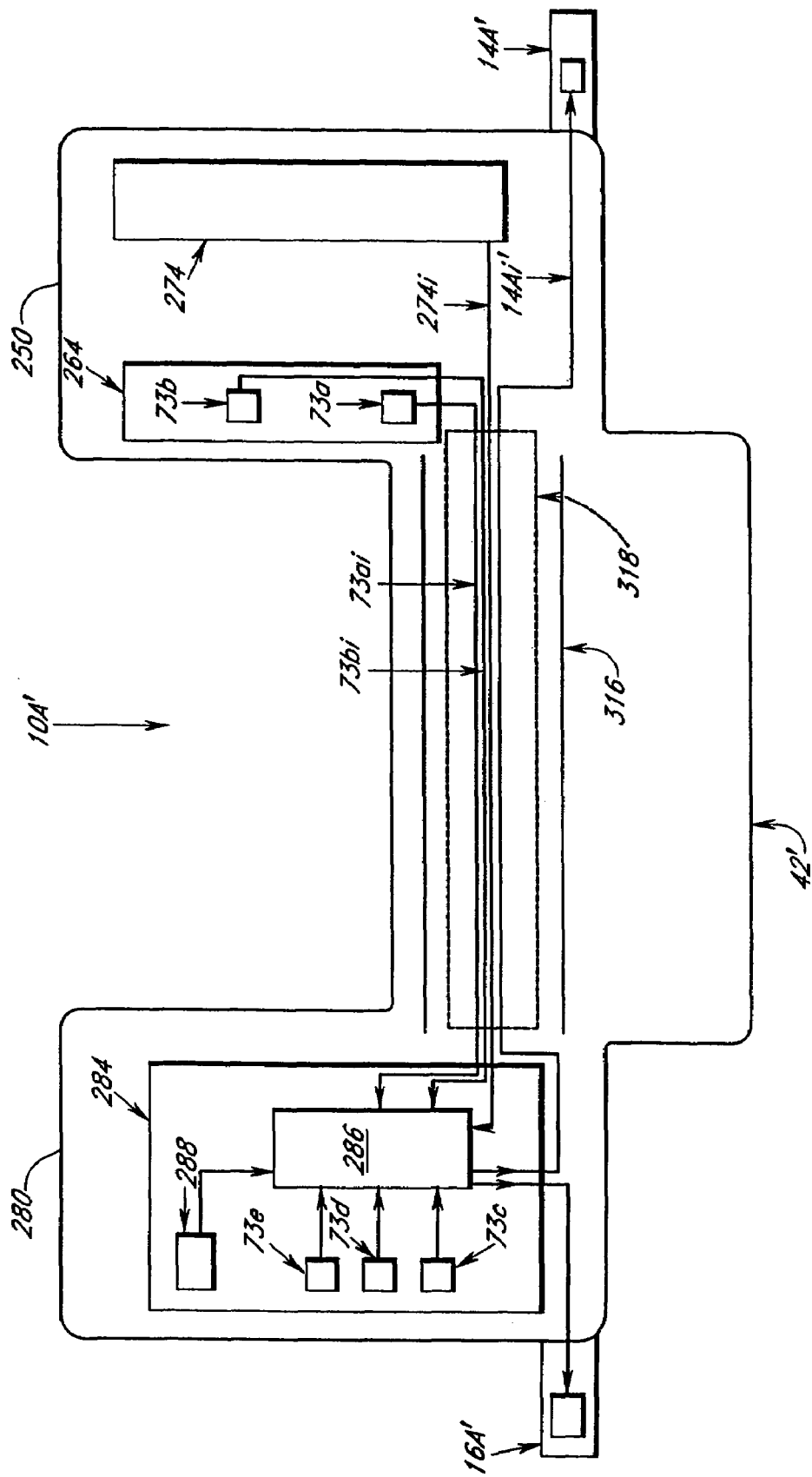
FIG. 3M is a schematic illustration of the audio device illustrated in FIG. 3D.

As illustrated in FIG. 3M, portions of the conduits 73a*i*, 73b*i*, 274*i* and 14A*i*', extend through the channel 316. In an exemplary embodiment, the conduits 73a*i*, 73b*i*, 274*i*, and 14A*i*', can be in the form of a ribbon connector 318 extending through the channel 316. Thus, with reference to FIGS. 3J and 3M, the ribbon connector 318 can extend from the housing 280, into the recesses 294, 296, through an aperture (not shown) in the hinge pin 298 to the upper opening within the hinge pin 298, then through the channel 316 (FIG. 3E), to an upper opening of the hinge pin 270, out through an aperture (not shown) through a side of a hinge pin 270, through the recesses 266, 268 of the housing 250, and then to the speaker 14A', printed circuit board 264, and the power storage device 274.

The conduit 14A*i*' can extend to the aperture 310 in the guide portion 306, through a central aperture of the support stem 304, and into the transducer recess 308, as to connect to a transducer disposed therein. Optionally, the portion of the conduit 14A*i*' that extends out of the housing 250 and into the transducer housing 300 can be formed from an insulated metal conduit, or any other known conduit. The speaker 16A' can be connected to the printed circuit board 284 in a similar manner.

The buttons 73*c*, 73*d*, 73*e* and the data transfer port 288 are connected to the device 286 through printed conduits incorporated into the printed circuit board 284.

As noted above, one aspect of at least one of the inventions disclosed herein includes the realization that a desirable balance can be achieved by disposing a power storage device in one ear stem of an eyeglass and play-back device into the second ear stem. Thus, as illustrated in FIGS. 3J and 3K, the power storage device 274 is disposed in the left ear stem 54' and the storage and play-back device 286 is disposed in the right ear stem 56'.

In the illustrated embodiment, the buttons 73*a* and 73*b* for controlling the volume of the sound output from the speakers 14A', 16A'. For example, the button 73*a* can be used for increasing volume and the button 73*b* can be used for decreasing volume. Alternatively, the button 73*b* can be for increasing volume and the button 73*a* can be for decreasing volume. When a wearer of the audio device 10A' presses one of the buttons 73*a*, 73*b*, a simple on-off signal can be transmitted to the device 286. The device 286 can be configured to interpret the on-off signals from the buttons 73*a*, 73*b* as volume control signals and adjust the volume to the speakers 14A', 16A' accordingly.

Optionally, a third command can be generated by pressing both of the buttons 73*a*, 73*b* simultaneously. For example, but without limitation, the device 286 can be configured to interpret simultaneous signals from both the buttons 73*a*, 73*b*, as a signal for turning on and off an additional feature. For example, but without limitation, the additional feature can be a bass boost feature which increases the bass of the audio signal transmitted to the speakers 14A', 16A'. Of course, other functions can be associated with the buttons 73*a*, 73*b*.

The buttons 73*c*, 73*d*, 73*e* can be figured to operate switches to transmit control signals to the device 286 similarly to the buttons 73*a*, 73*b*. For example, but without limitation, the button 73*c* corresponds to a power button. For example, the device 286 can be configured to recognize a signal from the button 73*c* as a power on or power off request. In this embodiment, when the device 286 is off, and a signal from the button 73*c* is received, the device 286 can turn on. Additionally, the device 286, when in an on state, can be configured to turn off when a signal from the button 73*c* is received. Optionally, the device 286 can be configured to, when in an off or standby state, turn on and begin to play an audio file when a signal from the button 73*c* is received. Additionally, the device 286 can be configured to pause when another signal from the button 73*c* is received. In this embodiment, the device 286 can be configured to turn off only if the button 73*c* is held down for a predetermined amount of time. For example, the device 286 can be configured to turn off if the button 73*c* is held down for more than two seconds or for three seconds or for other periods of time.

The buttons 73*d* and 73*e* can correspond to forward and reverse functions. For example, the button 73*d* can correspond to a track skip function. In an illustrative but non-limiting example, such a track skip function can cause the device 286 to skip to a next audio file in the memory of the device 286. Similarly, the button 73*e* can correspond to a reverse track skip function in which the device 286 skips to the previous audio file.

Optionally, the buttons 73*d*, 73*e* can be correlated to fast forward and rewind functions. For example, the device 286 can be configured to fast forward through an audio file, and play the corresponding sounds at a fast forward speed, when the button 73*d* is held down and to stop and play the normal speed when the button 73*d* is released. Similarly, the device 286 can be configured to play an audio file backwards at an elevated speed, when the button 73*e* is held down, and to resume normal forward play when the button 73*e* is released. This arrangement of the buttons 73*a*, 73*b*, 73*c*, 73*d*, 73*e* provides certain advantages noted above. However, other arrangements of the buttons 73*a*, 73*b*, 73*c*, 73*d*, 73*e* and the corresponding functions thereof can be modified.

Figure 4B:
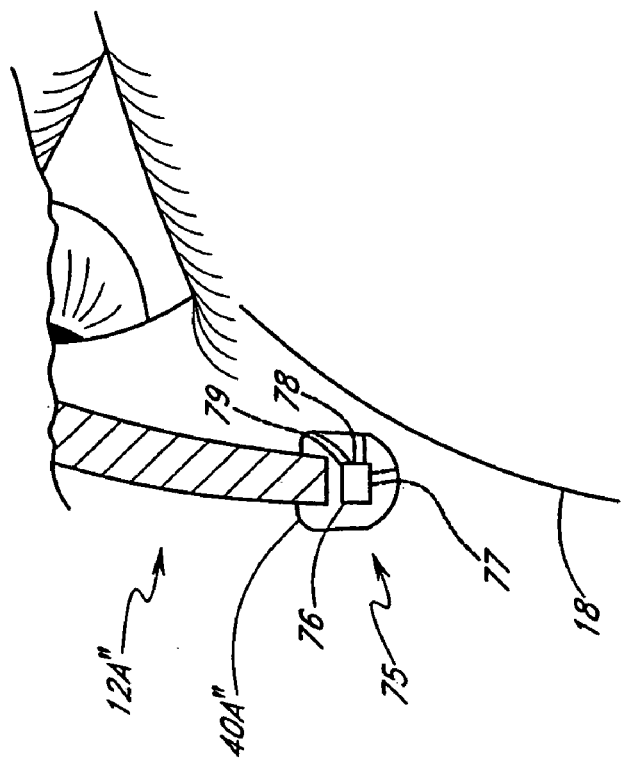
FIG. 4B is a schematic representation of a partial sectional and left side elevational view of the wearable audio device illustrated in FIG. 4A worn by a wearer.
Figure 4A:
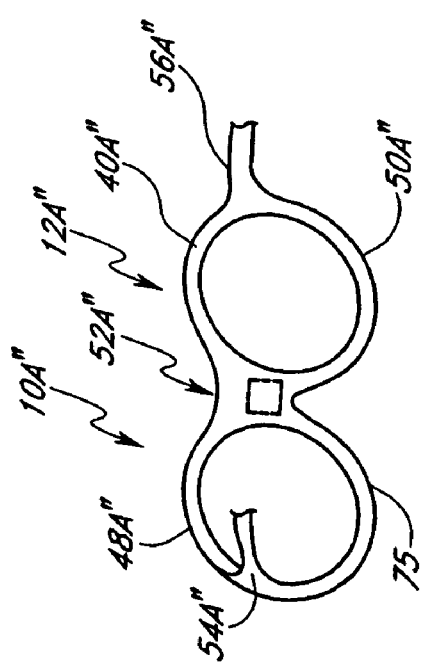
FIG. 4A is a schematic representation of a rear and left side perspective view of a further modification of the wearable audio devices illustrated in FIGS. 1, 2, and 3A-J.

With reference to FIGS. 4A-4B, a modification of the audio devices 10, 10A, 10A' is illustrated therein and referred to generally by the reference numeral 10A". The audio device 10A" can include the same components as the audio devices 10, 10A, 10A' except as noted below. Components of the audio device 10A" that are similar to corresponding components of the audio devices 10, 10A, 10A' are identified with the same reference numerals, except that a "''" has been added thereto.

The audio device 10A" is in the form of a eyeglass 12A" having a frame 40A". The audio device 10A" also includes at least one microphone 75. Advantageously, the microphone 75 is disposed so as to face toward the wearer.

FIG. 4B illustrates a partial cross-sectional view of the eyeglass 12A" on the head 18 of a wearer. The microphone 75 is schematically illustrated and includes a transducer unit 76. In the illustrated embodiment, the transducer 76 is disposed within the frame 40A" and at least one aperture 77 extends from the transducer unit 76 to the outer surface of the frame 40A". Alternatively, the transducer can be positioned so as to be exposed on the outer surface of the frame 40A".

Advantageously, the aperture 77 is disposed so as to face toward the head of the user 18. The illustrated aperture 77 faces downward and toward the head 18 of the wearer. By configuring the aperture to extend downwardly and toward the head 18, the aperture is disposed as close as possible to the mouth of the wearer while benefiting from the wind protection provided by positioning the aperture 77 on the portion of the frame 40A' facing toward the head 18.

Alternatively, the aperture can be positioned so as to extend generally horizontally from the transducer 76 to an outer surface of the frame 40A", this configuration being illustrated and identified by the numeral 78. By configuring the aperture 78 to extending generally horizontally toward the head 18, the aperture 78 is better protected from wind.

As another alternative, the aperture can be configured to extend upwardly from the transducer and toward the head 18, this configuration being identified by the numeral 79. By configuring the aperture 79 to extend upwardly from the transducer 76 and toward the head 18, the aperture 79 is further protected from wind which can cause noise. However, in this orientation, the aperture 79 is more likely to collect water that may inadvertently splash onto the aperture 79. Thus, the aperture configuration identified by the numeral 77 provides a further advantage in that water is less likely to enter the aperture 77. Any water that may enter the aperture 77 will drain therefrom due to gravity.

The microphone 75 can be disposed anywhere on the frame 40A', including the orbitals 48A", 50A", the bridge 52A", or the ear stems 54A", 56A". Optionally, the microphone 75 can be in the form of a bone conduction microphone. As such, the microphone 75 is disposed such that the when a user wears the audio device 10A', the microphone 75 is in contact with the user's head 18. For example, but without limitation, the microphone can be positioned anywhere on the anywhere on the frame 40A', including the orbitals 48A", 50A", the bridge 52A", or the ear stems 54A", 56A" such that the microphone contacts the user's head. More preferably, the microphone 75 is positioned such that it contacts a portion of the user's head 18 near a bone, such that vibrations generated from the user's voice and traveling through the bone, are conducted to the microphone. A bone conduction microphone may be built into a nosepad, or into each nosepad, for direct contact with the wearer. In another alternative, the microphone 75 can be configured to be inserted into the meatus 24 (FIG. 2) of the ear canal of the user. Thus, in this modification, the microphone 75 can be substituted for one of the speakers 14, 16. Alternatively, an ear-canal type bone conduction microphone can be combined with a speaker so as to provide two-way communication with the user through a single ear canal.

Further, the audio device 10A" can include noise cancellation electronics (not shown) configured to filter wind-generated noise from an audio signal transmitted from the microphone 75.

Figure 5A:
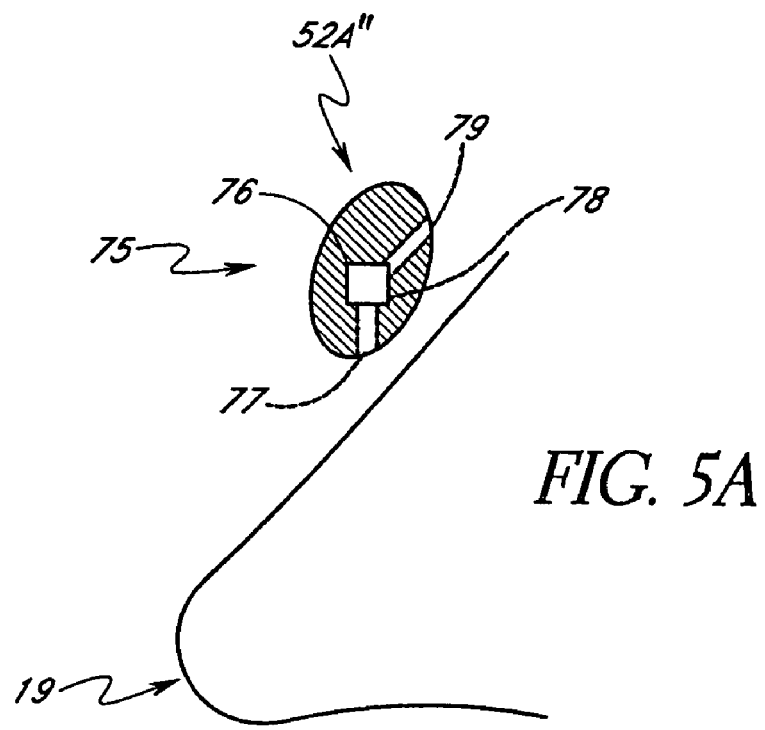
FIG. 5A is a partial sectional and side elevational view of a modification of the wearable audio device illustrated in FIG. 4A.

FIG. 5A illustrates a modification in which the microphone 75 is disposed on the bridge 52A". Similarly to the configuration illustrated in FIG. 4B, the bridge 52A" can include an aperture 77 which extends downwardly and toward the nose 19 of the wearer, horizontally extending aperture 78, or an upwardly extending aperture 79.

Figure 5B:
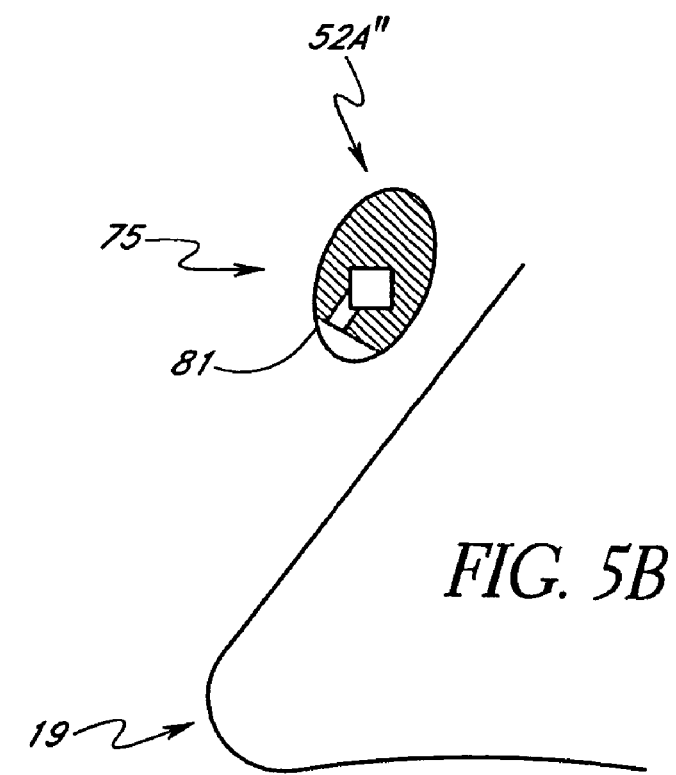
FIG. 5B is a partial sectional and side elevational view of a modification of the wearable audio device illustrated in FIG. 5A.

Alternatively, the microphone 75 can include a forwardly facing aperture, as illustrated in FIG. 5B, and a wind sock 81 disposed over the aperture. The wind sock 81 can be made in any known manner. For example, the wind sock 81 can be made from a shaped piece of expanded foam. Configuring the bridge portion 52A' as such is particularly advantageous because the bridge portion of an eyeglass is typically somewhat bulbous. A wind sock can be shaped complementarily to the bridge portion 52A'. Thus, the sock 81 can be made so as to appear to be part of a normal bridge portion of an eyeglass.

The audio device 10A" can include electrical conduits extending through the frame 40A" to an audio output jack (not shown). The audio output jack can be disposed at the end of the ear stems 54A", 56A", or anywhere else on the frame 40A". Thus, a user can wear the audio device 10A' and use the microphone 75 in order to transform the voice of the wearer or other sounds into an electrical signal. The electrical signal can be transmitted to another audio device, such as a palm top computer, a laptop computer, a digital or analog audio recorder, a cell phone, and the like. Additionally, the audio device 10A" can include speakers, such as the speakers 14A", 16A" illustrated in FIG. 3A. As such, the audio device 10A" can be configured to provide two-way audio for the wearer, e.g., audio input being transmitted to the user through the speakers 14A", 16A", and audio output being transmitted from the wearer, through the microphone 75, and out through the audio output jack. As such, a user can use the audio device 10A" for two-way audio communication in a comfortable manner.

Figure 6:
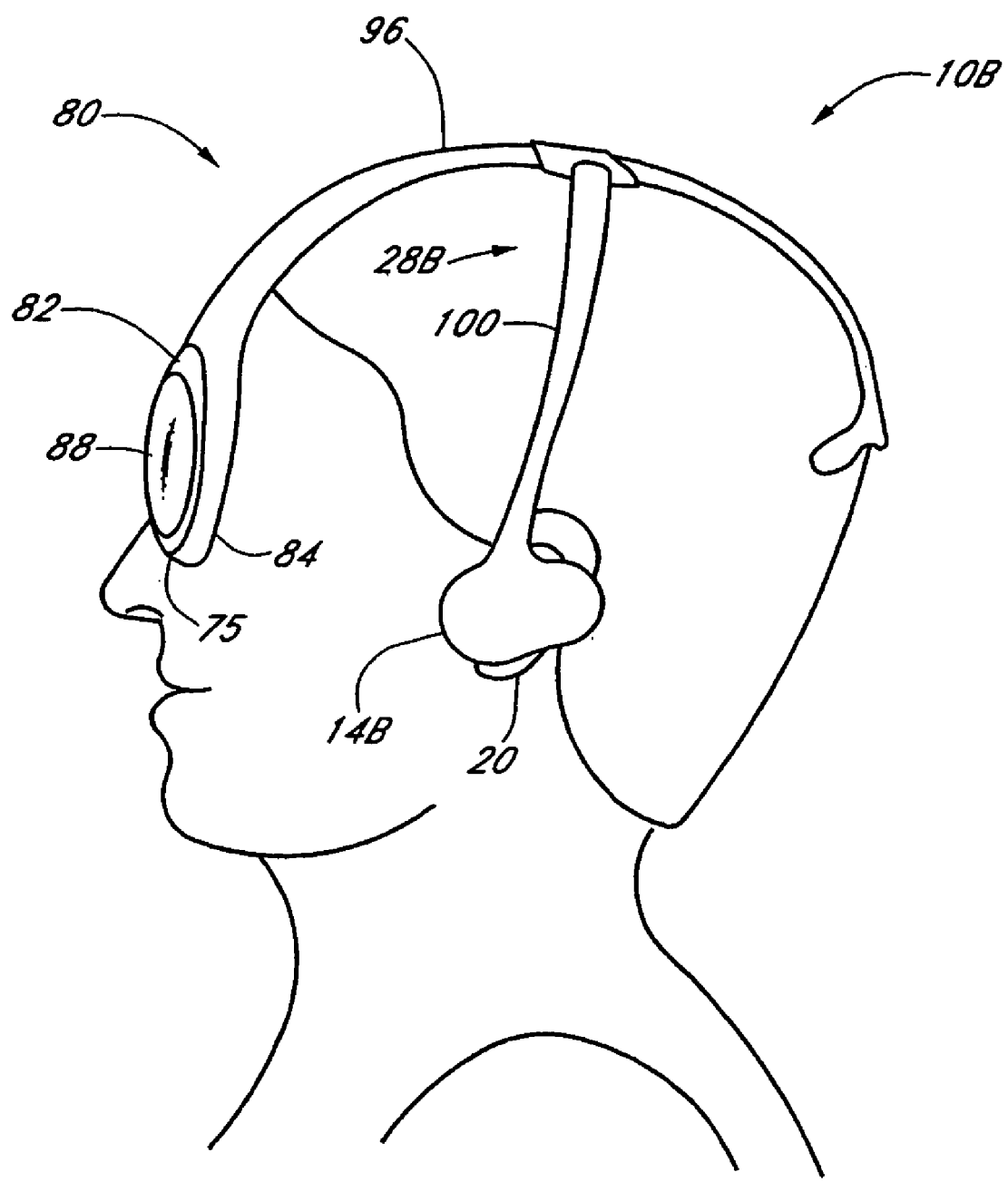
FIG. 6 is a left side elevational view of a modification of the audio device illustrated in FIGS. 3-5 worn on the head of a user.
Figure 7:
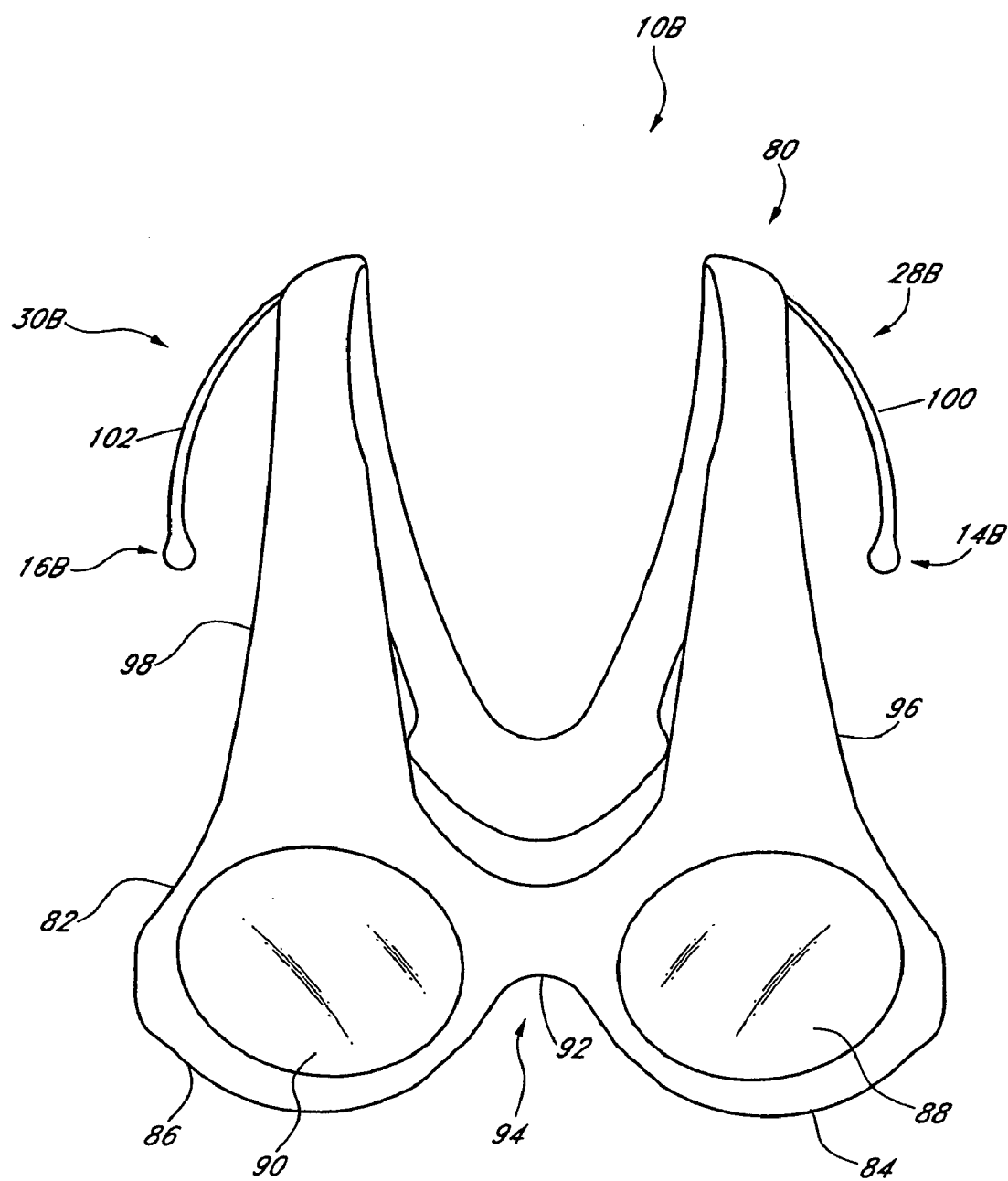
FIG. 7 is a front elevational view of the audio device illustrated in FIG. 6.

With reference to FIGS. 6 and 7, a modification of the audio devices 10, 10A, 10A', 10A" is illustrated therein and referred to generally by the reference numeral 10B. Components of the audio device 10B corresponding to components of the audio devices 10, 10A, 10A', 10A" are identified with the same reference numerals, except that letter "C" has been added thereto.

The audio device 10B is in the form of an eyeglass 80. The eyeglass 80 includes a frame 82. The frame 82 includes left and right orbitals 84, 86. Each of the orbitals 84, 86 support a lens 88, 90. The frame 82 also includes a bridge portion 92. Similarly to the bridge portion 52 of the audio device 10A, the bridge portion 92 connects the orbitals 84, 86. Additionally, the bridge portion 92 defines an open space 94 configured to receive the nose 19 of a wearer. The inner sides of the orbitals 84, 86 and/or the bridge portion 92 is configured to support the frames 82 on the nose of a user.

The eyeglass 80 also includes support stems 96, 98 extending from the upper portions of the orbitals 84, 86 toward a posterior of a wearer's head. In the illustrated embodiment, the stems 96, 98 extend along an upper surface of the wearer's head. Thus, the stems 96, 98, along with the bridge portion 92, support the eyeglass 80 on the wearer's head 18. The support members 28B, 30B are comprised of support arms 100, 102.

With reference to FIGS. 5, 6 and 7, the support arms 100, 102 extend downwardly from the stems 96, 98, respectively. In the illustrated embodiment, the support arms 100, 102 extend in an "L" shape. In particular, the support arm 100 extends from the stem 96 to a point just forward (anterior) from the tragus of the user's ear 20. From this point, the support arm 100 extends rearwardly so as to support the speaker 14B at a position juxtaposed and spaced from the ear 20. Preferably, the speaker 14B is maintained in a position from about 2 mm to 3 cm from the tragus of the ear 20. Similarly to the audio device 10A, the audio device 10B can include an audio input through a wired arrangement or through a wireless transceiver.

Figure 8:
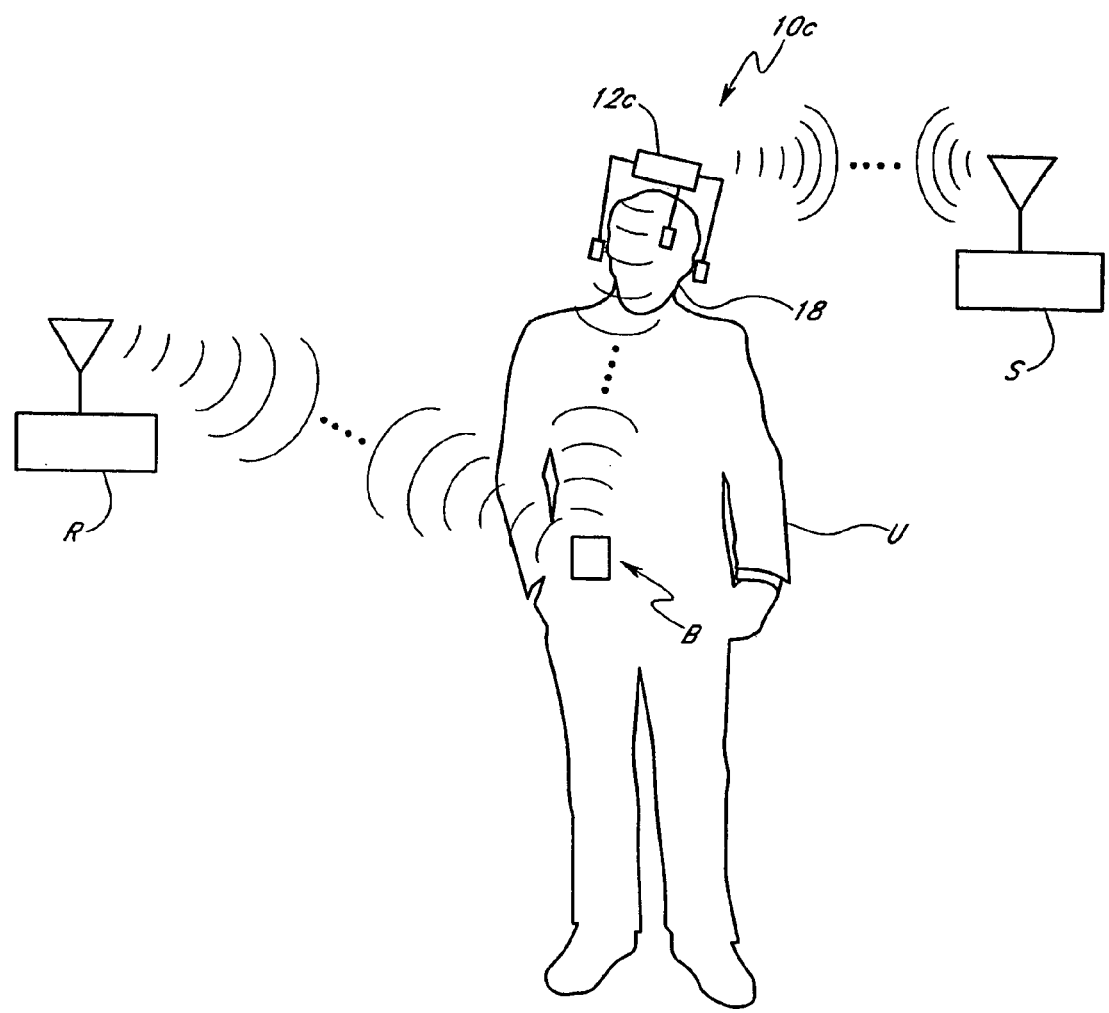
FIG. 8 is a schematic representation of a front elevational view of a further modification of the audio device illustrated in FIGS. 1 and 2 worn by a wearer and interacting with source electronics.
Figure 9A:
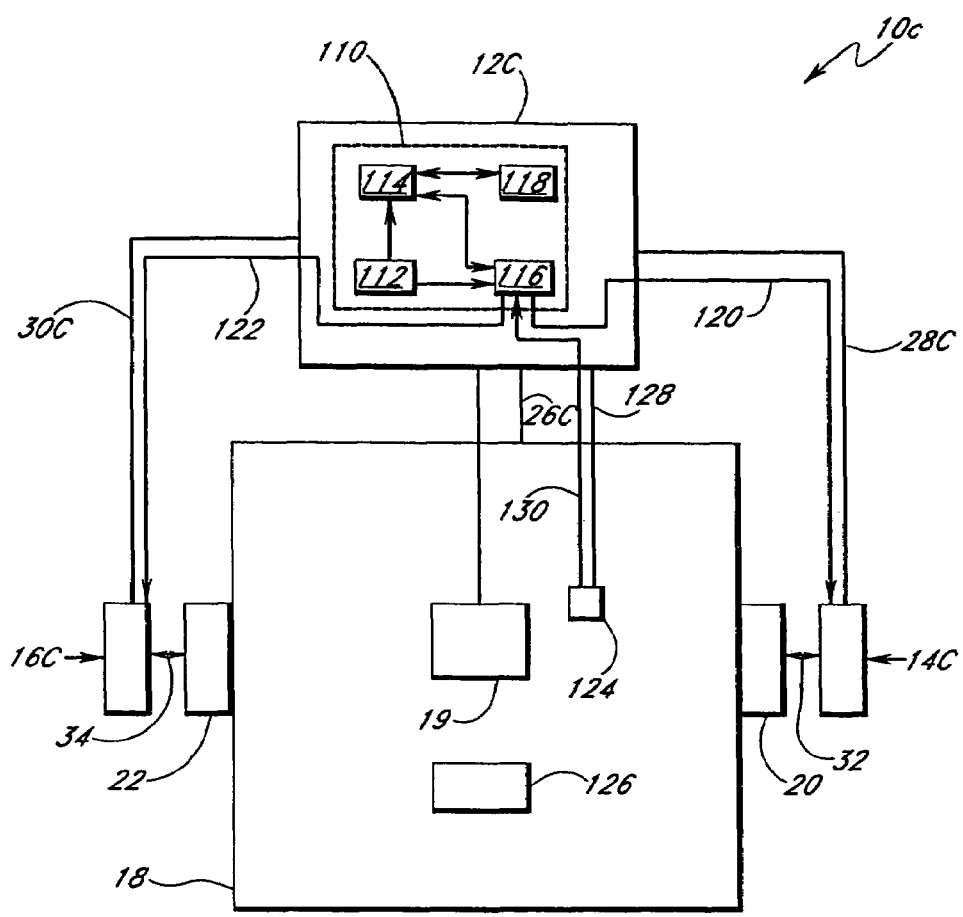
FIG. 9A is an enlarged schematic representation of a front elevational view of the audio device illustrated in FIG. 8.
Figure 9B:
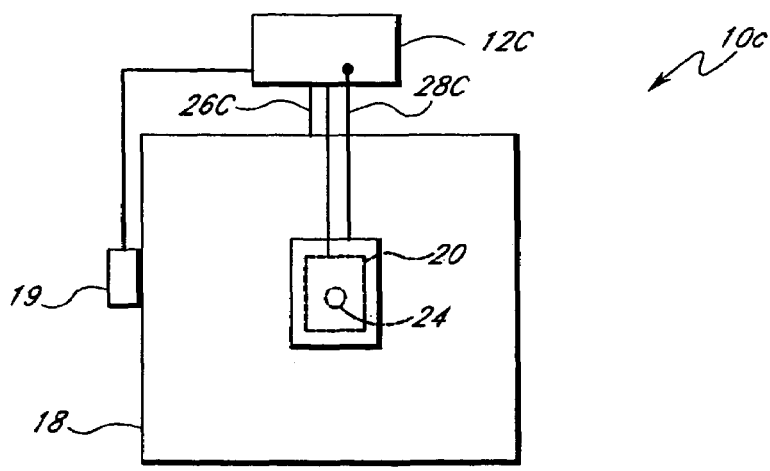
FIG. 9B is a schematic representation of a left side elevational view of the audio device illustrated in FIG. 9A.

With reference to FIGS. 8, 9A, and 9B, another modification of the audio device 10 is illustrated therein and referred to generally by the reference numeral 10C. Similar components of the audio device 10C have been given the same reference numerals, except that that a "C" has been added thereto.

As illustrated in FIG. 8, the audio device 10C can be worn on the head 18 of a user U. Preferably, the audio device 10C is configured to provide one or two-way wireless communication with a source device, or the source device can be incorporated into the audio device 10C. The source device can be carried by the user U, mounted to a moveable object, stationary, or part of a local area or personal area network.

The user U can carry a "body borne" source device B such as, for example, but without limitation, a cellular phone, an MP3 player, a "two-way" radio, a palmtop computer, or a laptop computer. As such, the user U can use the audio device 10C to receive and listen to audio signals from the source device B, and/or transmit audio signals to the source device B. Optionally, the audio device 10C can also be configured to transmit and receive data signals to and from the source device B, described in greater detail below.

Optionally, the device B can also be configured to communicate, via long or short range wireless networking protocols, with a remote source R. The remote source R can be, for example, but without limitation, a cellular phone service provider, a satellite radio provider, or a wireless internet service provider. For example, but without limitation, the source device B can be configured to communicate with other wireless data networks such as via, for example, but without limitation, long-range packet-switched network protocols including PCS, GSM, and GPRS. As such, the audio device 10C can be used as an audio interface for the source device B. For example, but without limitation, where the source device B is a cellular phone, the user U can listen to the audio output of the cellular phone, such as the voice of a caller, through sound transducers in the audio device 10C. Optionally, the user U can send voice signals or commands to the cellular phone by speaking into a microphone on the audio device 10C, described in greater detail below. Thus, the audio device 10C may advantageously be a receiver and/or a transmitter for telecommunications.

In general, the component configuration of FIG. 8 enables the audio device 10C to carry interface electronics with the user, such as audio output and audio input. However, the source electronics such as the MP3 player, cellular phone, computer or the like may be off board, or located remotely from the audio device 10C. This enables the audio device 10C to accomplish complex electronic functions, while retaining a sleek, low weight configuration. Thus, the audio device 10C is in communication with the off board source electronics device B. The off board source device B may be located anywhere within the working range of the audio device 10C. In many applications, the source electronics B will be carried by the wearer, such as on a belt clip, pocket, purse, backpack, shoe, integrated with "smart" clothing, or the like. This accomplishes the function of off loading the bulk and weight of the source electronics from the headset.

The source electronics B may also be located within a short range of the wearer, such as within the room or same building. For example, personnel in an office building or factory may remain in contact with each, and with the cellular telephone system, internet or the like by positioning transmitter/receiver antenna for the off board electronics B throughout the hallways or rooms of the building. In shorter range, or personal applications, the out board electronics B may be the form of a desktop unit, or other device adapted for positioning within relatively short (e.g. no greater than about 10 feet, no greater than about 20 feet, no greater than about 50 feet, no greater than 100 feet) of the user during the normal use activities.

In all of the foregoing constructions of the invention, the off board electronics B may communicate remotely with the remote source R. Source R may be the cellular telephone network, or other remote source. In this manner, the driver electronics may be off loaded from the headset, to reduce bulk, weight and power consumption characteristics. The headset may nonetheless communicate with a remote source R, by relaying the signal through the off board electronics B with or without modification.

Optionally, the audio device 10C can be configured to provide one or two-way communication with a stationary source device S. The stationary source device can be, for example, but without limitation, a cellular phone mounted in an automobile, a computer, or a local area network.

With reference to FIGS. 9A and 9B, the audio device 10C preferably comprises a wearable wireless audio interface device which includes a support 12C supported on the head 18 of a user by the support 26C and includes an interface device 110. The interface device 110 includes a power source 112, a transceiver 114, an interface 116, and an antenna 118.

The power source 112 can be in the form of disposable or rechargeable batteries. Optionally, the power source 112 can be in the form of solar panels and a power regulator.

The transceiver 114 can be in the form of a digital wireless transceiver for one-way or two-way communication. For example, the transceiver 114 can be a transceiver used in known wireless networking devices that operate under the standards of 802.11a, 802.11b, or preferably, the standard that has become known as BLUETOOTH™. As illustrated in BLUETOOTH™-related publications discussed below, the BLUETOOTH™ standard advantageously provides low-cost, low-power, and wireless links using a short-range, radio-based technology. Systems that employ the BLUETOOTH™ standard and similar systems advantageously allow creation of a short-range, wireless "personal area network" by using small radio transmitters. Consequently, with BLUETOOTH™-enabled systems and similar systems, components within these systems may communicate wirelessly via a personal area network. Personal area networks advantageously may include voice/data, may include voice over data, may include digital and analogue communication, and may provide wireless connectivity to source electronics. Personal area networks may advantageously have a range of about 30 feet; however, longer or shorter ranges are possible. The antenna 118 can be in the form of an onboard antenna integral with the transceiver 114 or an antenna external to the transceiver 114. In another implementation, the transceiver 114 can support data speeds of up to 721 kilo-bits per second as well as three voice channels.

In one implementation, the transceiver 114 can operate at least two power levels: a lower power level that covers a range of about ten yards and a higher power level. The higher level covers a range of about one hundred yards, can function even in very noisy radio environments, and can be audible under severe conditions. The transceiver 114 can advantageously limit its output with reference to system requirements. For example, without limitation, if the source electronics B is only a short distance from audio device 10C, the transceiver 114 modifies its signal to be suitable for the distance. In another implementation, the transceiver 114 can switch to a low-power mode when traffic volume becomes low or stops.

The interface 116 can be configured to receive signals from the transceiver 114 that are in the form of digital or analog audio signals. The interface 116 can then send the audio signals to the speakers 14C, 16C through speaker lines 120, 122, respectively, discussed in greater detail below.

Optionally, the audio device 10C can include a microphone 124. Preferably, the support 12C is configured to support the microphone 124 in the vicinity of a mouth 126 of a user. As such, the support 12C includes a support member 128 supporting the microphone 124 in the vicinity of the mouth 126.

The microphone 124 is connected to the interface 116 through a microphone line 130. Thus, the transceiver 114 can receive audio signals from the microphone 124 through the interface 116. As such, the audio device 10C can wirelessly interact with an interactive audio device, such as a cellular phone, cordless phone, or a computer which responds to voice commands. The microphone 124 can also be in any of the forms discussed above with reference to the microphone 75.

As noted above with reference to the audio device 10 in FIGS. 1 and 2, by configuring the support 12C to support the speakers 14C, 16C in a position juxtaposed and spaced from the ears 20, 22 of the head 18, the audio device 10C provides enhanced comfort for a user.

Figure 10:
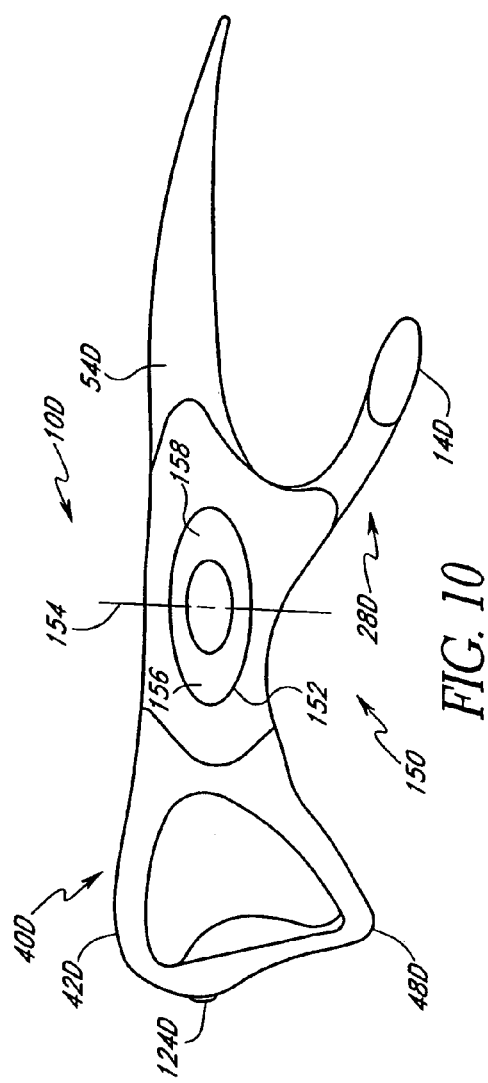
FIG. 10 is a schematic left side elevational view of a modification of the audio device illustrated in FIGS. 8 and 9A, B.
Figure 11:
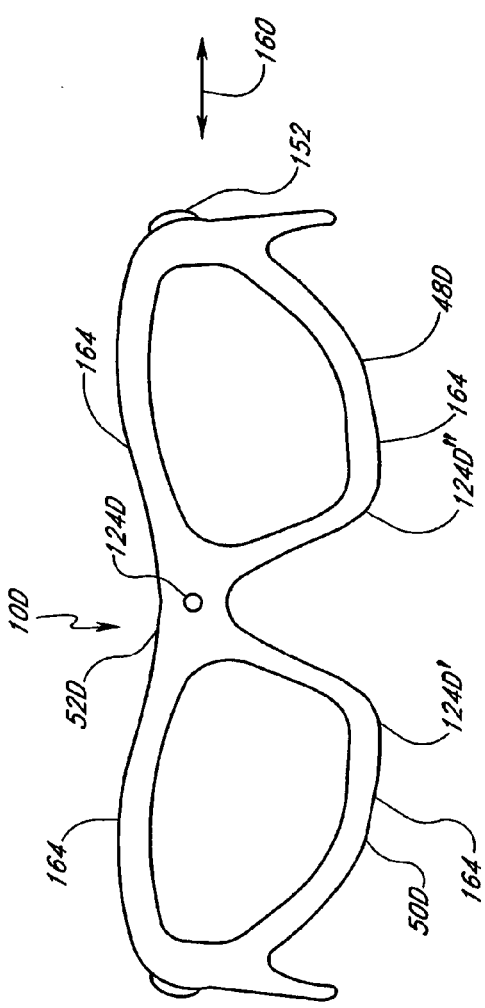
FIG. 11 is a front elevational view of the audio device illustrated in FIG. 10.
Figure 12:
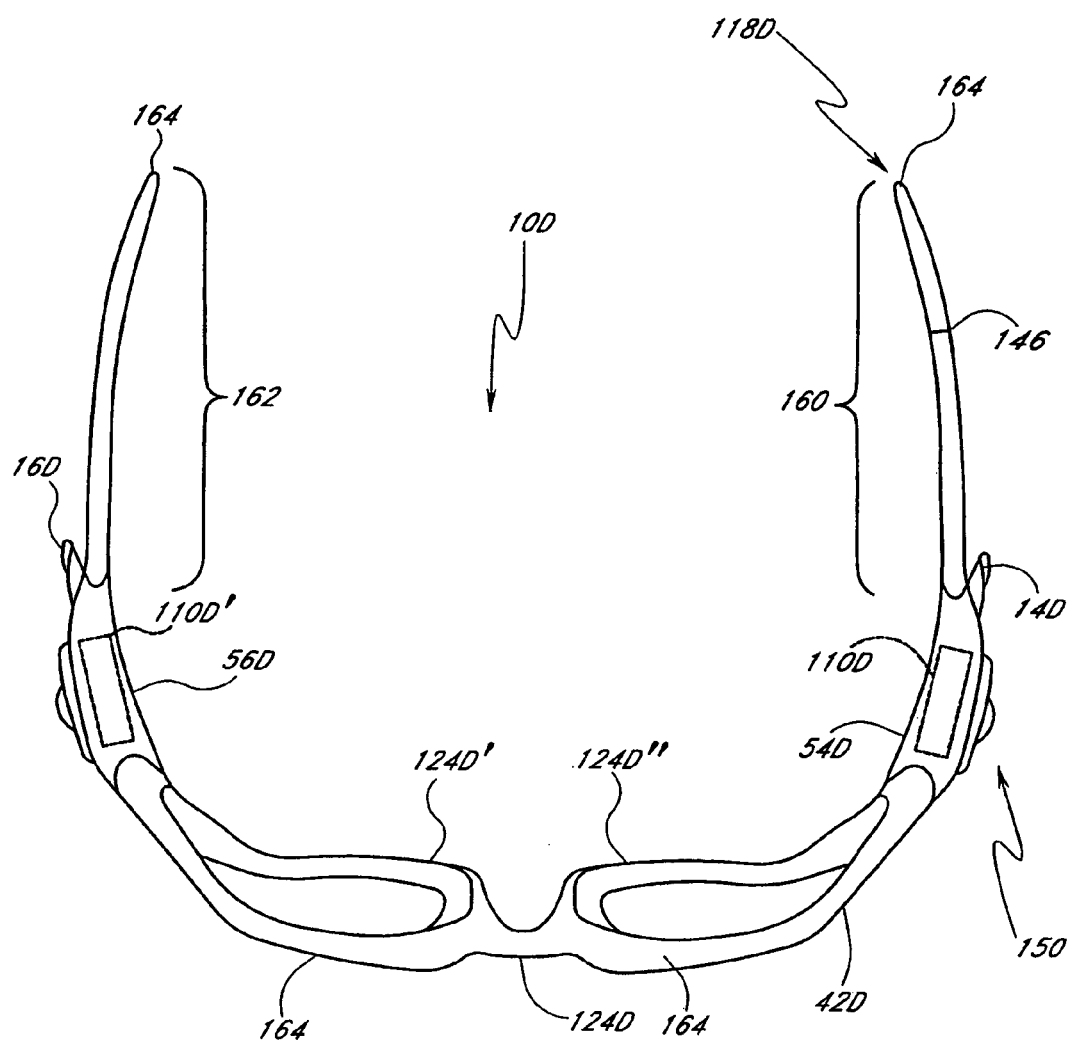
FIG. 12 is a top plan view of the audio device illustrated in FIG. 10.

With reference to FIGS. 10-12, a modification of the audio device 10C is illustrated therein and identified generally by the reference numeral 10D. The components of the audio device 10D which are the same as the components in the audio devices 10, 10A, 10B, and 10C are identified with the same reference numerals, except that a letter "D" has been added.

In the audio device 10D, the microphone 124D can be disposed in the frame 42D. In particular, the microphone 124D can be disposed in the bridge portion 52D. Alternatively, the microphone 124D can be disposed along a lower edge of the right orbital 50D, this position being identified by the reference numeral 124D'. Further, the microphone could be positioned in a lower edge of the left orbital 48D, this position being identified by the reference numeral 124D". Optionally, two microphones can be disposed on the frame 42D at both the positions 124D' and 124D". Similarly to the microphone 75, the microphones 124D', 124D" preferably are positioned so as to face toward the user. Thus, the microphones 124D', 124D" can be protected from wind and noise. The microphones 124D,124D',124D" can also be constructed in accordance with any of the forms of the microphone 75 discussed above with reference to FIGS. 4A, 4B, 5A, 5B.

With reference to FIG. 12, the interface device 110D can be disposed in one of the ear stems 54D, 56D. Optionally, the components of the interface device 110D can be divided with some of the components being in the ear stem 54D and the remaining components in the ear stem 56D, these components being identified by the reference numeral 110D'. Preferably, the components are distributed between the ear stems 54D, 56D so as to provide balance to the device 10D. This is particularly advantageous because imbalanced headwear can cause muscle pain and/or headaches. Thus, by distributing components of the interface device 110D between the ear stems 54D, 56D, the device 10D can be better balanced.

In one arrangement, the transceiver 114, interface 116, and the antenna 118 can be disposed in the left ear stem 54D with the battery 112 being disposed in the right ear stem 56D. This arrangement is advantageous because there are numerous standard battery sizes widely available. Thus, the devices within the ear stem 54D can be balanced with the appropriate number and size of commercially available batteries disposed in the ear stem 56D.

In another arrangement, the lenses 44D, 46D can include an electronic variable light attenuation feature, such as, for example, but without limitation, a dichroic dye guest-host device. Additionally, another user operable switch (not shown) can be disposed in the ear stem 56D. Such a user operable switch can be used to control the orientation, and thus the light attenuation provided by, the dichroic dye.

Optionally, a further power source (not shown) for the dichroic dye guest-host device can also be disposed in the ear stem 56D. For example, the rear portion 162 of ear stem 56D can comprise a removable battery. Such a battery can provide a power source for controlling the orientation of the dichroic dye in the lenses 44D, 46D. In this modification, the additional user operable switch disposed in the ear stem 56D can be used to control the power from the battery supplied to the lenses 44D, 46D.

The appropriate length for the antenna 118D is determined by the working frequency range of the transceiver 114. Typically, an antenna can be approximately 0.25 of the wave length of the signal being transmitted and/or received. In one illustrative non-limiting embodiment, such as in the BLUETOOTH™ standard, the frequency range is from about 2.0 gigahertz to 2.43 gigahertz. For such a frequency range, an antenna can be made with a length of approximately 0.25 of the wavelength. Thus, for this frequency range, the antenna can be approximately 1 inch long.

With reference to FIG. 12, the antenna can be formed at a terminal end of one of the ear stems 54D, 56D. In the illustrated embodiment, the antenna 118D is disposed at the terminal end of the left ear stem 54D.

In this embodiment, approximately the last inch of the ear stem 54D is used for the antenna 118D. The antenna 118D can be made of any appropriate metal. The antenna can be connected to the transceiver 114 with a direct electrical connection, an inductive connection, or a capacitive connection.

Figure 13:
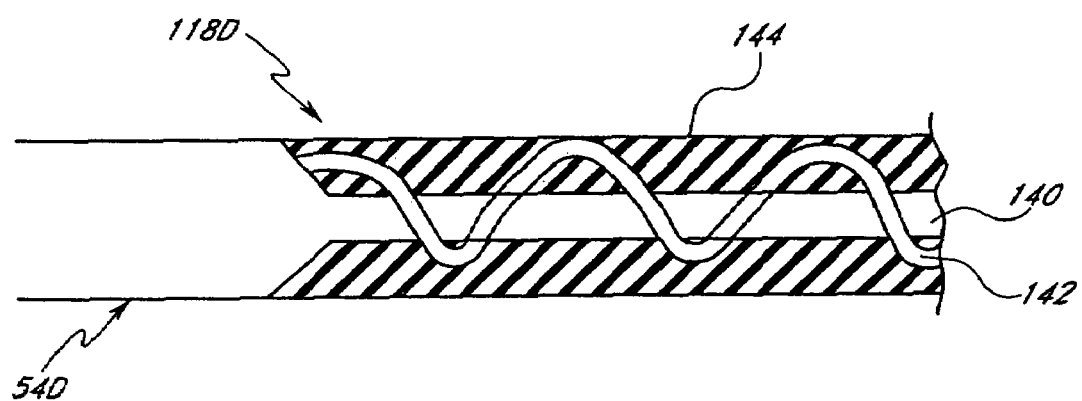
FIG. 13 is a schematic representation of a partial cross-sectional view of a portion of any of the audio devices illustrated in FIGS. 1-12.

With reference to FIG. 13, an inductive type connection is illustrated therein. As shown in FIG. 13, the antenna 118D comprises an inner conductive rod 140 and a coil 142 wrapped helically around the rod 140. The coil 142 is connected to the transceiver 114 in a known manner.

The ear stems 54D, 56D can be made from a conductive metal material. Where metal is used, near the terminal end of the ear stem 54D, the metal material is reduced relative to the outer surface of the stem 54D. The coil member is wrapped around the rod 140 and an insulative material 144 is disposed over the coil 142 so as to be substantially flush with the remainder of the ear stem 54D. Thus, the smooth outer appearance of the ear stem 54D is maintained, without comprising the efficiency of the antenna 118D.

Figure 14:
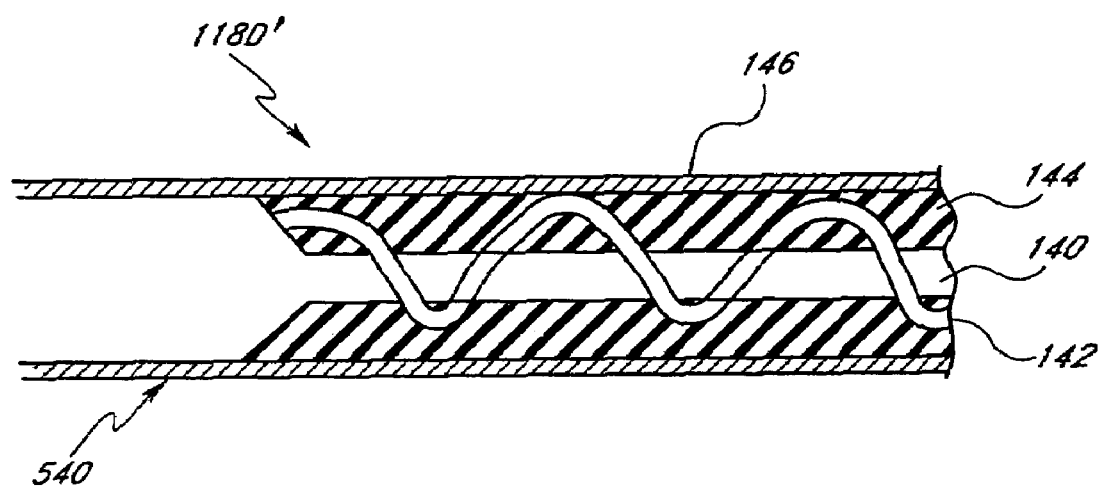
FIG. 14 is a schematic representation of a partial cross-sectional view of a modification of the portion illustrated in FIG. 13.

With reference to FIG. 14, a modification of the antenna 118D is illustrated therein and identified by the reference numeral 118D'. Components of the antenna 118D' which were the same as the antenna 118D illustrated in FIG. 13, have been given the same reference numeral, except that a "'" has been added.

The antenna 118D' and the stem 54D includes a thin outer layer 146 of a metal material. As known in the antenna arts, it is possible to dispose a thin layer of metal over an antenna without destroying the antenna's ability to transmit and receive signals. This design is advantageous because if the device 10D is constructed of a metal material, including metal such as, for example, without limitation, sintered titanium or magnesium, the thin outer layer 146 can be formed of this material so that the appearance of the device 10D is uniform.

Where the stem 54D is made from a metal material, the antennas 118D, 118D' illustrated in FIGS. 13 and 14 provide an additional advantage in that electrons in the ear stem 54D can be excited by the signal applied to the coil 142. Thus, the ear stem 54D itself becomes part of the antenna 118D, 118D', and thus can provide better range and/or efficiency for the transmission and reception of signals. Furthermore, if the ear stem 54D is electrically coupled to the frame 42D, the frame 42D would also become excited in phase with the excitations of the antenna 118D, 118D'. Thus, the ear stem 54D and the frame 42D would effectively become part of the antenna, thereby allowing transmission and reception from two sides of the head of the user.

Optionally, the ear stem 56D could also be electrically coupled to the frame 42D. Thus, the stem 56D would also become part of the antenna 118D, 118D', thereby allowing transmission and reception of signals on three sides of the user's head. Thus, where at least a portion of a frame of an eyeglass is used as the antenna for the wireless transceiver 114, the audio device benefits from enhanced antenna efficiency.

Optionally, the antenna 118D, 118D' can be isolated from the remainder of the stem 54D via an insulator 146, thereby preventing interference between the antenna and other devices on the audio device 10D. As such, the remainder of the device 10D can be made from any material, such as, for example, but without limitation, a polymer.

Preferably, the audio device 10D includes a user interface device 150 configured to transmit user input signals to the interface 116 and/or the transceiver 114. In the illustrated embodiment, the user interface device 150 is in the form of a 3-way button. The 3-way button 152 is configured to have three modes of operation. Firstly, the button 152 is mounted to pivot about a rocker axis 154. Thus, in one mode of operation, the button 152 can be depressed inwardly on a forward end 156 of the button 152, thereby causing the button 152 to pivot or "rock" about the pivot axis 154. Additionally, the button 152 can be pressed at a rearward end 158, thereby causing the button 152 to pivot about the pivot axis 154 in the opposite direction. Additionally, the button 152 can be mounted so as to be translatable in the medial-lateral direction, identified by the reference numeral 160 (FIG. 11). Appropriate springs can be provided beneath the button 152 to bias the button in an outward protruding and balanced position. Appropriate contacts can be mounted beneath the button 152 so as to be activated individually according to the modes of operation.

In one illustrative and non-limiting embodiment, the button 152 can be used to control volume. For example, by pressing on the forward portion 156, a contact can be made causing the transceiver 114 or the interface 116 to increase the volume of the speakers 14D, 16D. Additionally, by pressing on the rearward portion 158 of the button 152, the transceiver 114 or interface 116 could lower the volume of the speakers 14D, 16D.

In a further illustrative and non-limiting example, the medial-lateral movement of the button 152, along the directions identified by the arrow 160, can be used to choose different functions performed by the transceiver 114 or the interface 116. For example, an inward movement of the button 152 could be used to answer an incoming phone call where the audio device 10D is used as an audio interface for a cellular phone.

Optionally, the power source 112 can comprise portions of the ear stems 54D, 56D which have been formed into batteries. For example, the rear portions 160, 162 of the ear stems 54D, 56D, respectively, can be in the form of custom made batteries, either disposable or rechargeable. Preferably, the rear portions 160, 162 are removable from the forward portions of the ear stems 54D, 56D. This provides a particular advantage in terms of balance. As noted above, imbalanced loads on the head can cause muscular pain and/or headaches. In particular, excessive pressure on the nose can cause severe headaches. Additionally, batteries can have a significantly higher mass density than plastic and lightweight metals, such as sintered titanium or magnesium. Thus, by constructing the rearward portions 160, 162 of the ear stems 54D, 56D of batteries, the weight of these batteries can improve forward-rearward balance of the audio device 10D in that the weight of the interface device 110 can be offset by the batteries. In another embodiment, the ear stems 54D, 56D can define a housing for removable batteries.

The audio device 10D can also include power contacts 164 for recharging any rechargeable batteries connected thereto. For example, the power contacts 164 can be disposed on a lower edge of the orbitals 48D, 50D. Thus, with an appropriate recharging cradle (not shown), the audio device 10D can be laid on the cradle, thereby making contact between the power contacts 164 and corresponding contacts in the cradle (not shown). Alternatively, power contacts can be provided in numerous other locations as desired. For example, the power contacts 164 can be disposed at the ends of the ear stems 54D, 56D. A corresponding cradle can include two vertically oriented holes into which the ear stems are inserted for recharging. In this configuration, the lens within the orbitals 48D, 50D would face directly upwardly.

In another alternative, the power contacts 164 are disposed on the upper edges of the orbitals 48D, 50D. In this configuration, the audio device 10D is laid in a cradle in an inverted position, such that the contacts 164 make electrical contact with corresponding contacts in the cradle. This position is advantageous because it prevents weight from being applied to the supports 28D, 30D. This prevents misalignment of the speakers 14D, 16D.

With reference to FIGS. 8, 9A, and 9B, in another embodiment, the audio device 10C is advantageously adapted to support any of a variety of portable electronic circuitry or devices which have previously been difficult to incorporate into conventional headsets due to bulk, weight or other considerations. For example, but without limitation, the electronics are digital or other storage devices and retrieval circuitry such as for retrieving music or other information from MP3 format memory or other memory devices. The audio device 10C can carry any of a variety of receivers and/or transmitters, such as transceiver 114. For example, but without limitation, the audio device 10C can carry receivers and/or transmitters for music or for global positioning. In another example, the audio device 10C can carry receivers and/or transmitters for telecommunications (e.g., telecommunications devices). As used herein, the term "telecommunications devices" is intended to include telephone components as well as devices for communicating with a telephone. For example, "telecommunications devices" can include one or more transceivers for transmitting an audio signal to a cellular phone to be transmitted by the cellular phone as the speaker's voice, and/or for receiving an audio signal from a cellular phone representing a caller's voice. Of course, other audio, video, or data signals can be transmitted between the audio device 10C and such a cellular phone through such transceivers.

In other embodiments, drivers and other electronics for driving heads-up displays, such as liquid crystal displays or other miniature display technology can also be carried by the audio device 10C. The power source 112 can be carried by the audio device 10C. For example, without limitation, the power source 112 can advantageously be replaceable or rechargeable. Other electronics or mechanical components can additionally be carried by the audio device 10C. In other embodiments, the audio device 10C can also be utilized solely to support any of the foregoing or other electronics components or systems, without also supporting one or more lenses in the wearer's field of view. Thus, in any of the embodiments of the audio devices disclosed herein, the lenses and/or lens orbitals can be omitted as will be apparent to those of skill in the art in view of the disclosure herein.

In another embodiment, a further modification of the audio devices 10, 10A, 10B, 10C, and 10D is provided wherein the audio devices include at least two banks of microphones, with one bank acting as a speaker of received and one bank providing an ambient noise-cancellation function. The microphone banks can be positioned at any suitable location or combination of locations (e.g., on the audio device, within the audio device, opposing sides of the audio device, or the like). In one embodiment, automatic switching of the speaking-microphone and noise-canceling-microphone banks' functions advantageously enhances ease of use. In a further embodiment, the microphone banks can be arranged in an array to be used in conjunction with algorithms to discern, reduce, and/or eliminate noise for the purpose of voice recognition. For example, in one embodiment, such microphone banks can include ASIC-based noise-canceling technology, such as is available in chips from Andrea Electronics Corporation (AEC), to enable voice recognition in ambient noise up to about 130 Db or more. In another embodiment, microphone banks can be arranged in any suitable combination of linear or non-linear arrays to be used in conjunction with algorithms to discern, reduce, and/or eliminate noise in any suitable manner. In another embodiment, audio/proximity sensors can advantageously trigger the appropriate functionality in a specific bank. In another embodiment, a noise-canceling microphone can be provided in connection with a cord or other microphones described above. For example, without limitation, a series of miniature microphones can be supported down a cord from the audio device, separated by desired distances, and aimed in different directions. In another implementation, one or more of the microphones can be for verbal input from the user, and one or more others of the microphones, or the same microphone, can also be for noise-cancellation purposes.

With reference to FIGS. 8, 9A, and 9B, in another embodiment, the transceiver 114 is adapted to employ a wide variety of technologies, including wireless communication such as RF, IR, ultrasonic, laser or optical, as well as wired and other communications technologies. In one embodiment, a body-LAN radio is employed. Other embodiments can employ a flexible-circuit design. Many commercially available devices can be used as transceiver 114. For example, without limitation, Texas Instruments, National Semiconductor, Motorola manufacture and develop single RF transceiver chips, which can use, for example, 0.18 micron, 1.8 V power technologies and 2.4 GHz transmission capabilities. Of course, a variety of transceiver specifications are available and usable, depending on the particular embodiment envisioned. In another implementation, other commercially available products operating at 900 MHz to 1.9 GHz or more can be used. Data rates for information transfer to wearable or other type computing devices will vary with each possible design. In a preferred implementation, a data rate is sufficient for text display. RF products, and other products, ultimately will be capable of updating a full-color display and have additional capabilities as well. Thus, heads-up displays, such as liquid crystal displays or other miniature display technology described above can be employed.

In another embodiment, a further modification of the audio devices 10, 10A, 10B, 10C, and 10D is provided wherein the audio devices can include and/or communicate with a variety of sensors, including but not limited to motion, radar, heat, light, smoke, air-quality, oxygen, CO and distance. Medical monitoring sensors are also contemplated. Sensors can be directed inwardly toward the user's body, or outwardly away from the body (e.g., sensing the surrounding environment). Sensors in communication with the audio devices also can be strategically positioned or left behind to facilitate the communication of sensed information. For example, a firefighter entering a burning building can position sensor to communicate the smoke and heat conditions to that firefighter and to others at the sensor-drop location. Remote sensors can also be relatively fixed in position, as in the case of a maintenance worker wearing an audio device that receives various signals from sensors located in machines or other equipment for which the worker is responsible. A blind wearer of audio device can employ a distance sensor to determine distance to surrounding objects, for example, or a GPS unit for direction-finding. Other exemplary sensing capabilities are disclosed on one or more of the following, all of which are incorporated by reference herein: U.S. Pat. No. 5,285,398 to Janik, issued Feb. 9, 1994; U.S. Pat. No. 5,491,651 to Janik, issued Feb. 13, 1996; U.S. Pat. No. 5,798,907 to Janik, issued Aug. 25, 1998; U.S. Pat. No. 5,581,492 to Janik, issued Dec. 3, 1996; U.S. Pat. No. 5,555,490 to Carroll, issued Sep. 10, 1996; and U.S. Pat. No. 5,572,401 to Carroll, issued Nov. 5, 1996.

Figure 15:
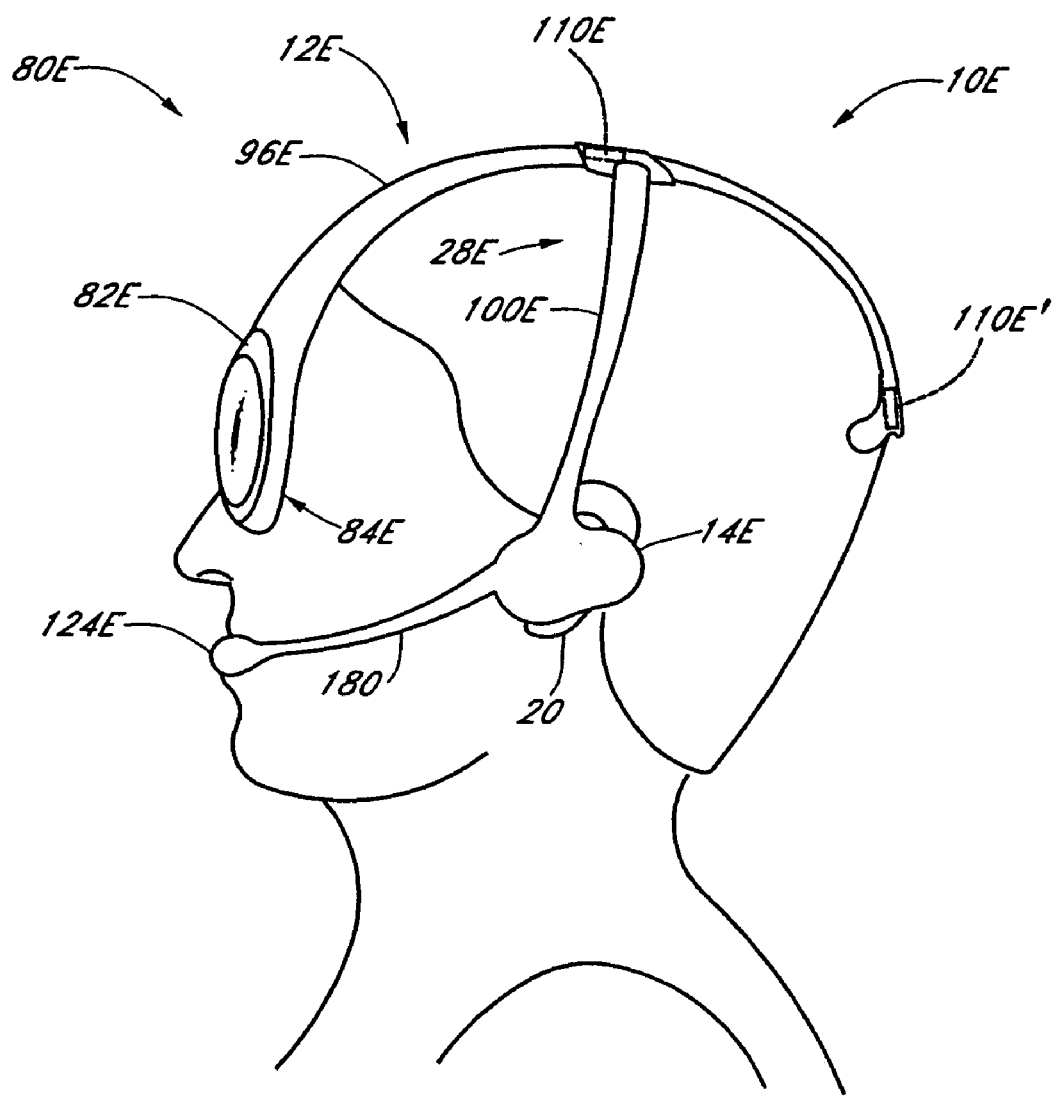
FIG. 15 is a left side elevational view of a modification of the audio devices illustrated in FIGS. 8-12.
Figure 16:
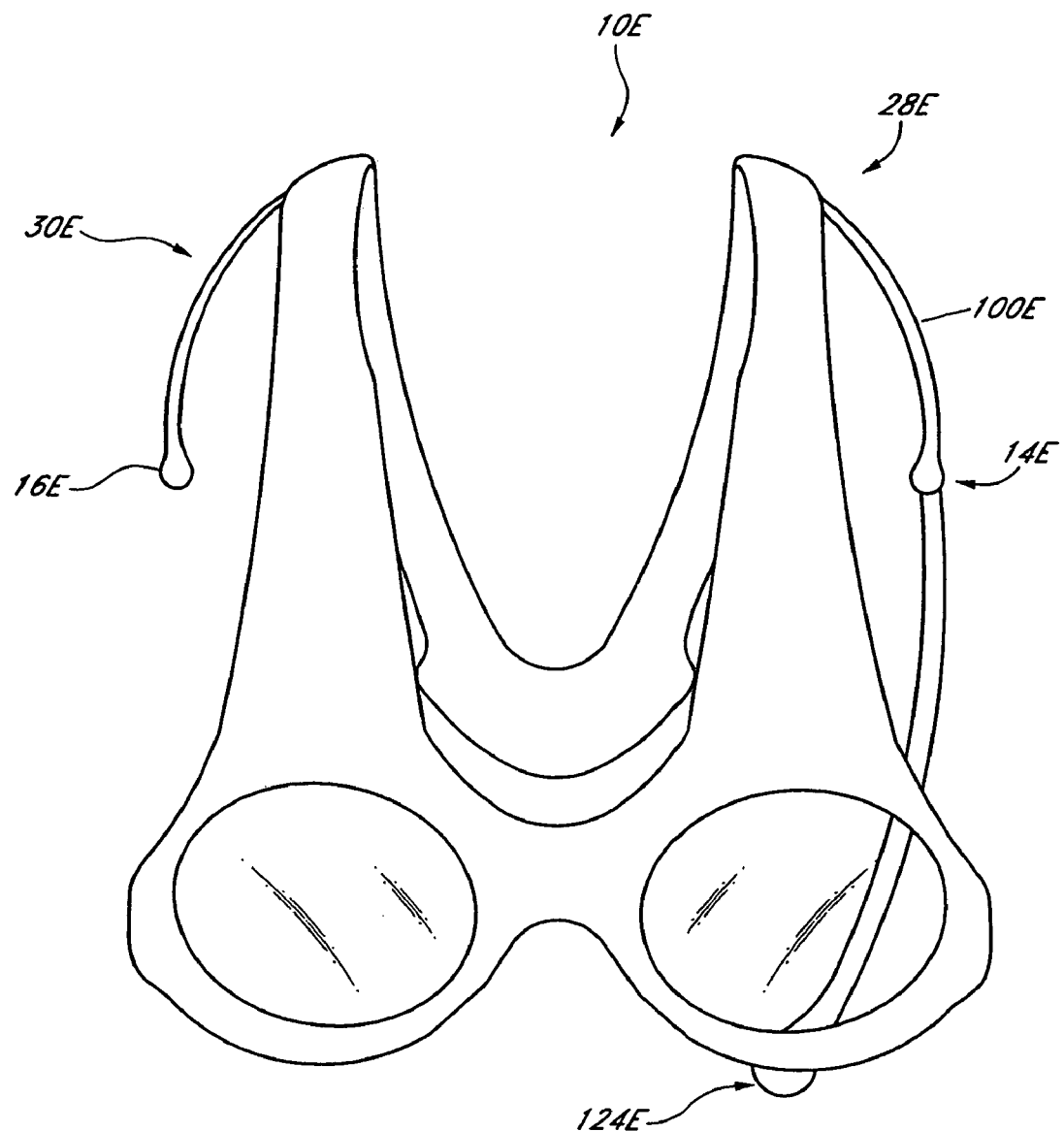
FIG. 16 is a front elevational view of the audio device illustrated in FIG. 15.

With reference to FIGS. 15 and 16, a further modification of the audio devices 10, 10A, 10B, 10C, and 10D, is illustrated therein and identified generally by the reference numeral 10E. Components that are similar or the same as the components of the audio devices 10, 10A, 10B, 10C, and 10D, have been given the same reference numerals, except that a "E" has been added thereto.

The audio device 10E includes a microphone boom 180 extending downwardly from the lower end of the support arm 100E. The microphone 124E is disposed at the lower end of the microphone boom 180.

In the illustrated embodiment, the audio device 10E can include the interface device 110E at an upper portion of the stem 96E. In particular, the interface device 110E can be disposed at the point at which the support arm 100E connects to the stem 96E. Optionally, certain components of the interface device 110E can be disposed at a rear portion of the stem 96E, this position being identified by the reference numeral 110E'.

In this embodiment, the antenna 118E can be disposed in the frame 82E, the stem 96E, the support arm 100E, or the microphone boom 180E. However, as noted above, it is preferable that at least a portion of the support 12E is used as the antenna. More preferably, the support 12E is made from a metal material, such that at least a portion of the support 12E is excited by the antenna and thereby forms part of the antenna.

The transceiver 114 can be in the form of a digital wireless transceiver for one-way or two-way communication. For example, the transceiver 114 can be configured to receive a signal from another transmitter and provide audio output to the speakers 14, 14A, 14B, 14C, 14D, 14E, 16, 16A, 16B, 16C, 16D, 16E. Alternatively, the transceiver 114 can be configured to receive an analog audio signal from microphone 75, 124, 124D, 124E, convert the signal to a digital signal, and transmit the signal to another audio device, such as, for example, but without limitation, a cell phone, a palm top computer, a laptop computer or an audio recording device.

The over-the-head configuration of the audio device 10E advantageously allows distribution of the load across a wearer's head, as well as positioning of relatively bulky or heavy electronics along the length of (e.g., inside) the audio device 10E or at the posterior aspect of the audio device 10E such as at the occipital end of the audio device 10E. This enables the audio device 10E to carry electronic equipment in a streamlined fashion, out of the wearer's field of view, and in a manner which distributes the weight across the head of the wearer such that the eyewear tends not to shift under the load, and uncomfortable pressure is not placed upon the wearer's nose, ears or temple regions.

In this embodiment, additional functional attachments may be provided as desired anywhere along the length of the frame, lenses or orbitals of the audio device 10E. For example, earphones may be directed towards the wearer's ear from one or two earphone supports extending rearwardly from the front of the eyeglass, down from the top of the audio device 10E or forwardly from the rear of the audio device 10E. Similarly, one or more microphones may be directed at the wearer's mouth from one or two microphone supports connected to the orbitals or other portion of the audio device 10E.

With reference to FIGS. 17 and 18, a communication protocol between the audio device S, B and the transceiver 114 is described. In this embodiment, the transceiver 114 is configured for one-way communication. The transceiver includes a receiver and decoder 202 and a digital-to-audio converter 204.

As noted above with reference to FIG. 8, the audio device S, B can be any one of a number of different audio devices. For example, but without limitation, the audio device S, B can be a personal audio player such as a tape player, a CD player, a DVD player, an MP3 player, and the like. Alternatively, where the transceiver 114 is configured only to transmit a signal, the audio device S, B can be, for example, but without limitation, an audio recording device, a palm top computer, a laptop computer, a cell phone, and the like.

For purposes of illustration, the audio device S, B will be configured only to transmit a signal to the transceiver 114. Thus, in this embodiment, the audio device S, B includes an MP3 player 206 and an encoder and transmitter 208. An antenna 210 is illustrated schematically and is connected to the encoder and transmitter 208. As an illustrative example, the MP3 player 206 outputs a signal at 128 kbps (NRZ data). However, other data rates can be used. The encoder and transmitter 208 is configured to encode the 128 kbps signal from the MP3 player and to transmit it through the antenna 210. For example, the encoder and transmitter 208 can be configured to transmit the encoded signal on a carrier signal centered on 49 MHz.

The receiver and decoder 202 can be configured to receive the carrier signal of 49 MHz through the antenna 118, decode the digital signal, and transmit the digital signal to the digital-to-audio converter 204. The digital-to-audio converter 204 can be connected to the speakers 14,16 and thereby provide an audio output that is audible to the user.

With reference to FIG. 18, the 128 kbps signal from the MP3 player 206 is identified by the reference numeral 212. In one embodiment, the encoder and transmitter 208 can be configured to encode the signal 212 from the MP3 player 206. The encoded signal from the encoder and transmitter 208 is identified by reference numeral 216.

The encoder and transmitter 208 can be configured to encode each pulse 214 of the signal 212 into a pattern of pulses, one pattern being identified by the reference numeral 218.

In the lower portion of FIG. 18, signal 220 represents an enlarged illustration of the portion of the signal 216 identified by a circle 222. As shown in FIG. 18, the pattern 218 is comprised of a series of 50 MHz and 48 MHz signals.

Figure 19:
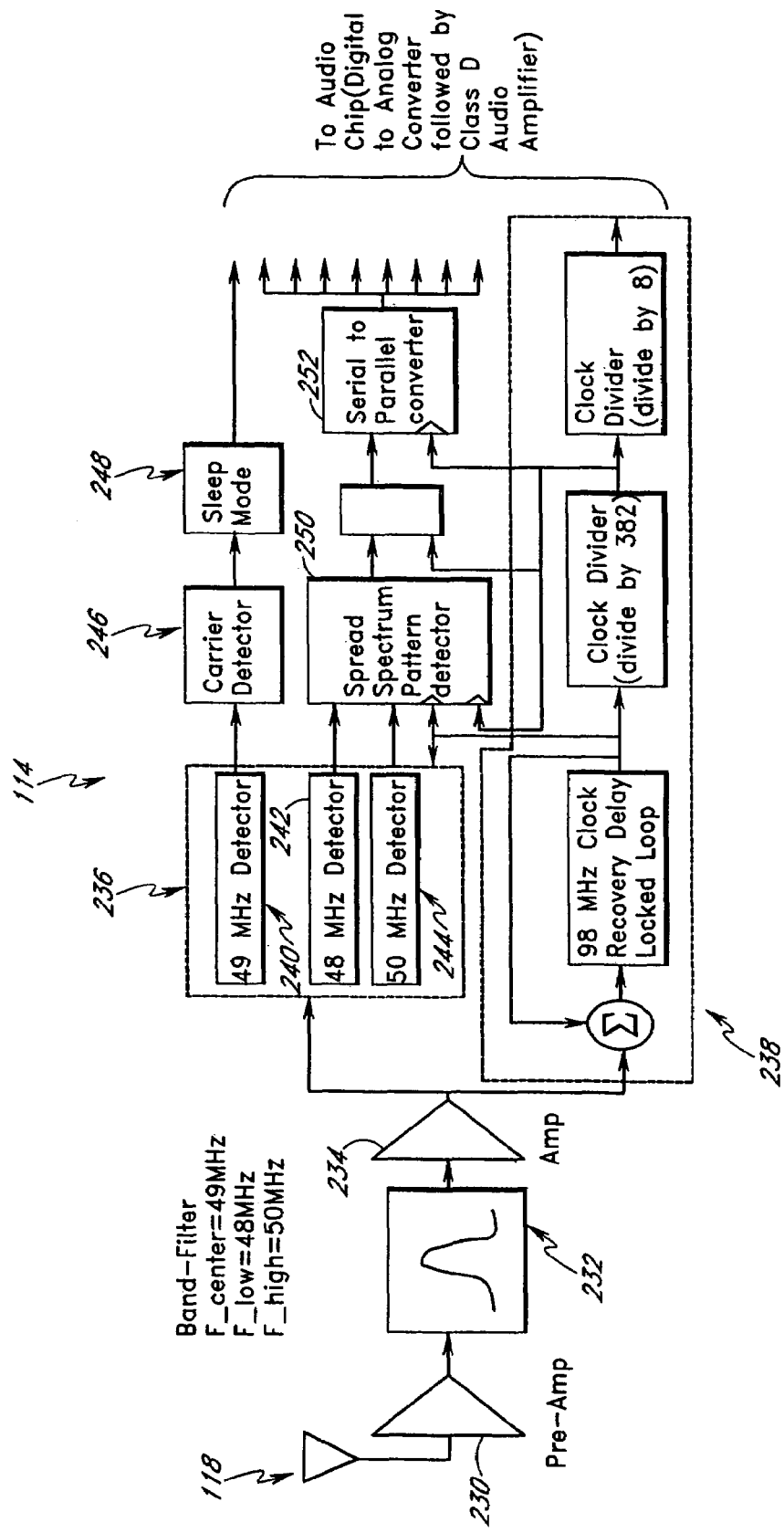
FIG. 19 is a schematic illustration of the decoder illustrated in FIG. 17.

With reference to FIG. 19, a more detailed illustration of the transceiver 114 is illustrated therein. As shown in FIG. 19, the transceiver includes a preamplifier 230, a band pass filter 232, and an amplifier 234 connected in series. The preamplifier 230 and the amplifier 234 can be of any known type, as known to those of ordinary skill in the art. The band pass filter 232, in the present embodiment, can be constructed as a band pass filter that allows signals having a frequency from 48 MHz to 50 MHz, inclusive, to pass therethrough. Alternatively, the band pass filter 232 can include three band pass filters configured to allow frequencies centered on 48 MHz, 49 MHz, and 50 MHz, respectively, pass therethrough.

The transceiver 114 also includes a signal detector 236 and a system clock circuit 238. The signal detector 236 comprises three signal detectors, e.g., a 49 MHz detector 240, a 48 MHz detector 242 and a 50 MHz detector 244. The 49 MHz detector 240 is connected to a carrier detector 246. As is schematically illustrated in FIG. 19, when the signal detector 236 detects a 49 MHz signal, which corresponds to a state in which no audio signal is being transmitted from the MP3 player 206, the carrier detector 246 causes the transceiver 114 to enter a sleep mode, schematically illustrated by the operation block 248.

As the detectors 242, 244 detect 48 MHz and 50 MHz detectors, respectively, they output signals to a spread spectrum pattern detector 250. The spread spectrum pattern detector outputs a corresponding signal to a serial-to-parallel converter 252. The output of the serial-to-parallel converter 252 is output to a digital-to-analog converter 204. A "class D" audio amplifier (not shown), for example, but without limitation, can be connected to the output of the digital-to-audio converter 204 to thereby supply an audio signal to the speakers 14, 14A, 14B, 14C, 14D, 14E, 16, 16A, 16B, 16C, 16D, 16E. It is to be noted that the encoding performed by the encoder and transmitter 208 can be in accordance with known signal processing techniques, such as, for example, but without limitation, CDMA, TDMA, FDM, FM, FSK, PSK, BPSK, QPSK, M-ARYPSK, MSK, etc. In this embodiment, the transceiver 114 can operate with a single channel.

Figure 20:
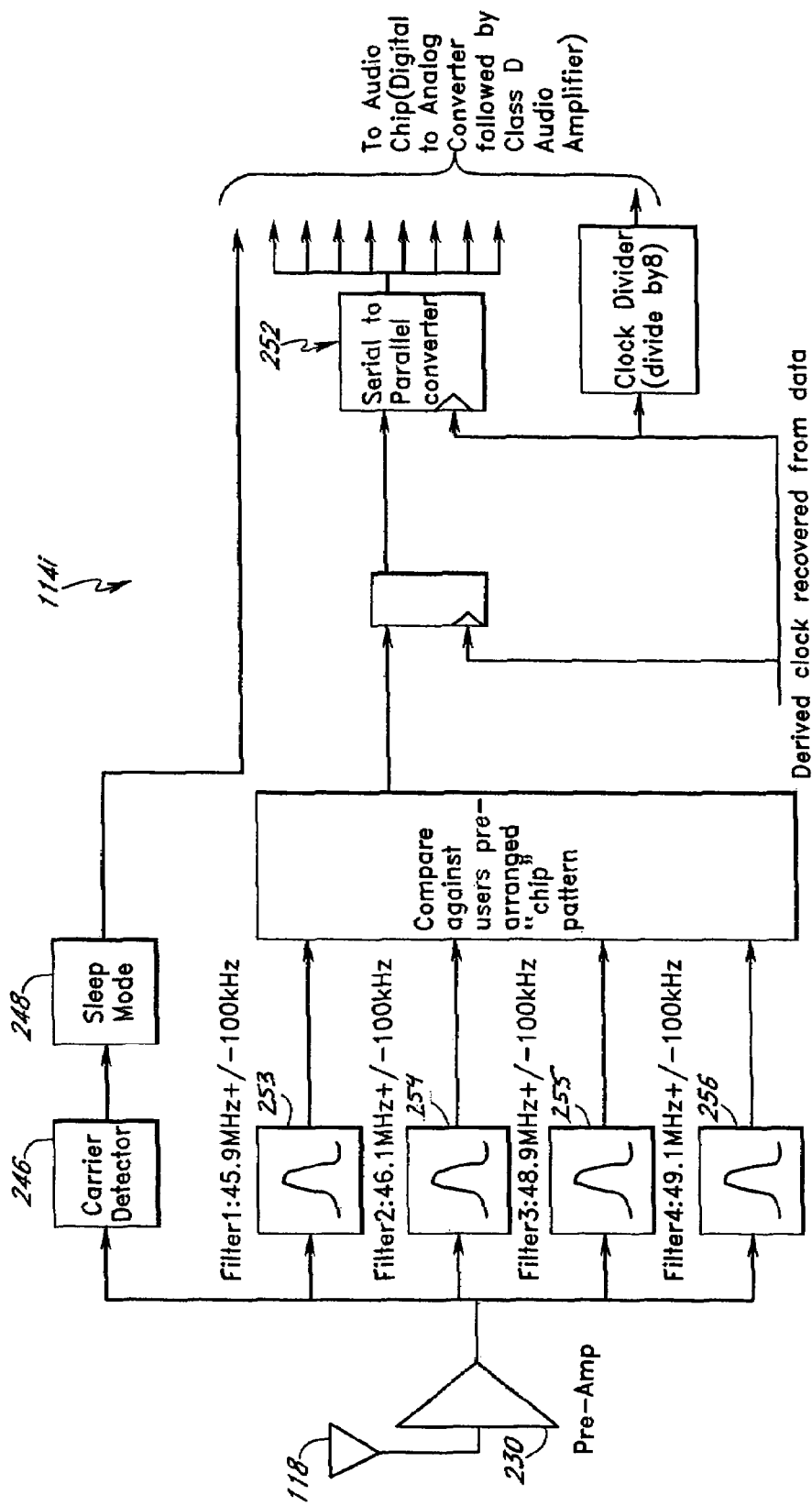
FIG. 20 is a schematic illustration of a modification of the decoder illustrated in FIG. 19, which can be incorporated into any of the wearable audio devices illustrated in FIGS. 1-16.

With reference to FIG. 20, a dual channel transceiver 114i is schematically illustrated therein. In this modification, the transceiver 114i is configured to simultaneously receive two signals, one signal centered on 46 MHz, and a second signal centered on 49 MHz. Thus, the transceiver 114i includes four band-pass filters. The first filter 253 is configured to allow a signal at 45.9 MHz plus or minus 100 kHz to pass therethrough. A second filter 254 is configured to allow signals at 46.1 MHz plus or minus 100 kHz to pass therethrough. The third filter 255 is configured to allow signals at 48.9 MHz plus or minus 100 kHz to pass therethrough. A fourth filter 256 is configured to allow signals at 49.1 MHz plus or minus 100 kHz to pass therethrough. As such, the transceiver 114 can receive two simultaneous signals, as noted above, one being centered at 46 MHz and one being centered at 49 MHz. Thus, this modification can be used to receive two audio signals simultaneously, for example, left and right signals of the stereo audio signal.

Each of the transceivers 114, 114i, illustrated in FIGS. 17-20, can be configured to receive one pattern 218, a plurality of different signals 218 or only one unique pattern 218. Additionally, as known in the art, the transceiver 114 or 114i and the encoder 208 can include pseudo random generators which vary the pattern 218 according to a predetermined sequence. Thus, the receiver and decoder 202 can be configured to auto synchronize by recognizing a portion of the predetermined sequence.

In an application where the transceiver 114 operates according to the BLUETOOTH™ standards, the transceiver 114 communicates with the transmitter according to a spread spectrum protocol so as to establish communication in a short range wireless environment with the minimal risk of interference with other devices. For example, the transceiver 114 can communicate with a BLUETOOTH™ enabled MP3 player, or other audio device. The audio device 10C can receive the output signal from the BLUETOOTH™ enabled MP3 player, and then output the audio signals to the interface 116. Optionally, the signal can be a stereo signal. The interface 116 can then direct the left and right audio signals to the speakers 14, 14A, 14B, 14C, 14D, 14E, 16, 16A, 16B, 16C, 16D, 16E through the speaker lines 120, 122.

In accordance with the BLUETOOTH™ standard, for example, but without limitation, the transceiver 114 can operate in a half duplex mode in which signals are transmitted in only one direction. For example, at any one moment, the transceiver 114 can only either receive signals and direct them to the speakers 14, 14A, 14B, 14C, 14D, 14E, 16, 16A, 16B, 16C, 16D, 16E or transmit signals, for example, from the microphone 75, 124, 124D, 124E to another device through the antenna 118, 118D, 118D'. Alternatively, the transceiver 114 can be configured to operate in a full duplex mode in which simultaneous of audio signals are received and transmitted to the speakers 14, 14A, 14B, 14C, 14D, 14E, 16, 16A, 16B, 16C, 16D, 16E and simultaneously audio signals from the microphone 75, 124, 124D, 124E are transmitted through the antenna 118, 118D, 118D' to a cooperating wireless device.

Further, the interface 116 can include a processor and a memory for providing added functionality. For example, the interface 116 can be configured to allow a user to control the cooperating wireless device, such as a cell phone. In an illustrative, non-limiting embodiment, where the transceiver 114 is a BLUETOOTH™ device, the interface 116 can be configured to support a hands-free protocol, as set forth in the BLUETOOTH™ hands-free protocol published Oct. 22, 2001, the entire contents of which is hereby expressly incorporated by reference. Optionally, the interface 116 can be configured to comply with other protocols such as, for example, but without limitation, general access profile, service discovery application profile, cordless telephony profile, intercom profile, serial port profile, headset profile, dialup networking profile, fax profile, land access profile, generic object exchange profile, object push profile, file transfer profile, and synchronization profile, published Oct. 22, 2001, the entire contents of each of which being hereby expressly incorporated by reference. Additionally, the "Specification of the Bluetooth System, Core", version 1.1, published Feb. 22, 2001 is hereby expressly incorporated by reference.

The headset profile is designed to be used for interfacing a headset having one earphone, a microphone, and a transceiver worn by the wearer, for example, on a belt clip, with a cordless phone through a wireless connection. According to the headset profile, certain commands can be issued from a headset, such as the audio devices 10, 10A, 10A', 10B, 10C, 10D, and 10E, using an AT command protocol. In such a protocol, text commands must be input to the BLUETOOTH™ device, which the BLUETOOTH™ device then transmits wirelessly to a synchronized BLUETOOTH™ enabled device. Such commands include, for example, but without limitation, initiating a call, terminating a call, and redialing a previously dialed number.

With reference to FIG. 9A, the interface electronics 116 can include audio or aural menus that can be selected by user. For example, a user can initiate an audio menu by depressing the button 150 (FIGS. 10-12). Upon initiation of the audio menus, the interface electronics 116 can send an audio signal to the speakers 14, 14A, 14B, 14C, 14D, 14E, 16, 16A, 16B, 16C, 16D, 16E including a humanoid voice. The voice signal can indicate that a first menu option is available. For example, but without limitation, the first menu choice can be to initiate a call. Thus, when the user pushes the button 150 the first time, the user will hear the words "initiate a call," emanating from the speakers 14, 14A, 14B, 14C, 14D, 14E, 16, 16A, 16B, 16C, 16D, 16E. If the user wishes to initiate a call, the user can depress the button 150 again which will send the appropriate AT command to the transceiver 114 so as to transmit the proper AT code to the cellular phone source device S, B (FIG. 8).

The user can be provided with further convenience if there are other menu choices available, for example, if the user does not wish to choose the first menu option, the user can depress either the forward or rearward portions 156, 158 of the button 150 so as to "scroll" through other audio menu options. For example, other audio menu options can include, for example, but without limitation, phonebook, email, clock, voice commands, and other menu options typically available on cellular phones and/or personal audio devices such as MP3 players.

As an illustrative, but non-limiting example, if a user wishes to access the phonebook, the user can depress the button 150 to initiate the audio menu, then "scroll" to the phonebook by depressing the portions 156 or 158 until the user hears the word "phonebook" in the speakers 14, 14A, 14B, 14C, 14D, 14E, 16, 16A, 16B, 16C, 16D, 16E. Once the user hears the word "phonebook," the user can depress the button 150 again to enter the phonebook. Thereafter, the user can depress the portions 156, 158 to "scroll" through phonebook entries. As the user scrolls through the phonebook entries, the interface 116 can be configured to cause the cellular phone to scroll through the phonebook and thereby transmit an audio signal of a humanoid voice indicating entries in the phonebook. When the user hears the name of the person or entity which the user desires to call, the user can again push the button 150 to initiate a call to that entity.

In this embodiment, the cell phone can be configured with a text-to-voice speech engine which generates a humanoid voice corresponding to entries of the phonebook. Such speech engines are known in the art and are not described further herein.

A text-to-speech engine can provide further convenient uses for a user. For example, if the cell phone or other source device is configured to receive email, the device can be configured to signal the user with an audio signal that an email has been received. The user can send a signal to the source device so as to open the email. The text-to-speech engine can be configured to read the email to the user. Thus, a user can "listen" to email through the audio device 10, 10A, 10A', 10B, 10C, 10D, 10E, without manually operating the source device.

A further option is to allow a user to respond to such an email. For example, the user could record an audio file, such as, for example, but without limitation a .WAV, .MP3 file as an attachment to a reply email. For such a feature, the interface 116 can be configured to automatically provide a user with options at the end of an email that is read to the user. For example, after the text-to-speech engine finishes "reading" the email to the user, the interface device 116 can enter another audio menu. Such an audio menu can include a reply option, a forward option, or other options. If a user wishes to reply, the user can "scroll" until the user hears the word "reply." Once the user hears the word "reply" the user can depress the button 150 to enter a reply mode. As noted above, these types of commands can be issued using an AT command protocol, to which the source device will also be configured to respond. As noted above, one audio menu option can include voice command. For example, when a user chooses the voice command option, the interface electronic 116 can reconfigure to send an AT command to the source device, such as a cellular phone, to accept voice commands directly from the transceiver 114. Thus, as the user speaks, the audio signal is directed to the source device, which in turn is configured to issue audio indicators back to the user, through the speakers 14, 14A, 14B, 14C, 14D, 14E, 16, 16A, 16B, 16C, 16D, 16E, to guide the user through such a voice command.

For example, if a user chooses a voice command option, the user could issue commands such as, for example, but without limitation, "phonebook" or "call alpha." With a source device such as a cellular phone, that has a speech recognition engine and that is properly trained to recognize the voice of the user, the user can automatically enter the phonebook mode or directly call the phonebook listing "alpha," of course, as is apparent to one of ordinary skill in the art, such a voice command protocol could be used to issue other commands as well.

In another alternative, the interface electronics 116 can include a speech recognition engine and audio menus. In this alternative, the interface electronics 116 can recognize speech from the user, convert the speech to At commands, and control this source device using a standard AT command protocol.

For example, but without limitation, the source device B can be in the form of a palm-top or hand-held computer known as a BLACKBERRY™. The presently marketed BLACKBERRY™ devices can communicate with a variety of wireless networks for receiving email, phone calls, and/or internet browsing. One aspect of at least one of the present inventions includes the realization that such a hand-held computer can include a text-to-speech engine. Thus, such a hand-held computer can be used in conjunction with any of the audio devices 10, 10A, 10A', 10B to allow a user to "hear" emails, or other text documents without the need to hold or look at the device B. Preferably, the hand-held computer includes a further wireless transceiver compatible with at least one of the transceivers 114, 114i. As such, a user can use any of the audio devices 10C, 10D, 10E to "hear" emails, or other text documents without the need to hold or look at the device B. Thus, a presently preferred hand-held computer, as a non-limiting example, includes a BLACKBERRY™ hand-held device including long range wireless network hardware for email and internet browsing capability, a BLUETOOTH™ transceiver for two-way short range audio and/or data audio communication, and a text-to-speech engine.

Preferably, the transceiver 114 is configured to transmit signals at about 100 mW. More preferably, the transceiver 114 is configured to transmit signals at no more than 100 mW. As such, the transceiver 114 uses less power. This is particularly advantageous because the power source 112 can be made smaller and thus lighter while providing a practicable duration of power between charges or replacement of the power source 112.

Figure 21:
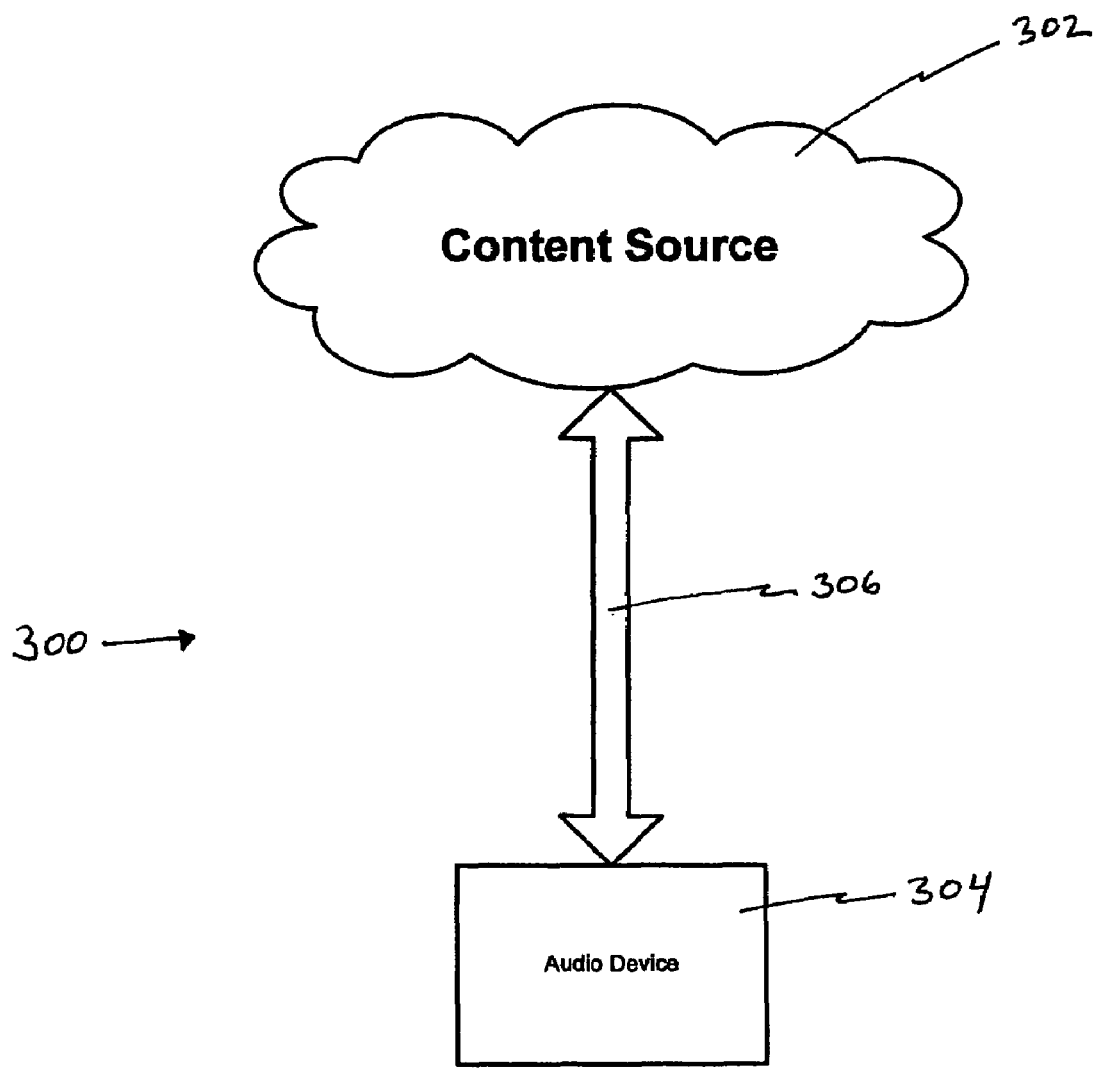
FIG. 21 is a schematic representation of an audio network.

An audio network 300 in accordance with another embodiment of the present invention is illustrated in FIG. 21. Audio network 300 includes a content source 302 coupled to an audio device 304 via communications link 306. The content source 302 is any of a variety of information sources, including, but not limited to, radio stations andlor signals, a satellite radio source, a computer, a network, a storage device, such as a hard drive, a memory card, or a USB (Universal Serial Bus) drive, an audio component (e.g., a stereo receiver, a CD player, a tuner, an MP3 player, a digital audio player, etc.), a database, and/or a communications-enabled device, such as a telephone (including a BLUETOOTH enabled telephone), a PDA, a BLACKBERRY, the Internet, or the like. The content provided by the content source 302 may be any of a variety of information, including but not limited to, audio files, entertainment, news, media, music, photos, videos, advertising, etc.

The audio device 304 may be any of the audio devices described above with respect to FIGS. 1-19, or may include any of the audio devices described below. In one embodiment, audio device 304 is electronically enabled eyewear, as discussed herein. Audio device 304 is coupled to content source 302 via communications link 306. Communications link 306 may be any of a variety of information conduits known to those of skill in the art, including: a cable, a wire, a conductor, a bus, an RF signal, a radio signal, a satellite signal, a BLUETOOTH signal, etc. In one embodiment, the communications link 306 includes a USB, mini-USB, USB-to-mini-USB, FIREWIRE, IEEE 1394, RS232, SCSI, or any other cable. In one embodiment, the communications link 306 is temporarily attached to the audio device 304 for the transfer of content from the content source 302 to the audio device 304. In another embodiment, the communications link 306 is a retractable cable mounted at least partially inside of the audio device 304.

In one embodiment, the audio network 300 is configured for the downloading of music from the content source 302 (e.g., a user's computer) to the audio device 304. In another embodiment, the audio network 300 is configured for the uploading of content stored within the audio device 304 to the content source 302.

Figure 22:
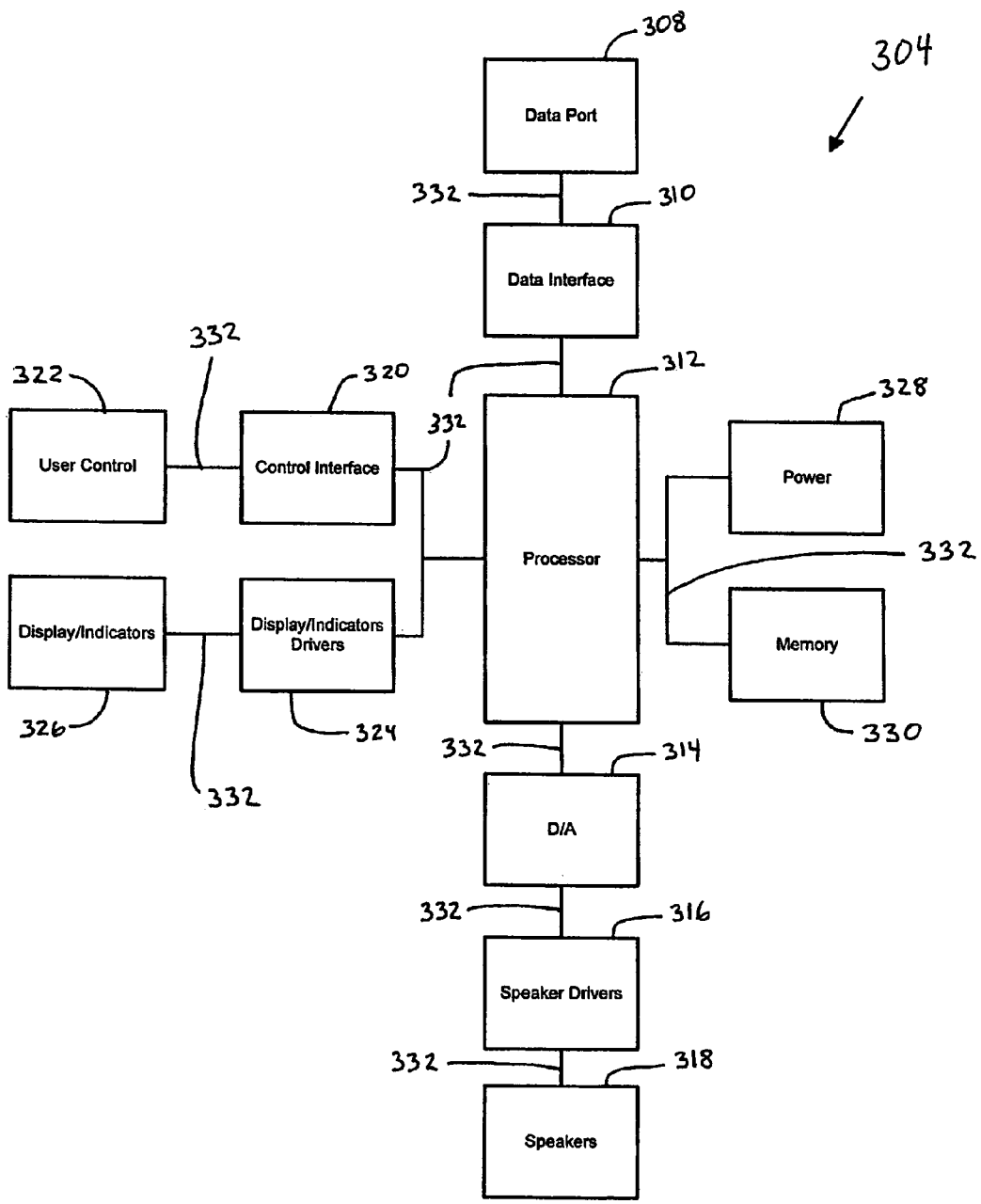
FIG. 22 is a schematic representation of the audio device illustrated in FIG. 21.

One embodiment of the audio device 304 is illustrated in FIG. 22. Audio device 304 generally includes a data port 308, data interface 310, processor 312, digital-to-analog converter 314, speaker drivers 316, and speakers 318. In addition, audio device 304 generally also includes a control interface 320, user controls 322, display/indicator drivers 324, display/indicators 326, power module 328, and memory module 330; however, any one or more of these components may be combined. For example, in one embodiment, data interface 310, control interface 320, display/indicator drivers 324, digital-to-analog converter 314, and speaker drivers 316 are combined with processor 312 into a single component.

Data port 308 is any of a variety of ports, connectors, jacks, interfaces, or receivers for wireless or wire-based coupling of audio device 304 with communications link 306. For example, in one embodiment, data port 308 is a mini-USB connector. In other embodiments, the data port 308 may be, by way of example, a USB connector, a FIREWIRE connector, an IEEE 1394 cable connector, an RS232 connector, a JTAB connector, an antenna, a wireless receiver, a radio, an RF receiver, a BLUETOOTH receiver, or the like. Data port 308 generally includes an optional protective door (not illustrated) to protect the data port 308 from dirt, moisture, water, snow, etc., when the audio device 304 is disconnected from the communications link 306.

In one embodiment, content is loaded from the content source 302 to the audio device 304 via the data port 308 at a data transfer rate. The data transfer rate will generally vary depending upon several factors, including the data port 308 selected, the content source 302, and the communications link 306. In one embodiment, the data transfer rate is about 1.5 Mbps (e.g., $10^6$ bits per second). In other embodiments, the data transfer rate may be, by way of example, at least about 12 Mbps, 100 Mbps, 200 Mbps, 400 Mbps, 480 Mbps, or the like. In yet another embodiment, the data transfer rate is greater than about 100 Mbps, 200 Mbps, 400 Mbps, or 1000 Mbps. In another embodiment, the data transfer rate is less than about 100 Mbps, or 50 Mbps.

Data interface 310 couples data port 308 with processor 312. In one embodiment, data interface 310 is a memory buffer for storing information or content received via data port 308 until it is processed by processor 312. Processor 312 controls the overall function and operation of audio device 304, and couples directly or indirectly to the various electronic components of the audio device 304, as described herein. In one embodiment, processor 312 is a digital signal processor (DSP), firmware, microprocessor, microcontroller, field-programmable gate array (FPGA), and/or an application-specific integrated circuit (ASIC). Processor 312 may also be upgradeable. For example, in one embodiment, processor 312 is firmware, and software executable by the processor 312 may be changed, uploaded, downloaded, deleted, and/or modified.

In one embodiment the processor 312 is adapted to function as a digitized audio coder/decoder (CODEC). For example, the processor 312 may be a decoder, such as the STA013, STMP34xx, STMP35xx, or STMP13xx manufactured by SigmaTel. The processor 312 is generally capable of decoding variable bit rate, constant bit rate, or any other bit rate format of compressed digital audio files. In one embodiment, processor 312 is a 75 MHz DSP with an 18-bit sigma-delta digital-to-analog converter.

In other embodiments, processor 312 may process any of a variety of compressed and non-compressed digital audio formats, including but not limited to: Pulse Code Modulation (PCM), Differential Pulse Code Modulation (DPCM), Adaptive Differential Pulse Code Modulation (ADPCM), Advanced Audio Coding (AAC), RAW, Delta Modulation (DM), Resource Interchange File Format (RIFF), Waveform Audio (WAV), Broadcast Wave Format (BWF), Audio Interface/Interchange File Format (AIFF), Sun Audio (AU), SND, Compact Disc Audio (CDA), Moving Pictures Experts Group (MPEG), including MPEG-1, MPEG-2, MPEG-2.5, MPEG-4, MPEG-J, MPEG 2-ACC, and layers 1, 2, and 3 (e.g., MP3), MP3Pro, Audio Compression/Expansion (ACE), Macintosh Audio Compression/Expansion (MACE), including MACE-3 and MACE-6, Audio Code Number 3 (AC-3), Adaptive Transform Acoustic Coding (ATRAC), ATRAC3, Enhanced Perceptual Audio Coder (EPAC), Transform-Domain Weighted Interleave Vector Quantization (Twin VQ or VQF), Windows Media Audio (WMA), WMA with DRM, Digital Theatre Systems (DTS), DVD Audio, Super Audio Compact Disc (SACD), Transparent Audio Compression (TAC), SHN, OGG (including Ogg Vorbis, Ogg Tarkin, and Ogg Theora), Advanced Streaming Format (ASF), Liquid Audio (LQT), QDesign Music Codec (QDMC), A2b, Real Audio (including the .ra, .rm, and Real Audio G2 and RMX formats), Fairplay, Quicktime, Shockwave (SWF), Perfect Clarity Audio (PCA), or the like. Processor 312 may also be adapted to process not only existing digital audio formats, but also digital audio formats that may be developed in the future.

The processor 312 is generally able to process encoded, digitized audio data that has been encoded at a particular data encoding rate. For example, in one embodiment, the processor 312 decodes encoded audio data that has been encoded at a data encoding rate of about 8 kilobits per second (e.g., "kbps"). In other embodiments, processor 312 decodes encoded audio data that has been encoded at a data encoding rate of, by way of example, at least about 128 kbps, 160 kbps, 192 kbps, 256 kbps, or the like. In other embodiments, the processor 312 decodes encoded audio data that has been encoded at a data encoding rate of less than about 128 kbps, 160 kbps, 192 kbps, 256 kbps, or the like. In yet another embodiment, the processor 312 decodes encoded audio data that has been encoded at a data encoding rate of more than about 256 kbps.

In another embodiment, the processor 312 decodes encoded data at a decoding rate of about 8 kilobits per second ("kbps"). In other embodiments, the processor 312 decodes encoded data at a decoding rate of, by way of example, at least about 128 kbps, 160 kbps, 192 kbps, 256 kbps, or the like. In another embodiment, the processor 312 decodes encoded audio data at a decoding rate of less than about 128 kbps. In yet another embodiment, the processor 312 decodes encoded audio data at a decoding rate of more than about 256 kbps.

The digital-to-analog converter 314 is generally adapted to output an analog signal based upon an input digital signal. In one embodiment, the digital-to-analog converter 314 is an 8-bit digital-to-analog converter. In other embodiments, digital-to-analog converter 314 is, by way of example, a 16-bit, 24-bit, 32-bit, 64-bit digital-to-analog converter, or the like, although any number of bits may be used. In one embodiment, the digital-to-analog converter 314 is an 18-bit, sigma-delta digital-to-analog converter. The digital-to-analog converter 314 may be integrated with the processor 312, or may be discrete from the processor 312.

Speaker drivers 316 are generally amplifiers that amplify an analog signal received from the digital-to-analog converter 314 and send the amplified signal to the speakers 318. Speakers 318 convert the signal received from the speaker drivers 316 to an audible signal that may be sensed by the user of the audio device 304. In one embodiment, the speakers 318 are made from Mylar, but may be made from other materials, including: polypropylene, aluminum-coated polypropylene, aramid, graphite-injected polypropylene, honeycomb-laminate, kapton, kaladex, polybenzoxozole, polycarbonate, polyetherimide, pulp paper, silk, silver film, thermalum, urethane, and/or any other material familiar to those of skill in the art.

In one embodiment, the speakers 318 have an input impedance of about 16 Ohms. In other embodiments the speakers 318 have an input impedance of no greater than about 2, 4, 8, or 32 Ohms. In one embodiment, the input impedance is less than about 16 Ohms, and in another embodiment it is greater than about 8 Ohms. In another embodiment, the input impedance is no less than about 100, 200, 400 or 600 Ohms. In one embodiment, the input impedance is about 300 Ohms or about 600 Ohms.

The control interface 320 generally includes a buffer, register, pre-processor, transistor, resistor and/or other electronic circuit to enable the processor 312 to receive commands from a user via the user controls 322. In one embodiment, the control interface 320 is integrated with the processor 312.

In one embodiment, the user controls 322 include a button, dial, switch, lever, sensor, touchpad, microphone, and/or any other input device that may be used by a user to control the audio device 304. In one embodiment, the user controls 322 include a microphone that receives a voice command. The user controls 322 may be responsive to any biometric provided by a user to control the audio device 304. For example, in one embodiment, the audio device 304 may monitor eye movement, and control the audio device 304 based upon blinking of the user's eyes.

In other embodiments, user controls 322 are used to perform any one or a combination of various functions with respect to an audio data file. For example, user controls 322 may be used to fast-forward, skip, cue, play, pause, turn power on or off, rewind, review, adjust volume, balance, tone, bass, or treble, randomize file selection, load a playlist, set a playlist, delete a playlist, repeat playback of all audio files, selected audio files, or a playlist, or perform any other function related to an audio data file.

The display/indicator drivers 324 are generally amplifiers or other drivers known to those of skill in the art, useful for driving or activating display/indicators 326. In one embodiment, the display/indicator drivers 324 receive signals from the processor 312 and generate drive signals to turn on or off display elements of the display/indicators 326. In one embodiment, the display/indicators 326 include an LED, LCD, light, tone, sound, beep, vibration, or other such display or indicator, or other indicators known to those of skill in the art. In one embodiment, the display/indicators 326 indicate a song selection, a power level, a volume, a remaining battery life, an artist, a song title, a time remaining during the playback of an audio file, a duration of an audio file's playback, or any other data related to an audio data file.

In one embodiment, the audio device 304 also includes a power module 328, which provides power to the audio device 304. The power module 328 is generally any device adapted to provide power, such as: a battery, a capacitor, a solar cell, solar paint, a fuel cell, and/or any other such device known to those of skill in the art. In one embodiment, the power module 328 distributes power to the various components of the audio device 304 via a conductor 332, either directly or indirectly. In one embodiment, the power module 328 is a rechargeable battery, such as a lithium-ion polymer battery.

In one embodiment, the power module 328 is recharged via the data port 308, and/or via an external charger (not shown). In one embodiment, the power module 328 has an input power rating of 5 Vdc at 150 mA, and a lifetime of 6 hours, although other input power ratings and lifetimes are possible. In one embodiment, the audio device 304 is able to play audio data files for at least about 4, 6, 8, 10, 12 hours, or more before the power module 328 is recharged. In one embodiment, the audio device 304 is able to play audio files for greater than about 6 hours before the power module 328 is recharged. In one embodiment, the power module 328 is able to be recharged in no more than about 3 hours, and reaches at least about 80% recharge in no more than about 1 hour. In one embodiment, the audio device 304 includes a power save function to conserve power consumption from the power module 328. For example, in one embodiment, when the audio device 304 has not been activated by the user for a period of time, the audio device 304 enters a sleep state, or automatically turns itself off. In one embodiment, the audio device 304 turns itself off after about 5, 10, 20, or 40 minutes of non-use.

The audio device 304 may also include a memory module 330, which in one embodiment stores audio data files. The memory module 330 may include any of a variety of electronic memory devices, including but not limited to, a hard drive, flash memory, RAM, ROM, EPROM, EEPROM, or PROM. In one embodiment, the memory module 330 includes NAND flash memory. In one embodiment, the memory module 330 includes at least about 128 MB. In other embodiments, the memory module 330 includes, by way of example, at least about 256 MB, 512 MB, or 1 GB of memory.

The memory module 330 may be permanently contained within the audio device 304, or may be removable. For example, in one embodiment, the memory module 330 includes an SD memory card, a compact flash memory card, a USB drive, a MEMORYSTICK, SMARTSTICK, and/or any other removable memory device as is well known to those of skill in the art.

Conductors 332 generally provide direct or indirect electrical communication between the various components of the audio device 304. In one embodiment, the conductors 332 include a data bus, power distribution network or a combination thereof. In one embodiment, the conductors 332 include a flexible printed circuit board (PCB), a conductive paint or coating, an Aricon fiber, or a Kevlar fiber. The PCB may be a multi-conductor PCB, and in one embodiment includes multiple conductors. In one embodiment, the PCB includes five conductors. In another embodiment, the conductors 332 include fiber dipped in or otherwise coated with a highly-conductive material, such as, for example, an aramid yarn or Kevlar fiber containing silver, or any other conductor known to those of skill in the art.

The conductors 332 may be embedded within the frame of the audio device 304 or applied to a surface of the audio device 304. In another embodiment, the audio device 304 includes both embedded and surface-applied conductors 332. In one embodiment, conductors 332 include conduits, such as conduits 73ai, 73bi, 274i, and 14Ai', as illustrated above in FIG. 3M. The conductors 332 may be embedded within the frame of the audio device 304 by extending through a channel, such as channel 316 illustrated in FIG. 3M. In other embodiments, the conductors 332 are applied to a surface of the audio device 304. In one embodiment, conductors 332 are applied to the surface of the audio device 304 such as the frame and/or lens and include conductive metals or paint. Conductive paints and coatings are well known to those of skill in the art, and include, for example, the ELECTRODAG series of products manufactured by Acheson industries in Port Huron, Michigan.

In one embodiment, the conductors 332 include conductive paints of one or more colors. By using conductors 332 having colors, the conductors 332 function as electrical conductors and provide design and aesthetic enhancement of the audio device 304.

In one embodiment, the audio device 304 includes dual automatic equalization. The audio device 304 may also include static and/or noise correction, and/or active or passive noise cancellation. The audio device 304 has a total harmonic distortion of less than about 1.0% and, in one embodiment, less than about 0.1%. The signal-to-noise ratio is generally greater than about 80 dB, and in one embodiment, at least about 90 dB.

In one embodiment, the audio device 304 receives a wireless signal, such as an FM or satellite radio, or wireless network, infrared, Bluetooth signal, or the like. The audio device 304 identifies audio signal information in the wireless signal, such as the performer of a song corresponding to the wireless signal.

The audio device 304 compares the audio signal information to stored preference information to determine whether to receive and store the wireless signal corresponding to a particular song. For example, in one embodiment, a user provides the audio device 304 with a list of preferred information, which includes preferred song names, artist names, or show or program titles. The audio device 304 monitors wireless signals to determine if preferred information is or will be broadcast. If the audio device 304 determines that preferred information is or will be broadcast, the audio device 304 receives the preferred information and saves it in the memory module 330. In one embodiment, the audio device 304 receives the preferred information and compresses it according to any of the compression or de-compression schemes described in greater detail above. Once compressed, the preferred information is saved in the memory module 330.

In another embodiment, a user provides the audio device 304 with a list of preferred information, which includes preferred song names, artist names, or show or program titles. The audio device 304 also receives a program guide, which generally indicates the schedule of transmission of songs, programs, or other content from a content source 302, such as the content source 302 shown in FIG. 21. The audio device 304 determines when preferred information will be available by comparing the preferred information to the program guide. The audio device 304 receives and stores the preferred information based upon the comparison.

In one embodiment, the audio device 304 is generally light-weight, and able to be worn comfortably by a user for an extended period of time. In one embodiment, the audio device 304 weighs less than about 75 g, less than about 50 g, or less than about 30 g. In one embodiment, the audio device 304 weights about 52 g.

Figure 23:
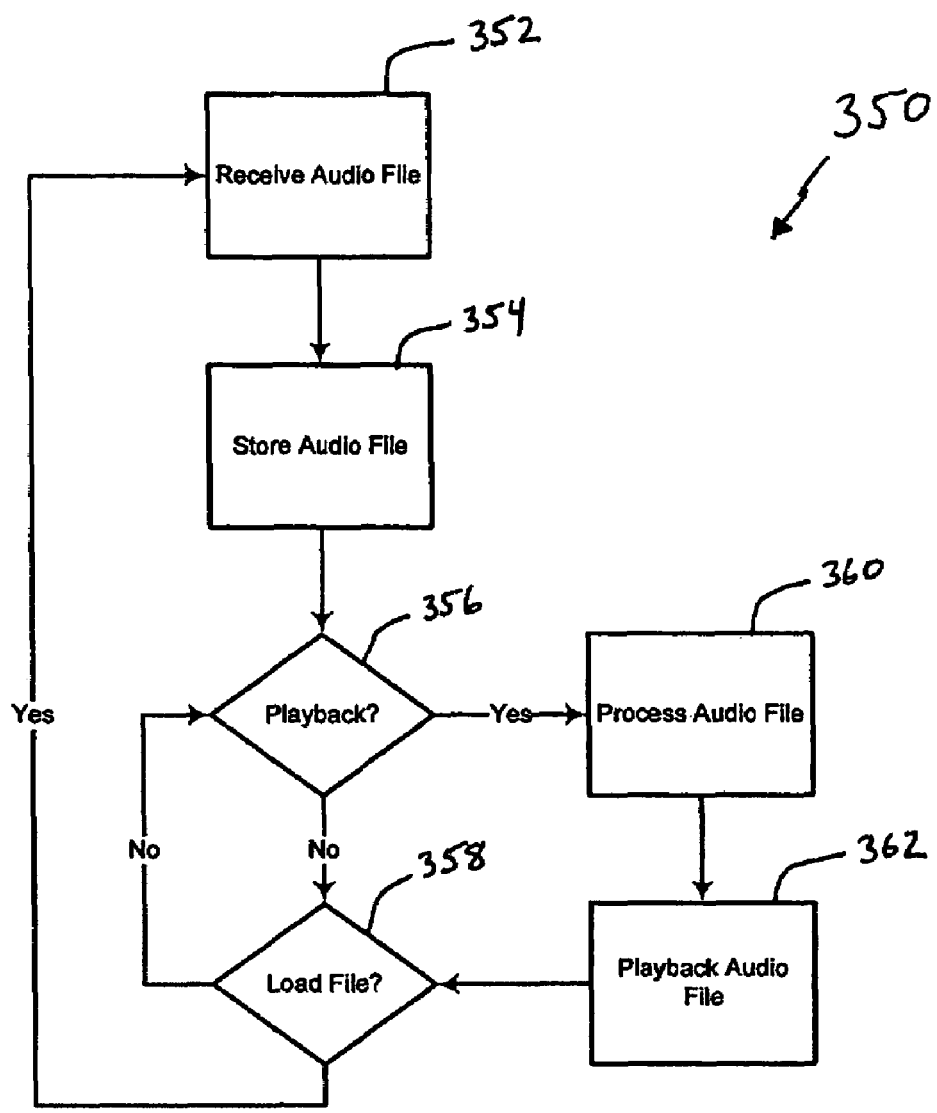
FIG. 23 is a schematic representation of an audio playback method.
Figure 24A:
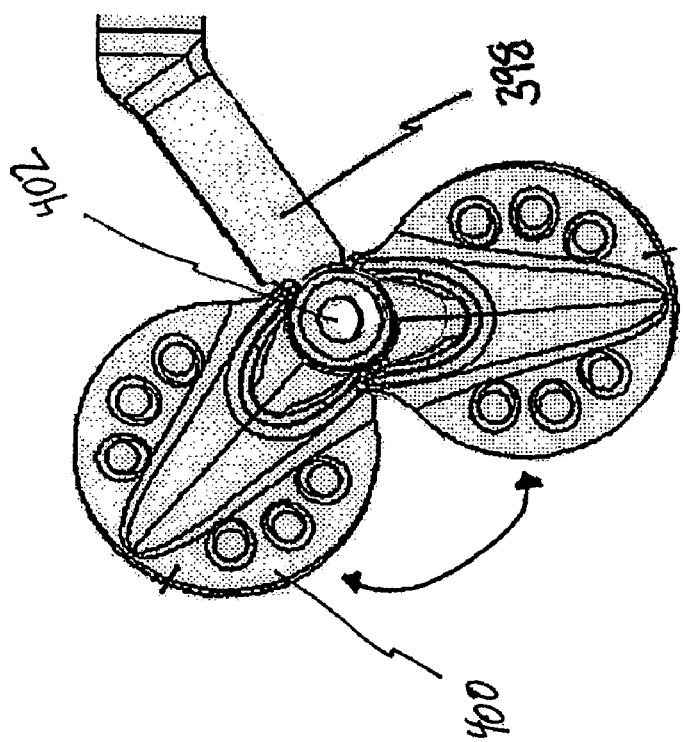
FIG. 24A is a detail view of a speaker pivot as in FIG. 24.

One embodiment of a method of audio playback 350 is illustrated in FIG. 23. An audio file is received at block 352. The audio file may be any of the compressed or non-compressed digital file formats described above with respect to FIGS. 21 and 22, or may be any other audio file. The audio file may be any content described above with respect to FIG. 21. In one embodiment, the audio file is an MP3 formatted audio file.

The audio file is stored in the audio device 304 at block 354. At block 356, the method 350 determines whether the user has instructed the audio device 304 to play back the audio file. If not, the method 350 continues to block 358, where the method 350 determines whether the user has instructed the audio device 304 to load an audio file into the audio device 304. If not, the method 350 returns to block 356. If the user has instructed the audio device 304 to load an audio file, the method 350 returns to block 352.

If at block 356 the user has instructed the audio device 304 to play back an audio file, the method 350 continues to block 360. At block 360 the method processes an audio file. In one embodiment, block 360 includes any one or a combination functions that may be performed with respect to an audio file. For example, at block 360 the audio file may be selected, the playback volume may be adjusted, the tone, balance, bass, treble, or other audio parameter may be adjusted, and/or any other processing function may occur.

At block 362 the audio file is played back, which in one embodiment includes decompressing an audio file, converting it to an analog signal, and sending a signal to speakers so that the audio file may be heard by a user. After block 362 the method 350 returns to block 358.

FIG. 24 illustrates an audio device 304 in accordance with another embodiment of the present invention. The audio device 304 of FIG. 24 may be the same as and/or include any or all of the features of any of the audio devices described above with respect to FIGS. 1-23. The audio device 304 of FIG. 24 includes a frame 380, which includes an ear stem 382, an electronic housing 384, a coupling 386, and orbitals 388. The embodiment of audio device 304 illustrated in FIG. 24 is adapted to be worn on the head of a user as a pair of eyeglasses, although other configurations for the support of audio device 304 may be employed.

In one embodiment, the electronic housing 384 is a hollow cavity formed within the audio device 304 frame 380. Electronic components of the audio device 304, for example, any one or all of the components described above with respect to FIG. 22 and elsewhere herein, are at least partially enclosed within electronic housing 384. In one embodiment, the audio device 304 includes at least three buttons 390, which extend from the electronic housing 384, and allow user control over operation of the audio device 304. The orbitals 388 of the audio device 304 at least partially enclose and/or support a lens 392. Additional details regarding the lens 392 of the audio device 304 are provided in greater detail below with respect to FIGS. 26-28.

In one embodiment, the frame 380 of the audio device 304 includes two ear stems 382. The right ear stem 382 may include an electronic housing 384, and the left ear stem 382 may include a housing (not shown) to carry a power source 328 (not shown), for example, an AAAA battery, a rechargeable battery, or any other power source described above. Power from the power source 328 is provided to the electronic components of the audio device 304 within the electronic housing 384 via conductors 332 (not shown). In such configuration, the weight of the audio device 304 may be substantially evenly distributed across the user's head, as described in greater detail above.

Figure 27:
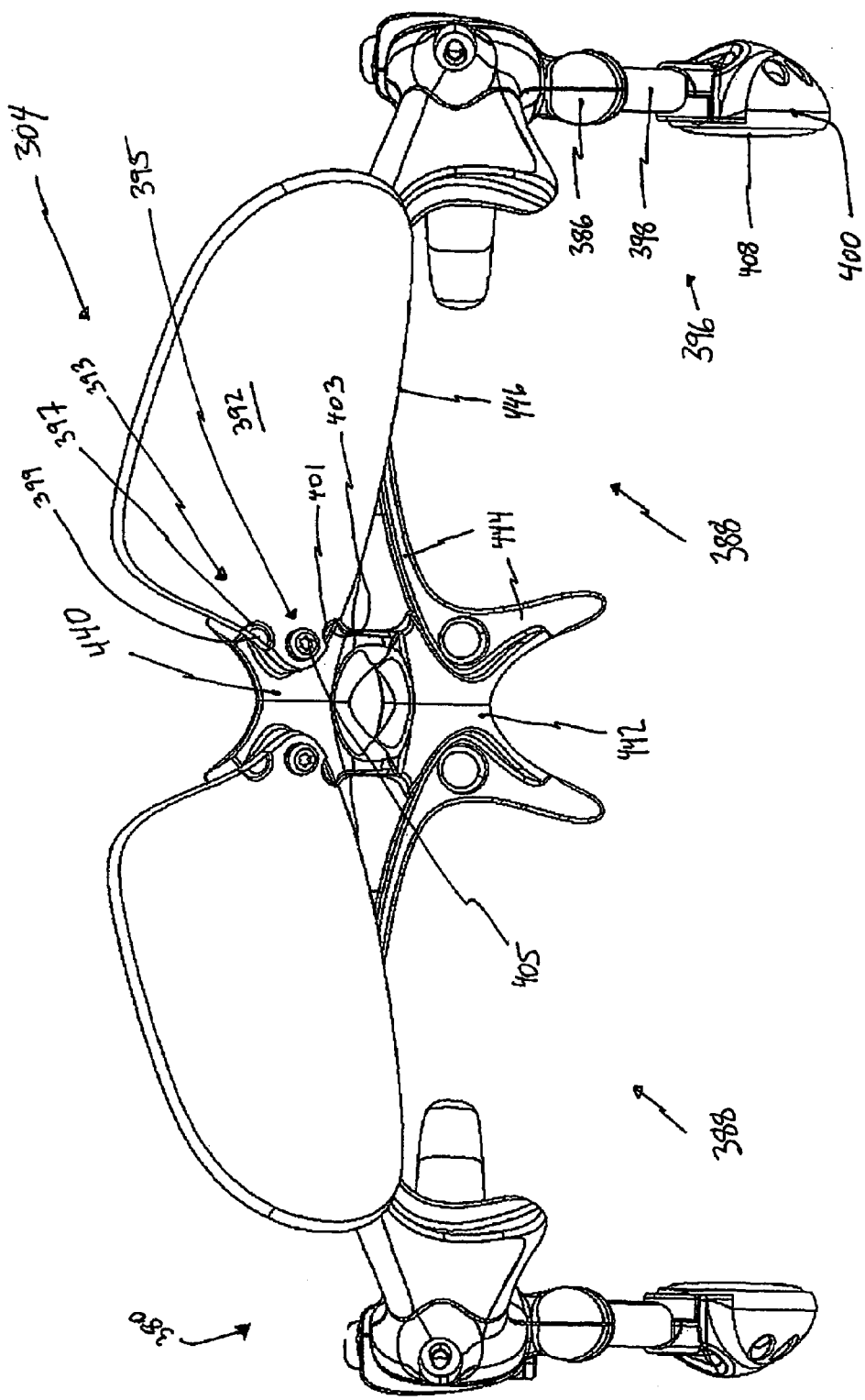
FIG. 27 is a front elevational view of the audio device of FIG. 24 shown in a second configuration.

In one embodiment, power is provided from one ear stem 382 to the other ear stem 382 across the upper orbital and nose bridge portion 442 (as shown in FIG. 27) of the audio device 304 frame 380. Analog signals that correspond to a selected compressed digital audio file are provided from the electronic housing 384 to the ear stem 382 that carries the electronic housing 384, and across the nose bridge portion 442 to the other ear stem 382. From the ear stems 382, the analog signal is provided to right and left speakers 400 via the right and left couplings 386 and extensions 398. In another embodiment, the analog signals are conducted at least partially through or upon the orbitals 388 of the audio device 304 frame 380.

In another embodiment, electronics components are distributed along the frame 380 of the audio device 304. In one embodiment, digital signals that correspond to a selected compressed digital audio file are provided through, within or upon the frame 380. For example, in one embodiment, digital signals are provided across the nose bridge portion 442 of the audio device 304 frame 380. In one embodiment, digital-to-analog converters 314 are included in the right and left speaker 400 housings, such that audible audio is generated by the speakers 400 based upon the digital signals.

In one embodiment, the coupling 386 of the audio device 304 includes a hollow chamber (not illustrated), into which a boom 394 of a support arm 396 extends. The support arm 396 also includes an extension 398 and a speaker 400. Speaker 400 is attached to the extension 398 at a speaker pivot 402. Although one speaker pivot 402 is illustrated, each support arm 396 may include more than one speaker pivot 402 to provide additional adjustability of the speaker 400 with respect to a user's ear. In one embodiment, speaker pivot 402 includes a pin, hinge, cam, and/or ball joint. The boom 394 is configured to at least partially slide along and rotate about its longitudinal axis (illustrated as boom axis 404) within the coupling 386. In one embodiment, longitudinal translation of boom 394 with respect to coupling 386 along the boom axis 404 results in speaker 400 position adjustment in an anterior or posterior direction ("z-axis" adjustability, as described below) with respect to a user's ear.

In another embodiment, rotation of boom 394 about the boom axis 404 provides adjustment of the angular orientation of speaker 400 with respect to the user's ears. In one embodiment, boom 394 is configured to rotate about its longitudinal axis such that speaker 400 is directed inward, towards a user's ear. In another embodiment, boom 394 is configured to rotate such that speaker 400 is directed outward and upward, away from a user's ear by at least about 35 degrees and in some embodiments at least about 65 degrees from vertical. Such adjustability is particularly useful for allowing a user to use a telephone without requiring removal of audio device 304 from user's head.

Figure 25:
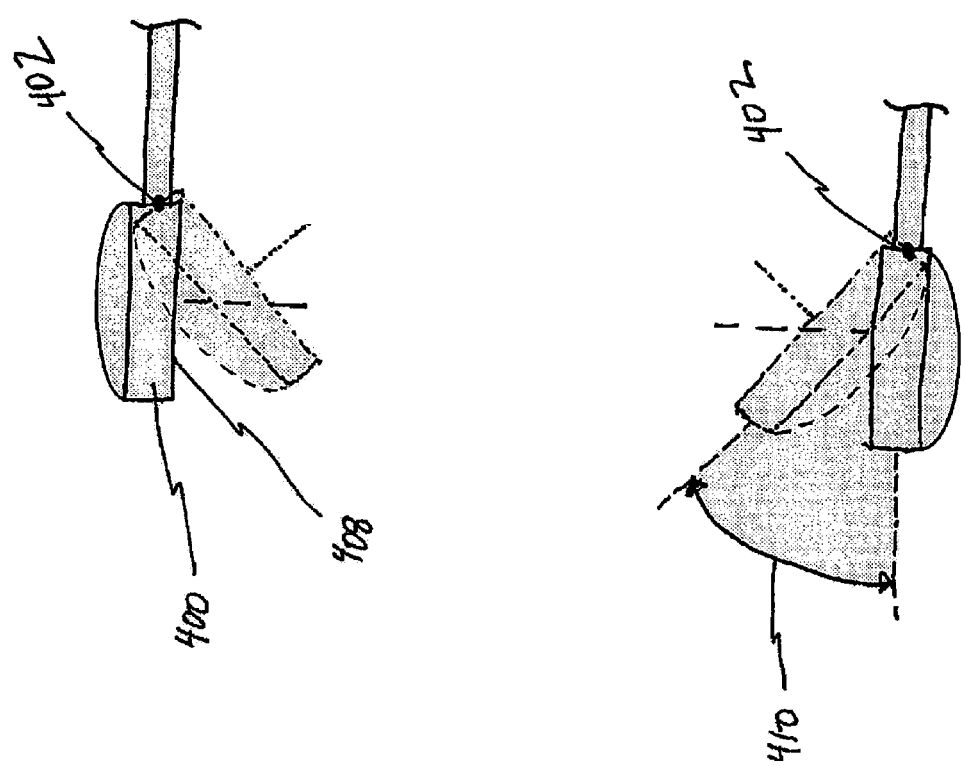
FIG. 25 is a schematic of a cross-sectional view taken along line 25-25 of FIG. 24.

Speaker pivot 402 allows speaker 400 to rotate through an arc about the rotational center of the pivot 402, thereby providing additional superior-inferior as well as anterior-posterior speaker position adjustability. See FIG. 24A. Rotation through an arc of at least about 45 degrees, and often at least about 90 degrees or 120 degrees is contemplated. In one embodiment, speaker pivot 402 additionally permits speaker 400 to rotate laterally with respect to a user's ear, as illustrated in FIG. 25, and discussed in greater detail below with respect to FIGS. 29-31. Sound emitted from speaker 400 is generally emitted along a sound propagation axis 406, which is generally transverse a speaker face 408. Inward and outward rotation of speaker 400 about speaker pivot 402 permits adjustment of the speaker face 408 and the sound propagation axis 406 with respect to a user's ear. In one embodiment, speaker 400 is adjustable over an adjustment range 410 of about 45°. In other embodiments, speaker 400 is adjustable over an adjustment range 410 of no more than about 5°, 10°, 15°, 25°, 30°, or 60°. In one embodiment, speaker is adjustable over an adjustment range of greater than about 25°. Additional discussion regarding speaker 400 adjustability is discussed in greater detail below.

Overall, in one embodiment, the audio device 304 provides speaker 400 adjustability in about four degrees-of-freedom with respect to a user's ear. In other embodiments, the audio device 304 provides speaker 400 adjustability in one, two, three or more than three degrees-of-freedom.

The lens 392 of the audio device 304 may be any of a variety of lenses described above, including but not limited to, sunglass lens, waterwhite lens, UV filtering lens, plano lens, magnifying lens, prescription lens, polarized lens, tinted lens, bifocal lens, trifocal lens, Polaroid lens, photochromic lens, protective lens, or the like. The lens 392 may be manufactured from a variety of materials, as described above, including plastic, polymers, or glass, or a combination thereof. Polycarbonate and CR-39 are suitable non-glass lens materials. In addition, the lens 392 may be fabricated by injection molding, coining, thermoforming, coating, or layering one or more materials together, as is well known to those of skill in the art. The lens 392 may be interchangeable so that a user can select the lens 392 attached to the audio device 304 depending upon the user's preference.

The term lens as used herein may refer either to a single lens in a unitary lens system, or a dual lens in a system having a separate lens for each of the left and right line of sight. The lens generally comprises a lens body, having a front surface, a rear surface, and a thickness therebetween. The front surface of the lens preferably conforms to a portion of the surface of a solid geometric shape, such as a portion of the surface of a first sphere having a first center. The rear surface of the lens preferably conforms substantially to a portion of the surface of a solid geometric shape, which may be the same or different than that conforming to the front surface. Preferably, the rear surface conforms substantially to a portion of the surface of a second sphere, having a second center.

The first and second centers are offset from one another to taper the lens thickness. Preferably, the lens is mounted in the frame such that a line drawn through the first and second centers is maintained substantially parallel with a wearer's reference line of sight. Often, the wearer's reference line of sight will be the wearer's straight ahead normal line of sight.

The lens may be cut from a lens blank, or formed directly into its final configuration such as by injection molding or other techniques known in the art. The lens may be oriented on the head of a wearer by the eyeglass frame such that the straight ahead normal line of sight crosses the posterior surface of the lens at an angle greater than about 95°, and often within the range of from about 100° to about 120°, while maintaining the optical center line of the lens in a substantially parallel relationship with the straight ahead normal line of sight of the wearer. The optical center line of the lens may or may not pass through the lens. Further aspects of the optically correct embodiment of the lens for use in the present invention are disclosed, for example, in U.S. Pat. No. 6,168,271 to Houston et al., entitled Decentered Noncorrective Lens for Eyewear, the disclosure of which is incorporated by reference in its entirety herein.

Figure 26:
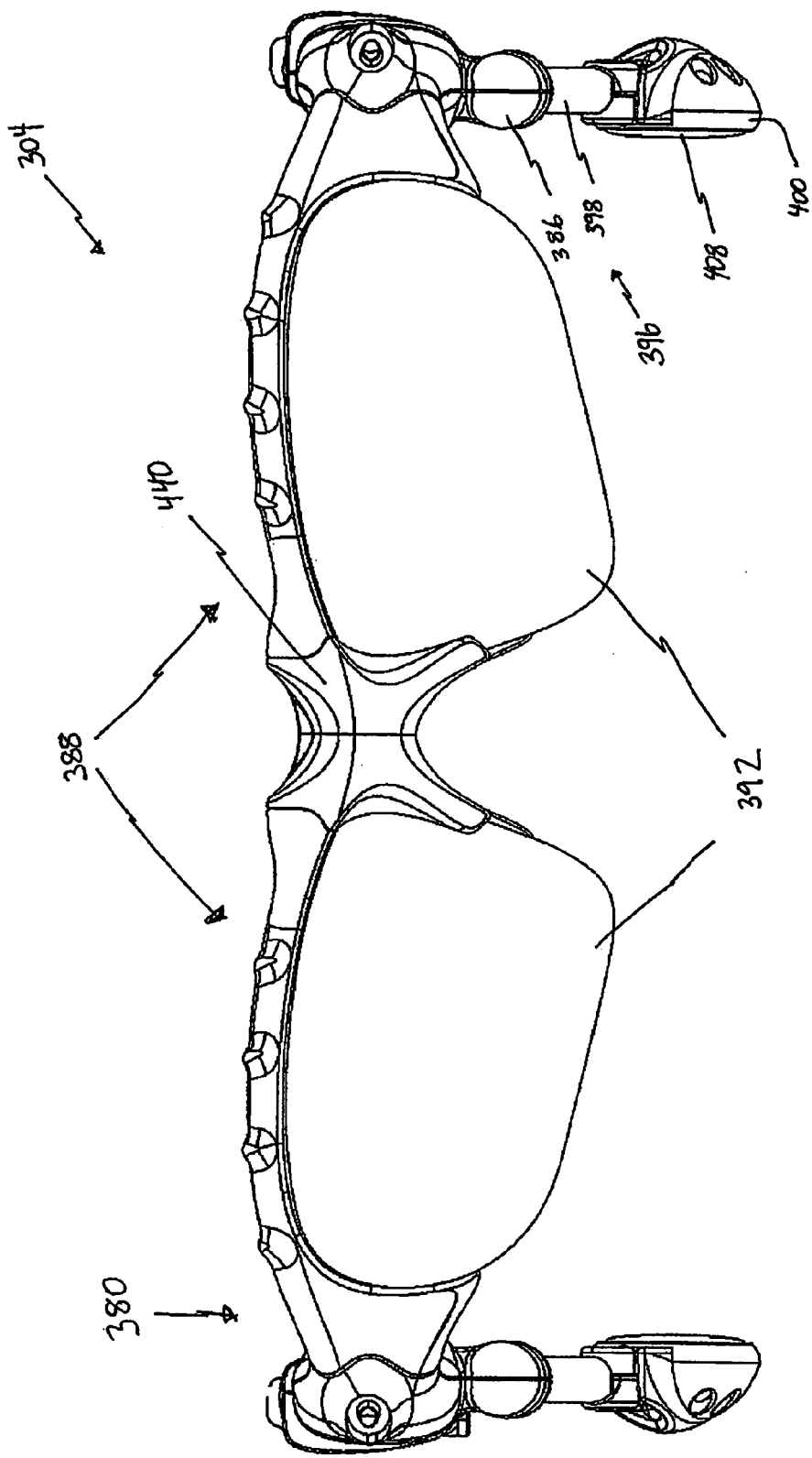
FIG. 26 is a front elevational view of the audio device of FIG. 24.
Figure 28:
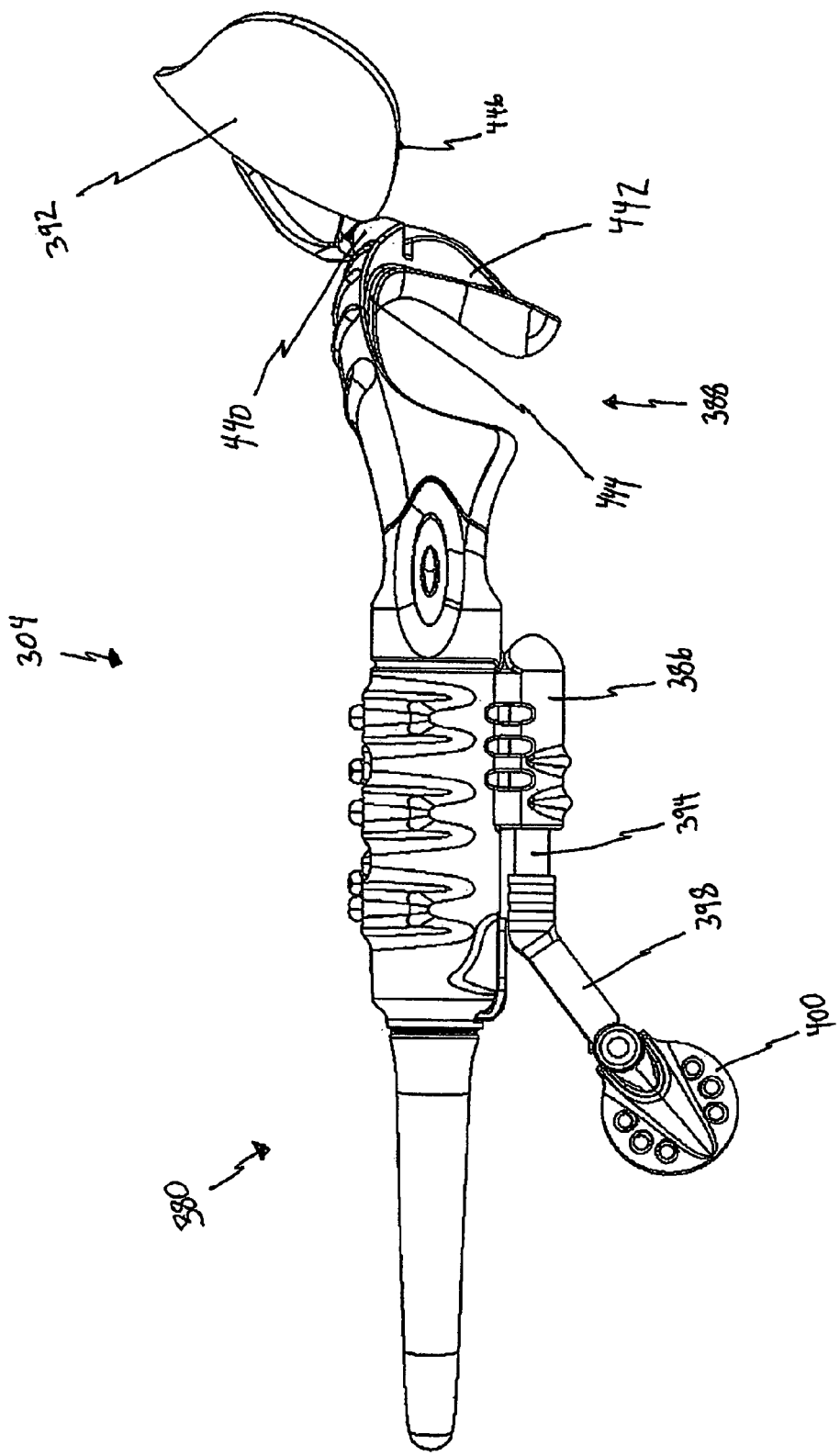
FIG. 28 is a left side elevational view of the audio device of FIG. 27.

In one embodiment, as illustrated in FIGS. 26-28, lens 392 is mounted to a lens mount 440, which is adjustable with respect to frame 380. For example, in one embodiment, lens mount 440 is coupled to a bridge portion 442 of frame 380 via a pivot or hinge (not shown). The pivot allows the lens mount 440 and the lens 392 attached thereto, to rotate up and out of the visual field of the wearer. Such adjustability of the lens 392 allows the user to remove the lens 392 from the user's visual field without requiring removal of the audio device 304 from the user's head. In one embodiment, where the lens 392 includes sunglass lens, flip-up functionality advantageously permits the user to wear the audio device 304 in bright environments with the sunglass lens flipped down, and in dark environments with the sunglass lens flipped up.

A secondary lens may be provided for each of the wearer's right and left lines of sight. The secondary lens may be secured to the frame 380 on the posterior side of the primary lens 392, such that when the primary lens 392 is advanced from the first position as illustrated in FIG. 26 to a second position as illustrated in FIG. 27, the secondary lens remains within the wearer's line of sight. The secondary lens may be a waterwhite lens, and may either be a prescription lens or a protective plano lens.

Any of a variety of mechanisms may be used to couple lens mount 440 to the frame 380 of the audio device 304. Such mechanisms include pins, hinges, joints, including ball joints, and any other suitable mechanism, as are well known to those of skill in the art. In one embodiment, lens mount 440 is detachably coupled to frame 380 so that the user may remove and exchange lenses 392 depending upon the user's requirements. For example, lenses 392 of different color, shape, size, prescription, tint darkness, polarization, filtering, or any other optical or aesthetic quality may be interchanged and used with the audio device 304.

In one embodiment, the frame 380 includes a support ridge 444 formed within an edge of a frame orbital 388. The support ridge 444 is generally designed to accommodate a contact edge 446 of the lens 392, and to provide resistance and support for frontal impact against the lens 392. In one embodiment, the support ridge 444 provides impact resistance at or in excess of that required by a national or international standard, such as ANSI Z87.1-2003.

The lens 392 may be pivotably connected to the frame 380 in any of a variety of ways. In the illustrated embodiment, a medial side 393 of lens 392 is connected to a lens mount 440, which is pivotably connected to the frame 380. Due to the bilateral symmetry of the disclosed embodiment, only a single lens 392 will be described herein.

The medial side 393 of the lens 392 is provided with structure for enabling a connection 395 to the lens mount 440. In the illustrated embodiment, lens 392 is provided with at least a first alignment recess 397, which may be molded or formed in the medial side 393 of the lens 392. The first alignment recess 397 is positioned to receive a first alignment pin 399 which projects from the lens mount 440. Optionally, a second alignment recess 401 may be positioned to receive a second alignment pin 403, as illustrated in FIG. 27.

A fastener 405, such as a screw is advanced through an aperture in the lens 392 and into a threaded recess within lens mount 440. The fastener 405, in cooperation with the alignment recess and alignment pin configuration described above, enable a secure attachment of the lens 392 to the lens mount 440, with minimal encroachment upon the field of view.

The fastener 405 may be provided with a knob, hexagonal recess, or other rotational engagement structure, to permit rotation of the fastener 405 by hand or with a tool, to enable exchange of the lens 392. Alternatively, fastener 405 may comprise any of a variety of snap fit structures, to permit removal of the lens 392 and replacement with an alternative lens 392.

The mechanical center of each lens is displaced from the axis of rotation of the lens mount 440 by sufficient distance to enable the lens 392 to be rotated in and out of engagement with the support ridge 444, even with rake and wrap angles in excess of about 6° or 8° or 10°. In the illustrated embodiment, the axis of rotation of the lens mount 440 is displaced from the mechanical center of the lens by at least about 0.25", and, in some embodiments, at least about 0.5". In the illustrated embodiment, the axis of rotation of the lens mount 440 extends within about 0.125" of the upper edge of the lens 392 when the lens is in the first, lowered position, when viewed in a front elevational view.

The support ridge 444 may be provided with at least one recess 407, for receiving the fastener 405, to maximize the contact surface area between the lens 392 and the support ridge 444. The lens mount 440 may be provided with a spring bias, such as a first surface spring biased against a second, cam surface to bias the lens 392 against the support ridge 440 when the lens is in the first position, and to bias the lens 392 away from the wearer's line of sight when the lens 392 is in the second position.

Figure 29:
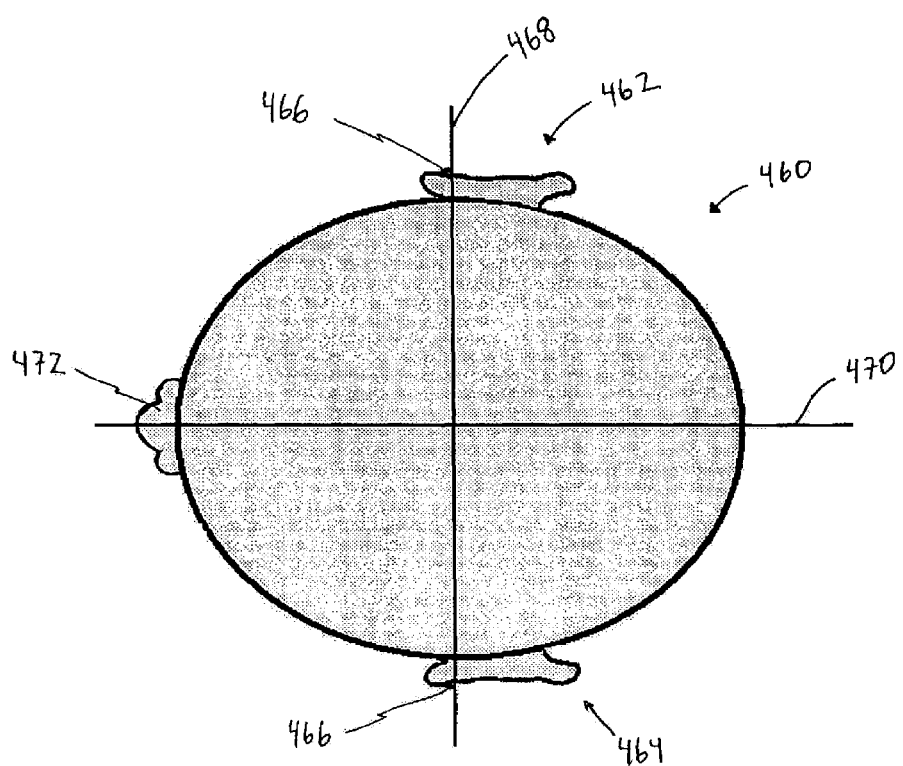
FIG. 29 is a schematic representation of a top plan view of a wearer's head.

An embodiment of the audio device 304 is generally adapted to be worn at least partially upon the head 460 of a user. A top view of a user's head is generally illustrated in FIG. 29. The head 460 includes two ears 462. The external, visible portion of the ear 462 is generally referred to as the pinna 464 or auricle. A small, cartilaginous protrusion within the pinna 464 is known as the tragus 466. The size and shape of the tragus 466 varies between individuals, but it generally extends posteriorly and sometimes slightly laterally with respect to the head 460. A tragus-tragus line 466 extends laterally across the head 460, between the posterior limit of each of the left and right tragus, and generally bisects the head 460, as viewed from above. A lateral plane of symmetry 470 extends transverse the tragus-tragus line 466, substantially bisecting both the user's head 460 and nose 472.

Figure 30:
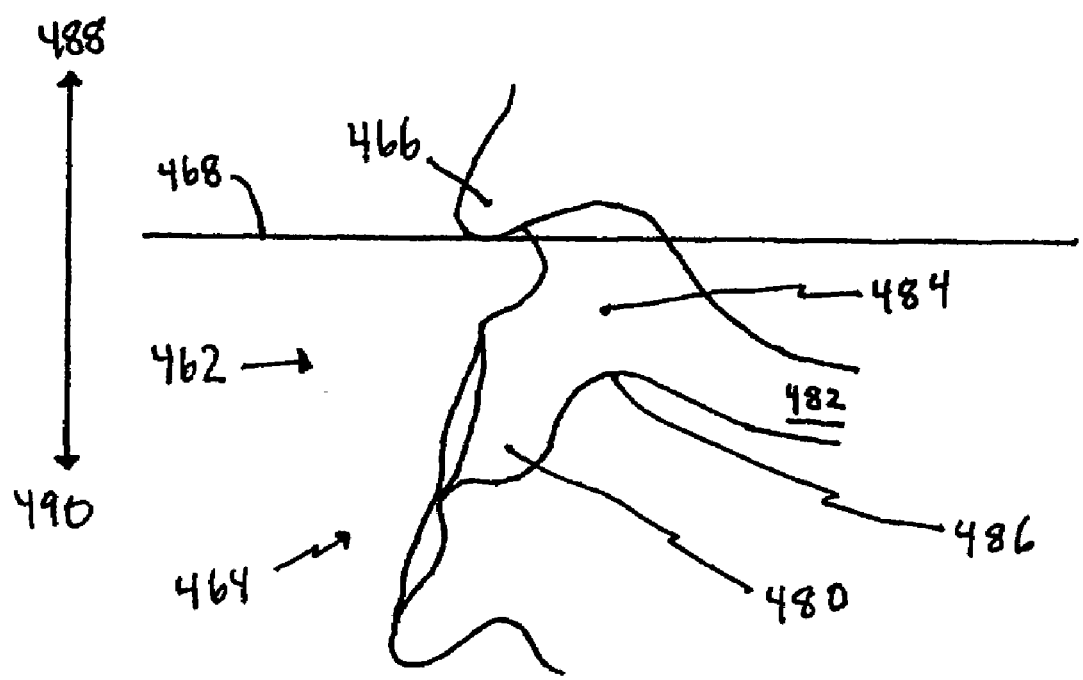
FIG. 30 is a schematic representation of a partial horizontal cross-sectional view of the left ear of the wearer's head of FIG. 29.
Figure 31:
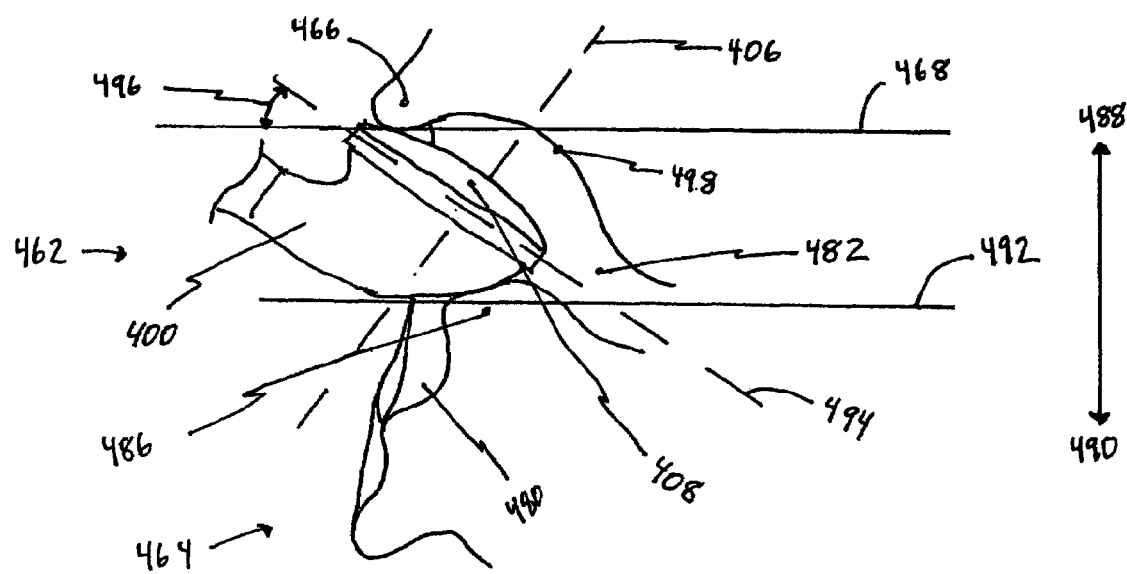

FIG. 30 illustrates a top, horizontal cross-sectional view of the external portion of a user's left ear 462 where the speaker 400 (not shown) of an audio device 304 (not shown) is not positioned against, or partially within the ear 462. The ear 462 includes a pinna 464 and tragus 466 as described above. The ear 462 also includes a concha 480, outer ear canal 486, and external auditory meatus 484 or opening of the outer ear canal 482. The posterior aspect of the auditory meatus 486 partially separates the concha 480 and outer ear canal 482. FIG. 29 also illustrates anterior 488 and posterior 490 directions with respect to the user's head 460. Tragus line 468 lies on a tangent to the posterior limit of the tragus 466.

A speaker 400 placed partially within the ear 462 of a user is illustrated in FIG. 31. The face 408 of a speaker 400 lies generally in a speaker plane 494, which intersects the tragus-tragus line 468 at an orientation angle 496 such that sound emitted from the speaker 400 along the sound propagation axis 406 is directed towards an anterior wall 498 of the outer ear canal 482. By adjusting the orientation angle 496 of the speaker face 408 with respect to the tragus-tragus line 468, sound quality and enjoyment may be enhanced.

In one embodiment, when the speaker 400 is placed within a user's ear 462, the speaker 400 may contact the ear 462 at the tragus 466 and posterior aspect of auditory meatus 486, as illustrated in FIG. 30. The orientation angle 496 formed by such speaker 400 placement may be any of a variety of angles, preferably directing the sound propagation axis in an anteriorly inclined direction. In one embodiment, the orientation angle 496 is in the range of between about 15° and 85°, between about 20° and 50°, or between about 20° and 30°. In one embodiment, the orientation angle is about 25°.

Figure 32:
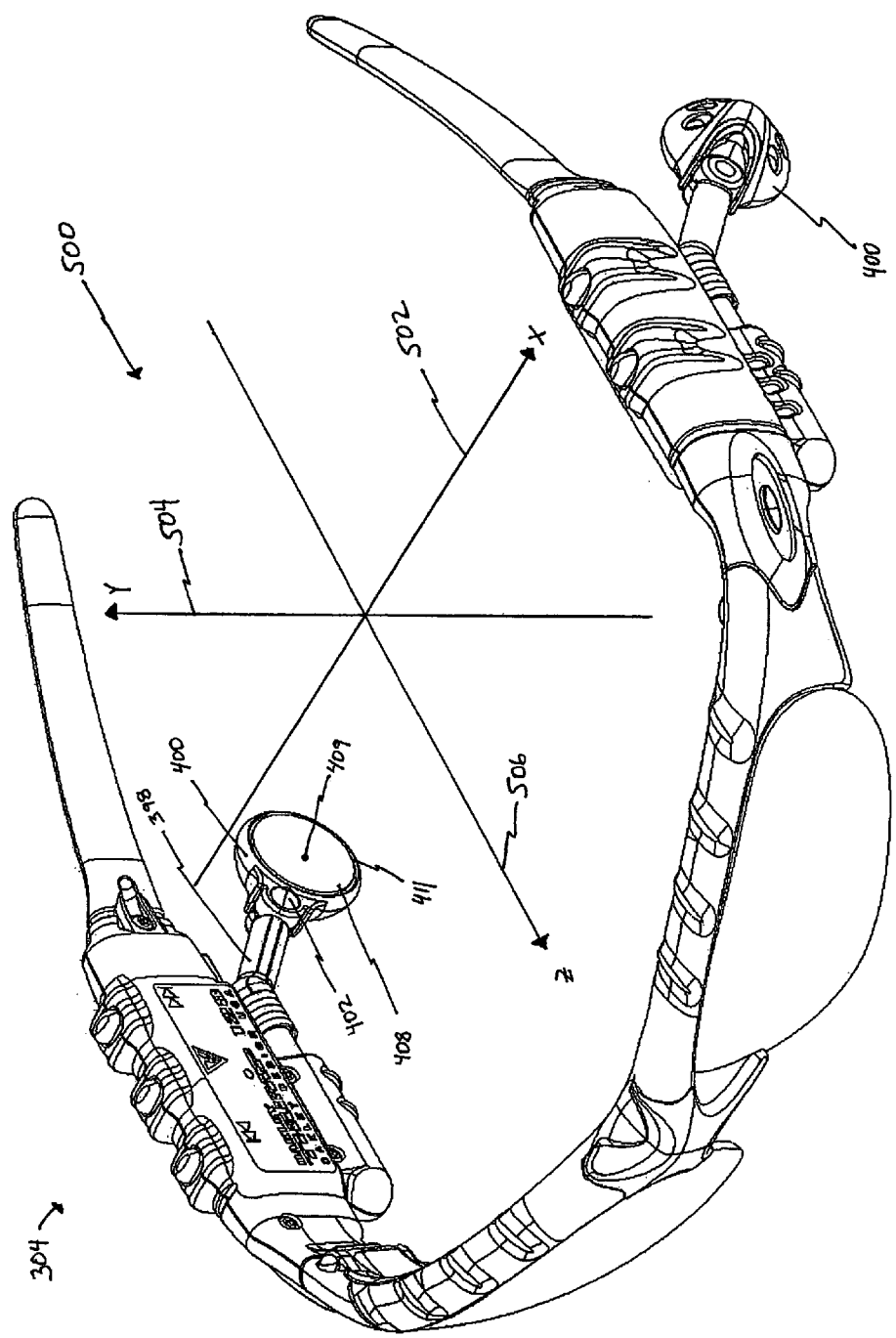
FIG. 32 is an elevational perspective view of an audio device in relation to a reference system.

An audio device 304 and a reference system 500 are shown in FIGS. 32-35. Referring first to FIG. 32, audio device 304 generally includes two speakers 400, each having a speaker face 408, as described in greater detail above. The speaker face 408 has a centerpoint 409, which in one embodiment is the mechanical center of the planar surface substantially parallel to the speaker face 408 and bounded by a speaker perimeter 411.

Figure 33:
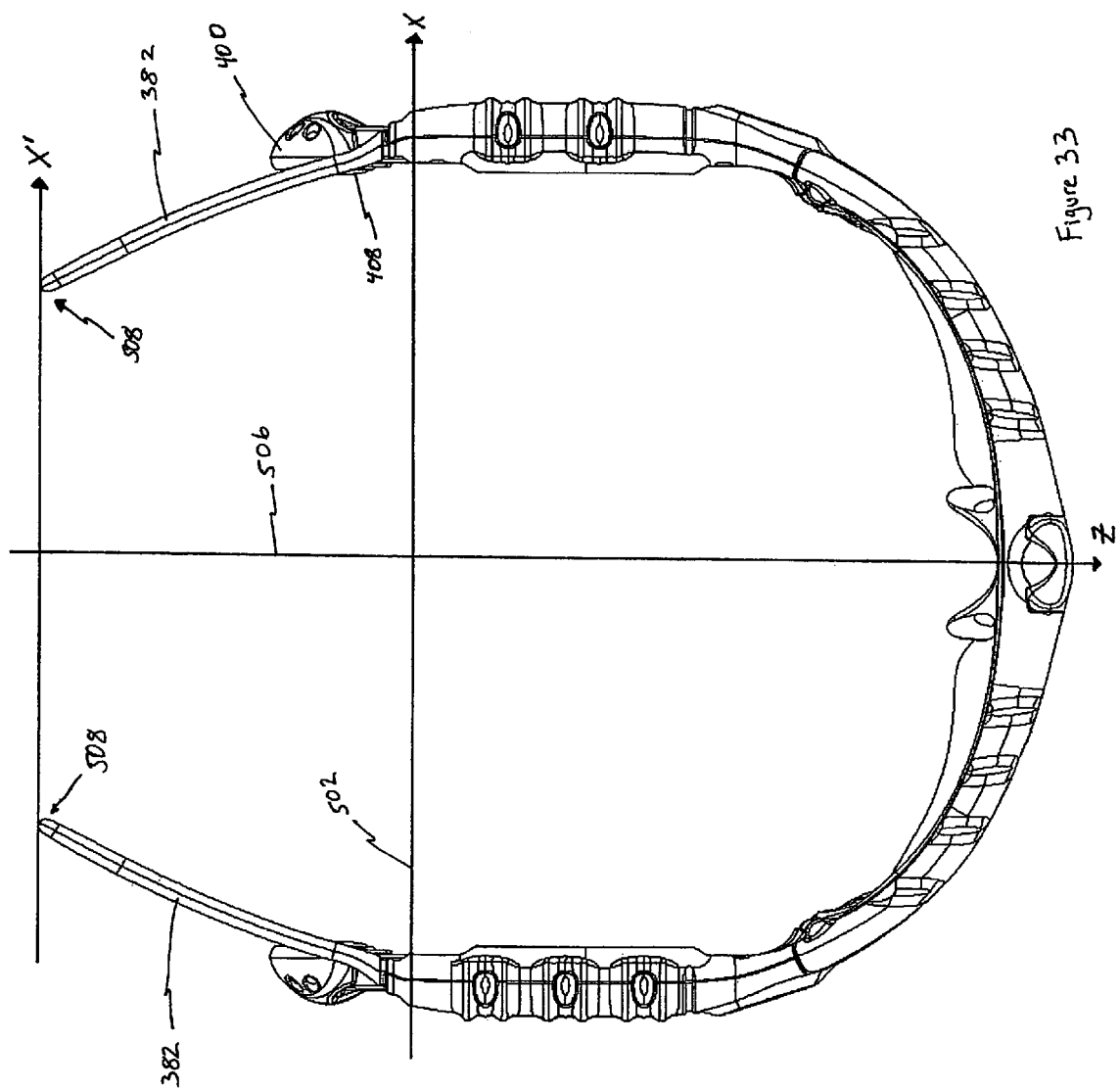
FIG. 33 is a top plan view of the audio device and reference system of FIG. 32.

In one embodiment, reference system 500 includes three axes 502, 504, 506 that may be used to describe the position, orientation, and degrees of freedom of movement and rotation of the speakers 400, the speaker faces 408, and speaker face centers 409 with respect to the audio device 304. The reference system 500 includes an x-axis 502, a y-axis 504, and a z-axis 506. In one embodiment, the x-axis 502 is parallel to a reference axis x', as shown in FIG. 33, which is tangential to the ends 508 of the ear stems 382 which, in a typical, symmetrical eyeglass, have approximately the same length. In the illustrated embodiment, the x-axis 502 lies on a plane that bisects the anterior-posterior dimensions of the audio device 304. The x-axis 502 generally extends laterally, or from side-to-side with respect to a wearer's head when the audio device 304 is worn.

A z-axis 506 bisects the eyeglass along its typical plane of symmetry and is perpendicular to the x-axis as illustrated in FIG. 33. The z-axis 506 generally extends in a posterior-to-anterior direction with respect to a wearer's head when the audio device 304 is worn.

Figure 34:
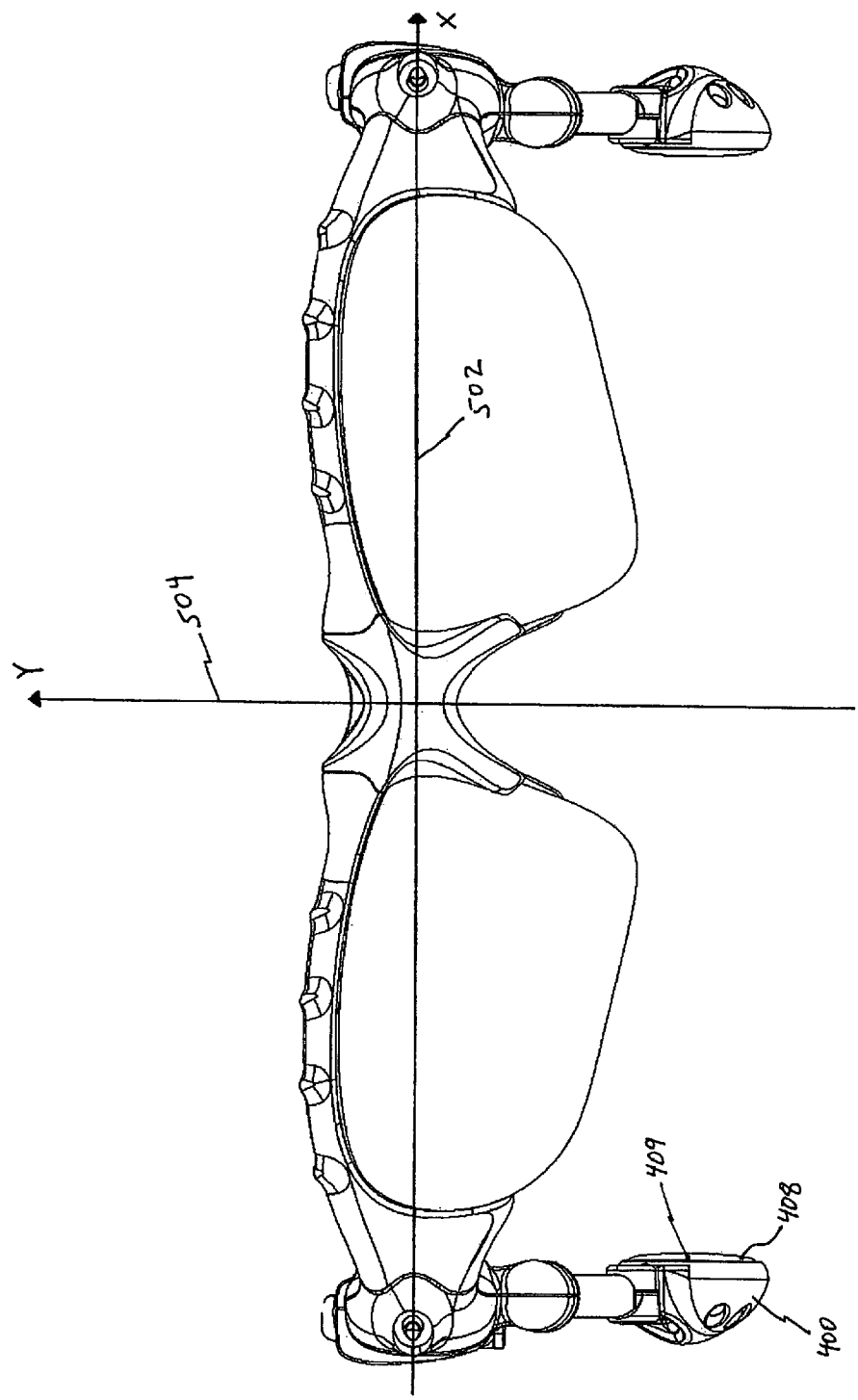
FIG. 34 is a front elevational view of the audio device and reference system of FIG. 32.

A y-axis 504 is perpendicular to the x-axis 502, as illustrated in FIG. 34. The y-axis 504 lies on a plane that bisects the audio device 304. The y-axis 504 generally extends in an inferior-to-superior direction with respect to a wearer's head when the audio device 304 is worn. In one embodiment, the x-axis 502, y-axis 504, and z-axis 506 are substantially perpendicular to one another.

Figure 35:
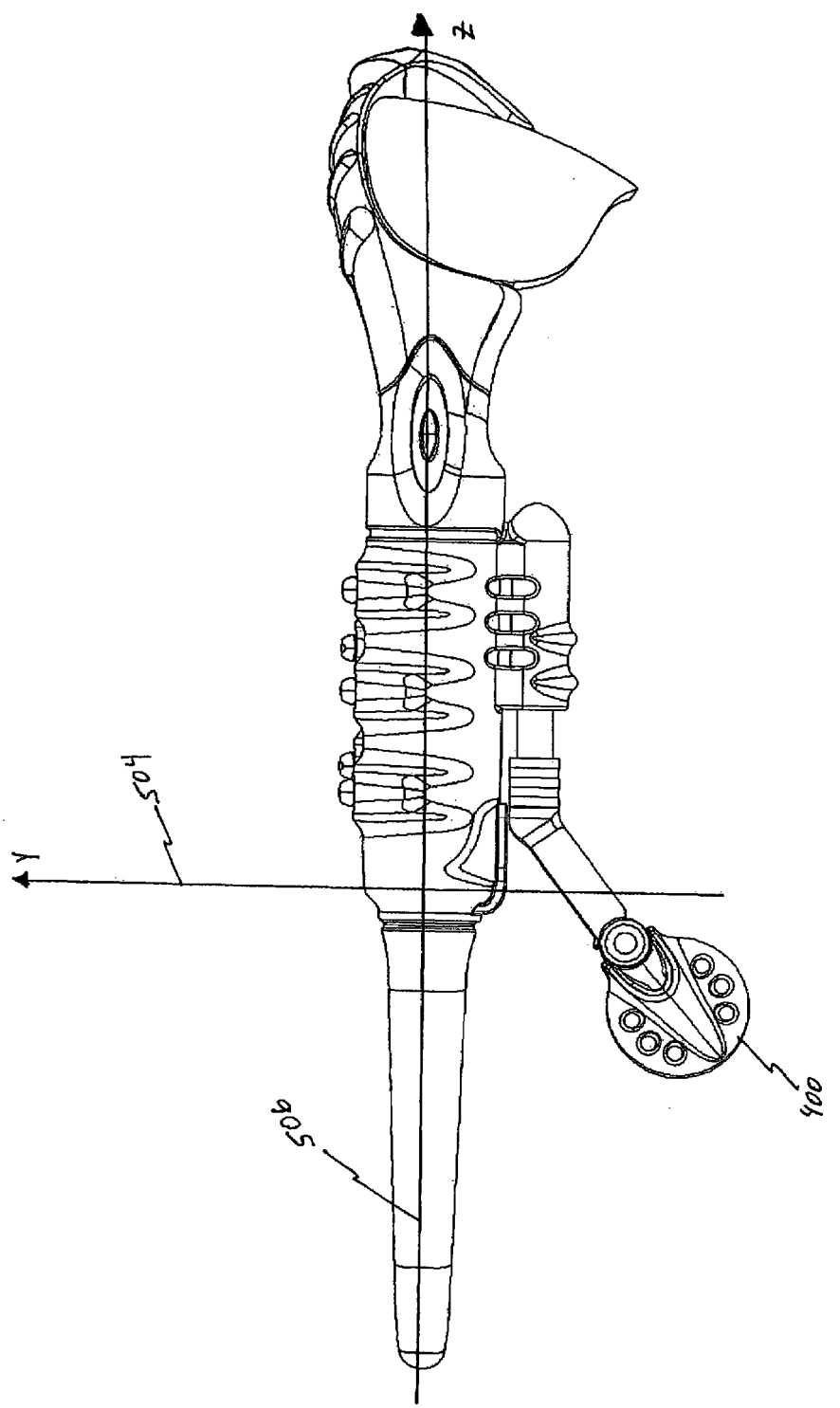
FIG. 35 is a side elevational view of the audio device and reference system of FIG. 32.

The axes 502, 504, 506 of the reference system 500 define multiple planes, which may also be used to describe the position, orientation, and degrees of freedom of movement and rotation of the speakers 400, the speaker faces 408, and speaker face centers 409 with respect to the audio device 304. For example, in one embodiment, the x-axis 502 and z-axis 506 define an xz-plane, the x-axis 502 and y-axis 504 define an xy-plane, and the y-axis 504 and z-axis 506 define a yz-plane, as illustrated in FIGS. 33-35 respectively. The term "substantially parallel" as used herein is intended to include deviations from parallel that are induced by reasonable manufacturing tolerances and normal anatomical variations as the context may require. In addition, a term such as "the yz-plane" is intended to include the yz-plane and all planes parallel to the yz-plane unless indicated otherwise either expressly or by context. Motion along, for example, the x-axis refers also to motion along any parallel to the x-axis.

Referring back to FIG. 32, in the illustrated configuration, the speaker faces 408 of the speakers 400 lie on a plane that is substantially parallel to the yz-plane. The speaker 400, speaker face 408, and centerpoint 409 may be moved linearly anteriorly or posteriorly in the z-axis 506 by employing any of a variety of devices, speaker mounts, joints and couplings, as described in greater detail above. For example, by coupling speaker 400 to a boom 394 that slides within a coupling 386, speaker 400 may be linearly translated in a direction substantially parallel to the z-axis 506, as illustrated in FIG. 3F and elsewhere herein.

In one embodiment, the linear z-axis translation distance will vary depending upon the particular design of the boom 394 and coupling 386. Preferably, a z-axis range of at least about 0.25 inches will normally be used. For example, by using a longer boom 394 and coupling 386, z-direction linear translation may be increased. In addition, by using a telescoping boom 394, z-direction linear translation may also be increased. In one embodiment, a telescoping boom 394 includes at least two substantially concentric structures (e.g., tubes), that slide with respect to one another, and allow the boom 394 to be manipulated from a first, compacted configuration to a second, extended configuration. Other nested or slider and track structures may be utilized, as will be appreciated by those of skill in the art. For example, any of a variety of axially elongate rails may be aligned in the z-axis, to serve as the coupling 386. The extension 398 may be provided with any of a variety of complementary clamps or retainers for traveling axially along the rail, thereby providing z-axis adjustability of the speaker.

In one embodiment, a locking or dampening mechanism (not shown) is used to secure the boom 394, and to fix the position of the speaker 400 from or provide resistance to further movement in the z-axis 506. For example, in one embodiment, a compression ring or collar is used to apply friction between the boom 394 and the coupling 386, or between nested, concentric structures of a telescoping boom 394. This enables a wearer to adjust the z-axis position of the speaker by overcoming the friction, but the friction will retain the position selected by the wearer. Locking structures, including pins, levers, clasps, switches, knobs, and latches may also be utilized.

During movement of the speaker 400 in the z-axis 506 by axial movement of the boom 394 speaker face 408 may either also be adjusted or may remain substantially parallel to the yz-plane. Speaker 400 may be moved in certain embodiments in a direction substantially parallel to the z-axis 506 while speaker face 408 remains positioned at a preset angle with respect to the yz-plane. For example, referring to FIGS. 25 and 32-35, speaker 400 may be inclined at an angle with respect to the yz-plane that is within an adjustment range 410. While, before, or after the speaker 400 is positioned at the selected angle, the speaker's 400 position along an axis substantially parallel to the z-axis 506 may be adjusted, as described above.

Similarly, in another embodiment, the speaker 400 may be moved in a direction substantially parallel to either or both of the x-axis 502 or y-axis 504. For example, in one embodiment, the speaker face 408 remains substantially fixed with respect to the yz-plane while the speaker face 408 is laterally or medially displaced along an axis substantially parallel to the x-axis 502. Such movement may be achieved by utilizing any of a variety of x-axis telescoping or track and slider mechanisms well known to those of skill in the art. For example, in one embodiment, the speaker 400 is coupled to the audio device 304 with a slider. The slider moves within a guide extending along the x-axis and provides lateral movement of the speakers 400 along the x-axis. Alternatively, a pivotable joint can be provided at each end of the extension 398.

In another embodiment, the speaker 400 includes a threaded portion that mates with a threaded counterpart on the speaker support. Lateral displacement along a direction substantially parallel to the x-axis 502 is achieved by rotating the speaker 400 with respect to its threaded counterpart. In one embodiment, the speaker's threaded portion includes male threads, and the threaded counterpart includes female threads. In another embodiment, the speaker's threaded portion includes female threads, and the threaded counterpart includes male threads. In addition, in other embodiments, the speaker 400 moves laterally at an angle offset from the x-axis 502.

Speaker 400 movement in any direction may be decoupled from movement in other directions. For example, linear translation of the speaker 400 along the z-axis 506 (or an axis substantially parallel thereto) does not necessarily result in translation or movement of the speaker 400 along either the x-axis 502 or y-axis 504. However, in other embodiments, speaker 400 movement in one direction may be coupled to movement in one or more other directions as well. Such coupled movements are described in greater detail below.

In one embodiment, the speakers 400 of the audio device 304 may be rotated within one or more planes. The term "rotation" is intended to include both rotation of an object about an axis extending through the object, as well as movement of an object through an arcuate path about a center of rotation separated by an offset distance from the object.

Referring again to FIG. 32, speaker 400 is coupled to extension 398 with a speaker pivot 402. In one embodiment, speaker 400 rotates about speaker pivot 402, and an axis that extends through the speaker pivot 402, and which is substantially parallel to the x-axis 502. During such rotation, in one embodiment, the speaker face 408 remains substantially parallel to a yz-plane (or a reference plane that is located at an offset angle with respect to the yz-plane), while the speaker 400 centerpoint 409 moves in an arcuate path within the yz-plane (or within a reference plane that is located at an offset angle with respect to the yz-plane). Although the speaker pivot 402 is illustrated as located at the connection between the speaker and the extension 398, it could alternatively be located at the connection between the extension 398 and the boom or other attachment point to the eyeglasses, or along the length of the extension 398. At least two pivots may also be provided, such as one at each end of the extension 398, depending upon the desired performance.

Rotation of speaker 400 about the speaker pivot 402 provides arcuate movement of the speaker 400 in the yz-plane. Such movement allows superior-inferior (e.g., y-axis) adjustment of speaker 400 position with respect to a user's ear without adjusting the rest of the frame 380 of the audio device 304. Y-axis adjustability of the speaker center 409 of at least about 0.25 inches, often at least about 0.45 inches and in some embodiments at least about 0.75 inches is contemplated. By adjusting the speaker 400 position, the speaker's sound propagation axis may be oriented with respect to a user's ear without adjusting the frame 380 of the audio device 304.

Any of a variety of structures may be used as the speaker pivot 402, as described in greater detail above. For example, the speaker pivot 402 may include a ball and socket joint, concentric tubes, a pin and channel, a joint, a hinge, a lever, or any other structure that provides rotation coupling, as is known to those of skill in the art.

In another embodiment, speaker 400 may be rotated laterally about a boom axis 404 (as illustrated in FIGS. 3H and 24) to provided further rotational adjustability of the speaker 400 in the x-axis. In one embodiment, rotation of speaker 400 about a boom axis 404 results in arcuate movement of the speaker 400 from a first, listening position, in which the speaker face 408 is substantially parallel to the yz-plane (or to a reference plane that is offset from the yz-plane by a first offset angle), to a second position in which the speaker face 408 may be substantially parallel to the xz-plane (or to a reference plane that is offset from the xz-plane by a second offset angle). The offset between the speaker and the center of rotation (boom axis 404) defines the radius of arcuate movement of the speaker within the xy-plane. An x-axis offset (when the speaker is in the second position) of at least about 0.25 inches, often at least about 0.5 inches, and in some embodiments at least about 1.0 inches, is contemplated.

In such embodiment, the speaker 400 and its centerpoint 409 move within a plane that is substantially parallel to the xy-plane from the first position along an arcuate path in a lateral, superior direction to the second position. The speaker 400 may be moved back to the first position by traveling along the arcuate path in a medial, inferior direction from the second position. A speaker 400 shown in one embodiment of a first position is illustrated in FIGS. 32-35. In another embodiment, the speaker 400 is configured to rotate from a first position in which the speaker face 408 is substantially parallel to the yz-plane to a second position in which the speaker 400 is inclined at an angle with respect to the yz-plane.

In one embodiment, this movement of the speaker 400 and its centerpoint 409 within the xy-plane allows the wearer to raise the speaker 400 from adjacent the wearer's ear without moving or adjusting the remaining portion of the frame 380 of the audio device 304. Such movement allows the wearer to receive a telephone call if the eyeglass is not equipped with an internal cellular phone and place the speaker of a hand held telephone adjacent the wearer's ear without requiring the removal of the audio device 304 from the wearer's head.

In another embodiment, speaker 400 may be rotated about a reference axis that extends in a direction substantially parallel to the y-axis 504. One example of such adjustability is illustrated in FIG. 25, and is discussed in greater detail above. In one embodiment, such adjustability allows the movement of the speaker 400 from a first position in which the speaker face 408 is substantially perpendicular to tragus-tragus line 468, the ear canal axis 492 and/or an axis substantially parallel to the x-axis 502, to a second position in which the speaker face 408 is offset from the tragus-tragus line 468, the ear canal axis 492 and/or an axis substantially parallel to the x-axis 502 by an offset angle 496. One example of such offset angle is described in greater detail above with respect to FIG. 31.

Any of a variety of structures may be used to provide rotational movement as described above. For example, the speaker 400 may be coupled to the frame 380 of the audio device 304 with a ball and socket joint, concentric tubes, a pin and channel, a joint, a hinge, a lever, or any other structure that provides rotation coupling, as is known to those of skill in the art.

Thus, the speakers 400 of the audio device 304 may be moved linearly within along directions substantially parallel to one or more of the x-axis 502, y-axis 504, z-axis 506, and/or any direction offset from any one or more of the x-axis 502, y-axis 504, or z-axis 506 by a fixed or adjustable offset angle. In addition, in certain embodiments, the speaker 400 of the audio device 304 may be moved typically through an arc residing within the xy-plane, the yz-plane, the xz-plane, and/or any preselected plane offset from any one or more of the xy-plane, the yz-plane, or the xz-plane by a fixed or adjustable offset angle.

In addition, in one embodiment, such multi-dimensional adjustability may be performed by moving the speaker 400 with respect to the audio device 304 without requiring sliding or rotational adjustment of the frame 380. For example, in one embodiment, the speaker 400 is coupled to the audio device 304 frame 380 with a support which comprises flexible tube, or conduit, such as a gooseneck tube, wire bundle, or hollow wire. Such flexible tubing allows independent, three-dimensional positioning of a speaker 400 along any axis, and within any plane, without requiring adjustment of the position of the frame 380. The support retains the position of the speaker selected by the wearer until adjusted again to a different position.

Of course, the foregoing description is that of a preferred construction having certain features, aspects and advantages in accordance with the present invention. Accordingly, various changes and modifications may be made to the above-described arrangements without departing from the spirit and scope of the invention, as defined by the appended claims.

What is claimed is:

1. A wearable wireless audio device, comprising:
   a support configured to support at least one lens in a wearer's field of view;
   a first ear stem coupled to the support;
   a support arm carried by the ear stem, the support arm comprising a first moveable joint and a second moveable joint, wherein the first moveable joint comprises a ball joint and provides rotation about more than one axis of rotation; and
   an electronics circuit supported by the support and configured to receive at least one digital audio file and generate an audio signal indicative of the at least one digital audio file.

2. A wearable wireless audio device as in claim 1, wherein the electronics circuit is further configured to process the digital audio file prior to generating the audio signal.

3. A wearable wireless audio device as in claim 1, further comprising a first speaker supported by the support arm, wherein the first speaker is configured to be directed toward at least one of the wearer's ears, and configured to convert the audio signal into sound.

4. A wearable wireless audio device as in claim 3, wherein the speaker is configured to emit sound along a sound propagation axis, and wherein the speaker is configured to rotate from a first position in which the sound propagation axis is substantially perpendicular to a yz-plane to a second position in which the sound propagation axis is substantially perpendicular to an xz-plane.

5. A wearable wireless audio device as in claim 3, wherein the speaker is configured to emit sound along a sound propagation axis, and wherein the speaker is configured to rotate from a first position in which the sound propagation axis is substantially perpendicular to a yz-plane to a second position in which the sound propagation axis is inclined at an angle with respect to a transverse axis of the yz-plane.

6. A wearable wireless audio device as in claim 5, wherein the angle is between about 30° and about 90°.

7. A wearable wireless audio device as in claim 3, wherein the speaker is configured to emit sound along a sound propagation axis, and wherein the speaker is configured to rotate along an arcuate path about an axis substantially parallel to an x-axis from a first position in which the sound propagation axis is substantially perpendicular to a yz-plane to a second position in which the sound propagation axis remains substantially perpendicular to the yz-plane, and wherein the speaker is configured to move throughout an adjustment distance in a direction substantially parallel to a z-axis.

8. A wearable wireless audio device as in claim 7, wherein the adjustment distance is at least 0.25 inches.

9. A wearable wireless audio device as in claim 3, wherein the speaker is configured to emit sound along a sound propagation axis, wherein the speaker is coupled to the support with a speaker pivot, and wherein the speaker is configured to rotate about the speaker pivot while maintaining the sound propagation axis substantially perpendicular to a yz-plane.

10. A wearable wireless audio device as in claim 3, wherein the speaker is configured to move along an axis substantially parallel to a z-axis with respect to the support.

11. A wearable wireless audio device as in claim 3, wherein the first speaker is coupled to the first moveable joint.

12. A wearable wireless audio device as in claim 1, wherein the digital audio file is compressed.

13. A wearable wireless audio device as in claim 12, wherein the digital audio file is an MP3 formatted file.

14. A wearable wireless audio device as in claim 1, wherein the support further comprises a channel and a conductor, wherein the channel extends along at least a portion of the ear stem, and wherein the conductor is located at least partially within the channel.

15. A wearable wireless audio device as in claim 1, further comprising a second ear stem, wherein the electronics circuit comprises a memory circuit and a processor, and wherein the memory circuit is carried by the first ear stem, and the processor circuit is carried by the second ear stem.

16. A wearable wireless audio device as in claim 1, further comprising a second ear stem, wherein the electronics circuit comprises a battery and a processor, and wherein the battery is carried by the first ear stem, and the processor is carried by the second ear stem.

17. A wearable wireless audio device as in claim 1, further comprising a second ear stem, wherein the electronics components are distributed between the first and second ear stems.

18. A wearable wireless audio device as in claim 1, further comprising a nose bridge, wherein digital signals generated by the electronics circuit are transmitted across the nose bridge.

19. A wearable wireless audio device as in claim 1, further comprising a data port, wherein the data port is carried by the ear stem.

20. A wearable wireless audio device as in claim 19, wherein the data port is selected from the group comprising: a mini-USB connector, a FIREWIRE connector, an IEEE 1394 cable connector, an RS232 connector, a JTAB connector, an antenna, a wireless receiver, a radio, an RF receiver, and a BLUETOOTH receiver.

21. A wearable wireless audio device as in claim 20, wherein the data port is a mini-USB connector.

22. A wearable wireless audio device as in claim 20, wherein the data port is a wireless receiver.

23. A wearable wireless audio device as in claim 1, wherein said wearable wireless audio device is removably connectable to a computing device.

24. The wearable wireless audio device of claim 23, wherein said wearable wireless audio device is removably connectable to a computing device with a data port, wherein said data port is mounted to said wearable wireless audio device.

25. The wearable wireless audio device of claim 24, wherein said data port is selected from the group consisting of: a mini-USB connector, a USB connector, a FIREWIRE connector, an IEEE 1394 cable connector, an RS232 connector, a JTAB connector, an antenna, a wireless receiver, a radio, an RF receiver, and a BLUETOOTH receiver.

26. The wearable wireless audio device of claim 24, further comprising a protective door, wherein said protective door protects said data port when said wearable wireless audio device is disconnected from said computing device.

27. A wearable wireless audio device as in claim 1, wherein the electronics circuit is further configured to decompress the audio file.

28. A wearable wireless audio device as in claim 1, wherein the electronics circuit is configured to receive at least one digital audio file at a data transfer rate.

29. The wearable wireless audio device of claim 28, wherein said data transfer rate is selected from the group consisting of: about 1.5 Mbps, about 12 Mbps, about 100 Mbps, about 200 Mbps, about 400Mbps, about 480 Mbps, greater than about 100 Mbps, greater than about 200 Mbps, greater than about 400 Mbps, and greater than about 1000 Mbps.

30. The wearable wireless audio device of claim 1, wherein the at least one digital audio file has been encoded at a data encoding rate.

31. The wearable wireless audio device of claim 30, wherein said data encoding rate is selected from the group consisting of: 128 kbps, 160 kbps, 192 kbps, 256 kbps, and more than about 256 kbps.

32. The wearable wireless audio device of claim 1, wherein said at least one digital audio file is compressed according to a compression format selected from the group consisting of: PCM, DPCM, ADPCM, AAC, RAW, DM, RIFF, WAV, BWF, AIFF, AU, SND, CDA, MPEG, MPEG-1, MPEG-2, MPEG-2.5, MPEG-4, MPEG-J, MPEG 2-ACC, MP3, MP3Pro, ACE, MACE, MACE-3, MACE-6, AC-3, ATRAC, ATRAC3, EPAC, Twin VQ, VQF, WMA, WMA with DRM, DTS, DVD Audio, SACD, TAC, SHN, OGG, Ogg Vorbis, Ogg Tarkin, Ogg Theora, ASF, LQT, QDMC, A2b, .ra, .rm, and Real Audio G2, RMX formats, Fairplay, Quicktime, SWF, and PCA.

33. A wearable wireless audio device as in claim 1, wherein the second moveable joint couples the support arm to the first ear stem.

34. A wearable wireless audio device, comprising:
a frame configured to support at least one lens in a wearer's field of view;
means for supporting a speaker coupled to said frame, the means for supporting a speaker comprising, a first moveable joint, and a second moveable joint, wherein the first moveable joint comprises a ball joint and provides rotation about more than one axis of rotation;
means for receiving at least one digital audio file coupled to said frame; and
means for generating an audio signal indicative of the at least one digital audio file coupled to said frame.

35. A wearable wireless audio device as in claim 34, further comprising a speaker, wherein the speaker is coupled to the first moveable joint.

36. A wearable wireless audio device as in claim 34, wherein the second moveable joint couples the means for supporting a speaker to the frame.

37. A speaker support system, comprising:
a support frame, adapted to be carried by a head of a wearer;
at least one speaker carried by the support frame, the speaker having a sound propagation axis and a transverse axis, wherein the transverse axis is substantially perpendicular to the sound propagation axis and lies substantially within a speaker plane of the at least one speaker; and
a speaker pivot supported by the frame and coupled to the speaker, wherein the speaker pivot comprises a ball joint and is pivotable about more than one axis of rotation,
wherein the support frame is configured to hold the at least one speaker substantially adjacent an ear of the wearer such that the transverse axis is inclined at an orientation angle with respect to a tragus-tragus line extending between right and left tragi of the wearer's right and left ears, and wherein the orientation angle is within the range of from about 15 degrees to about 85 degrees.

* * * * *

UNITED STATES PATENT AND TRADEMARK OFFICE
CERTIFICATE OF CORRECTION

PATENT NO. : 7,278,734 B2  Page 1 of 1
APPLICATION NO. : 10/993217
DATED : October 9, 2007
INVENTOR(S) : Jannard et al.

It is certified that error appears in the above-identified patent and that said Letters Patent is hereby corrected as shown below:

In column 3 at line 26, delete "mm," and insert -- .rm, --, therefor.

In column 4 at line 24, delete "FREWIRE" and insert -- FIREWIRE --, therefor.

In column 5 at line 2, delete "ra," and insert -- .ra, --, therefor.

In column 7 at line 56, delete "EEE" and insert -- IEEE --, therefor.

In column 11 at line 24, delete "support-" and insert -- support --, therefor.

In column 19 at line 4, delete "31," and insert -- 3I, --, therefor.

In column 20 at line 48, delete "31" and insert -- 3I --, therefor.

In column 39 at line 29, delete "At" and insert -- AT --, therefor.

In column 40 at line 2, delete "andlor" and insert -- and/or --, therefor.

Signed and Sealed this

Seventeenth Day of June, 2008

JON W. DUDAS
*Director of the United States Patent and Trademark Office*